US011322643B2

(12) United States Patent
Atanackovic

(10) Patent No.: US 11,322,643 B2
(45) Date of Patent: May 3, 2022

(54) OPTOELECTRONIC DEVICE

(71) Applicant: Silanna UV Technologies Pte Ltd, Singapore (SG)

(72) Inventor: Petar Atanackovic, Henley Beach South (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 16/675,601

(22) Filed: Nov. 6, 2019

(65) Prior Publication Data
US 2020/0091371 A1 Mar. 19, 2020

Related U.S. Application Data

(63) Continuation-in-part of application No. 14/976,814, filed on Dec. 21, 2015, now Pat. No. 10,475,956.
(Continued)

(30) Foreign Application Priority Data

May 27, 2014 (AU) .............................. 2014902007

(51) Int. Cl.
*H01L 33/00* (2010.01)
*H01L 33/06* (2010.01)
(Continued)

(52) U.S. Cl.
CPC .......... *H01L 33/0012* (2013.01); *H01L 33/06* (2013.01); *H01L 33/325* (2013.01); *H01L 33/508* (2013.01); *H01L 33/60* (2013.01)

(58) Field of Classification Search
None
See application file for complete search history.

(56) References Cited

U.S. PATENT DOCUMENTS 732,956 A 7/1903 Palmer
4,620,206 A 10/1986 Ohta et al.
(Continued)

FOREIGN PATENT DOCUMENTS

CN 101336489 A 12/2008
CN 101578715 A 11/2009
(Continued)

OTHER PUBLICATIONS

Office Action dated Dec. 1, 2020 for Japanese Patent application No. 2016-569627.
(Continued)

*Primary Examiner* — Long Pham
(74) *Attorney, Agent, or Firm* — MLO, a professional corp.

(57) ABSTRACT

An optoelectronic device comprising a semiconductor structure includes a p-type active region, an n-type active region, and an i-type active region. The semiconductor structure is comprised solely of one or more superlattices, where each superlattice is comprised of a plurality of unit cells. Each unit cell can comprise a layer of GaN and a layer of AlN. In some cases, a combined thickness of the layers comprising the unit cells in the i-type active region is thicker than a combined thickness of the unit cells in the n-type active region, and is thicker than a combined thickness of the unit cells in the p-type active region. The layers in the unit cells in each of the three regions can all have thicknesses that are less than or equal to a critical layer thickness required to maintain elastic strain.

32 Claims, 43 Drawing Sheets

Related U.S. Application Data which is a continuation of application No. PCT/IB2015/052480, filed on Apr. 6, 2015.

(51) Int. Cl.
| | |
|---|---|
| *H01L 33/50* | (2010.01) |
| *H01L 33/60* | (2010.01) |
| *H01L 33/32* | (2010.01) |

(56) References Cited

U.S. PATENT DOCUMENTS

| | | |
|---|---|---|
| 4,972,246 A | 11/1990 | Brodsky et al. |
| 5,060,030 A | 10/1991 | Hoke |
| 5,248,890 A | 9/1993 | Luth et al. |
| 5,298,108 A | 3/1994 | Miller |
| 5,436,192 A | 7/1995 | Epler et al. |
| 5,932,899 A | 8/1999 | Schubert |
| 6,266,355 B1 | 7/2001 | Sverdlov |
| 6,546,034 B2 | 4/2003 | Komori et al. |
| 6,593,589 B1 | 7/2003 | Osinski et al. |
| 6,920,167 B2 | 7/2005 | Hoshi et al. |
| 6,921,924 B2 | 7/2005 | Tsai et al. |
| 6,958,497 B2 | 10/2005 | Emerson et al. |
| 6,995,389 B2 | 2/2006 | Kim et al. |
| 7,015,515 B2 | 3/2006 | Taki et al. |
| 7,148,519 B2 | 12/2006 | Wu et al. |
| 7,193,246 B1 | 3/2007 | Tanizawa et al. |
| 7,265,374 B2 | 9/2007 | Lee et al. |
| 7,498,182 B1 | 3/2009 | Sampath et al. |
| 7,547,925 B2 | 6/2009 | Wong et al. |
| 7,566,580 B2 | 7/2009 | Keller et al. |
| 7,576,363 B2 | 8/2009 | Uemura et al. |
| 7,807,917 B2 | 10/2010 | Atanackovic |
| 7,825,418 B2 | 11/2010 | Chen |
| 7,901,994 B2 | 3/2011 | Saxler et al. |
| 7,910,935 B2 | 3/2011 | Seong |
| 8,000,366 B2 | 8/2011 | Bour et al. |
| 8,030,684 B2 | 10/2011 | Hu et al. |
| 8,088,637 B1 | 1/2012 | Wong et al. |
| 8,362,503 B2 | 1/2013 | Saxler et al. |
| 8,405,064 B2 | 3/2013 | Yamaguchi et al. |
| 8,421,107 B2 | 4/2013 | Shinohara et al. |
| 8,426,887 B2 | 4/2013 | Son |
| 8,507,357 B2 | 8/2013 | Lin et al. |
| 8,518,806 B2 | 8/2013 | Okuno et al. |
| 8,581,232 B2 | 11/2013 | Kim |
| 8,592,841 B2 | 11/2013 | Nakamura et al. |
| 8,633,468 B2 | 1/2014 | Gaska et al. |
| 9,184,202 B2 * | 11/2015 | Dutta ............... H01L 27/14694 |
| 9,240,517 B2 | 1/2016 | Johnston et al. |
| 9,240,533 B2 | 1/2016 | Lee et al. |
| 9,246,311 B1 | 1/2016 | Raring et al. |
| 9,252,329 B2 | 2/2016 | Northrup et al. |
| 9,269,788 B2 | 2/2016 | Gaska et al. |
| 9,281,439 B2 | 3/2016 | Niwa et al. |
| 9,281,441 B2 | 3/2016 | Shur et al. |
| 9,281,445 B2 | 3/2016 | Donofrio |
| 9,287,442 B2 | 3/2016 | Shatalov et al. |
| 9,287,449 B2 | 3/2016 | Gaska et al. |
| 9,287,455 B2 | 3/2016 | Shur et al. |
| 9,293,670 B2 | 3/2016 | Toita et al. |
| 9,299,880 B2 | 3/2016 | Grandusky et al. |
| 9,312,428 B2 | 4/2016 | Shatalov et al. |
| 9,312,448 B2 | 4/2016 | Lunev et al. |
| 9,318,650 B2 | 4/2016 | Zhang |
| 9,318,652 B1 | 4/2016 | Liao et al. |
| 9,330,906 B2 | 5/2016 | Shatalov et al. |
| 9,331,240 B2 | 5/2016 | Khan et al. |
| 9,331,244 B2 | 5/2016 | Shatalov et al. |
| 9,331,246 B2 | 5/2016 | Kneissl et al. |
| 9,337,387 B2 | 5/2016 | Shatalov et al. |
| 9,356,192 B2 | 5/2016 | Pernot et al. |
| 9,368,580 B2 | 6/2016 | Shatalov et al. |
| 9,368,582 B2 | 6/2016 | Kizilyalli et al. |
| 9,385,271 B2 | 7/2016 | Shur et al. |
| 9,397,260 B2 | 7/2016 | Jain et al. |
| 9,397,269 B2 | 7/2016 | Chae et al. |
| 9,401,452 B2 | 7/2016 | Northrup et al. |
| 9,401,456 B2 | 7/2016 | Lee et al. |
| 9,412,901 B2 | 8/2016 | Shur et al. |
| 9,412,902 B2 | 8/2016 | Shatalov et al. |
| 9,412,922 B2 | 8/2016 | Jang et al. |
| 9,437,430 B2 | 9/2016 | Schowalter et al. |
| 9,437,774 B2 | 9/2016 | Gaska et al. |
| 9,437,775 B2 | 9/2016 | Takeuchi et al. |
| 9,444,224 B2 | 9/2016 | Chua et al. |
| 9,450,157 B2 | 9/2016 | Yamada et al. |
| 9,461,198 B2 | 10/2016 | Liao et al. |
| 9,466,761 B2 | 10/2016 | Choi et al. |
| 9,468,695 B2 | 10/2016 | Liao et al. |
| 9,496,455 B2 | 11/2016 | Park et al. |
| 9,502,509 B2 | 11/2016 | Shatalov et al. |
| 9,502,606 B2 | 11/2016 | Pernot et al. |
| 10,128,404 B2 | 11/2018 | Atanackovic |
| 10,475,956 B2 * | 11/2019 | Atanackovic ........... H01L 33/18 |
| 2002/0149033 A1 | 10/2002 | Wojtowicz |
| 2003/0205711 A1 | 11/2003 | Tanizawa et al. |
| 2004/0004223 A1 | 1/2004 | Nagahama et al. |
| 2005/0029506 A1 | 2/2005 | Lee et al. |
| 2005/0104088 A1 | 5/2005 | Niwa |
| 2005/0156183 A1 | 7/2005 | Tsai et al. |
| 2006/0108603 A1 | 5/2006 | Uemura et al. |
| 2007/0158640 A1 | 7/2007 | Halilov et al. |
| 2008/0002750 A1 | 1/2008 | Onishi et al. |
| 2008/0054248 A1 | 3/2008 | Chua et al. |
| 2008/0112452 A1 | 5/2008 | Chakraborty et al. |
| 2008/0295879 A1 | 12/2008 | Atanackovic |
| 2009/0045392 A1 | 2/2009 | Park et al. |
| 2009/0194784 A1 | 8/2009 | Kaji et al. |
| 2009/0283795 A1 | 11/2009 | Miki et al. |
| 2010/0213436 A1 | 8/2010 | Khan |
| 2010/0276710 A1 | 11/2010 | Sampath et al. |
| 2011/0140083 A1 | 6/2011 | Driscoll et al. |
| 2011/0155999 A1 | 6/2011 | Tansu et al. |
| 2011/0180778 A1 | 7/2011 | Lin et al. |
| 2011/0193063 A1 | 8/2011 | Mears et al. |
| 2011/0235665 A1 | 9/2011 | Simon et al. |
| 2011/0278647 A1 | 11/2011 | Hashimoto et al. |
| 2012/0037881 A1 | 2/2012 | Kim et al. |
| 2012/0068152 A1 | 3/2012 | Hwang et al. |
| 2012/0091435 A1 | 4/2012 | Ikuta et al. |
| 2012/0104360 A1 | 5/2012 | Hardy et al. |
| 2012/0145991 A1 | 6/2012 | Nam et al. |
| 2012/0175589 A1 | 7/2012 | Ooshika et al. |
| 2012/0201264 A1 | 8/2012 | Shatalov et al. |
| 2012/0313076 A1 | 12/2012 | Nakamura et al. |
| 2012/0313077 A1 | 12/2012 | Nakamura et al. |
| 2013/0026480 A1 | 1/2013 | Fenwick et al. |
| 2013/0026482 A1 | 1/2013 | Fenwick |
| 2013/0043458 A1 | 2/2013 | Chen et al. |
| 2013/0043459 A1 * | 2/2013 | Chen ............... H01L 21/02505 257/22 |
| 2013/0048939 A1 | 2/2013 | Zhang et al. |
| 2013/0075691 A1 | 3/2013 | Shur et al. |
| 2013/0082274 A1 | 4/2013 | Yang et al. |
| 2013/0221320 A1 | 8/2013 | Li et al. |
| 2013/0270517 A1 | 10/2013 | Nozawa et al. |
| 2013/0285065 A1 | 10/2013 | Zhu et al. |
| 2013/0299778 A1 | 11/2013 | Okuno et al. |
| 2013/0320296 A1 | 12/2013 | Yu et al. |
| 2014/0024159 A1 | 1/2014 | Jain |
| 2014/0084241 A1 | 3/2014 | Okuno et al. |
| 2014/0264270 A1 * | 9/2014 | Dutta ................. H01L 27/1464 257/14 |
| 2017/0200865 A1 | 7/2017 | Brummer et al. |
| 2020/0075799 A1 * | 3/2020 | Atanackovic ........... H01L 33/32 |
| 2020/0091371 A1 * | 3/2020 | Atanackovic ......... H01L 33/325 |

FOREIGN PATENT DOCUMENTS

| | | |
|---|---|---|
| CN | 102208511 A | 10/2011 |
| CN | 102534764 A | 7/2012 |
| CN | 102569484 A | 7/2012 |
| CN | 103682002 A | 3/2014 |

(56) References Cited

FOREIGN PATENT DOCUMENTS

| | | | |
|---|---|---|---|
| CN | 102945902 B | 12/2014 | |
| EP | 1065705 A2 | 1/2001 | |
| EP | 1301947 B1 | 9/2007 | |
| EP | 2037509 A1 | 3/2009 | |
| EP | 2362437 A1 | 8/2011 | |
| EP | 2709170 A2 | 3/2014 | |
| EP | 2709170 A3 | 3/2015 | |
| JP | S6027692 A | 2/1985 | |
| JP | H0697598 A | 4/1994 | |
| JP | H07263744 A | 10/1995 | |
| JP | H10308558 A | 11/1998 | |
| JP | 2000244070 A | 9/2000 | |
| JP | 2002208755 A | 7/2002 | |
| JP | 2002540618 A | 11/2002 | |
| JP | 2003045900 A | 2/2003 | |
| JP | 2003059938 A | 2/2003 | |
| JP | 2003163373 A | 6/2003 | |
| JP | 2005064072 A | 3/2005 | |
| JP | 2005136446 A | 5/2005 | |
| JP | 2005526384 A | 9/2005 | |
| JP | 2006108585 A | 4/2006 | |
| JP | 2006261688 A | 9/2006 | |
| JP | 2007157765 A | 6/2007 | |
| JP | 2008526014 A | 7/2008 | |
| JP | 2008526015 A | 7/2008 | |
| JP | 2008526015 A | 7/2008 | |
| JP | 2008235574 A | 10/2008 | |
| JP | 2010021576 A | 1/2010 | |
| JP | 2010287882 A | 12/2010 | |
| JP | 2011100824 A | 5/2011 | |
| JP | 2011146575 A | 7/2011 | |
| JP | 2011181762 A | 9/2011 | |
| JP | 2011205082 A | 10/2011 | |
| JP | 2011228646 A | 11/2011 | |
| JP | 2012044120 A | 3/2012 | |
| JP | 2012146847 A | 8/2012 | |
| JP | 2012164749 A | 8/2012 | |
| JP | 2012243807 A | 12/2012 | |
| JP | 2013084817 A | 5/2013 | |
| JP | 2013214700 A | 10/2013 | |
| JP | 2014053412 A | 3/2014 | |
| JP | 2005150531 A | 6/2015 | |
| KR | 1020080060053 A | 7/2008 | |
| KR | 20140004361 A | 1/2014 | |
| KR | 1020140004361 A | 1/2014 | |
| KR | 1020140035813 A | 3/2014 | |
| TW | 201320390 A1 | 5/2013 | |
| WO | 2004008552 A2 | 1/2004 | |
| WO | 2006013698 A1 | 2/2006 | |
| WO | 2012067687 A2 | 5/2012 | |
| WO | 2013035325 A1 | 3/2013 | |
| WO | 2013096821 A1 | 6/2013 | |

OTHER PUBLICATIONS

Bing-Cheng Lin et al., Advantages of Blue LEDs With Graded-Composition AlGaN/GaN Superlattice EBL, IEEE Photonics Technology Letters, Nov. 2013, vol. 25 No.21, 2062-2065.
Bulashevich and Karpov, Heterojunctions between group-III nitride short-period superlattices, Phys. Stat. Solid. (c), Apr. 2005, 2(7) pp. 2394-2398.
Chiou et al., The Effect of the Intrinsic Layer on Reliability of Nitride-based p-i-n Photodetectors, Optical Fiber Communication & Optoelectronic Exposition & Conference, 2008. AOE 2008. Asia, Oct. 2008, pp. 1-3.
Chung, J.W., E.L. Piner, and T. Palacios, "N-Face GaN/AlGaN HEMTs Fabricated Through Layer Transfer Technology.", Electron Device Letters, IEEE 30.2 (Feb. 2009): 113-116. © 2009 Institute of Electrical and Electronics Engineers.
III-Nitride Based Optoelectronics, Final Report, Northwestern University, Jan. 2010, 64 pages.
International Search Report and Written Opinion dated Aug. 13, 2015 for PCT Patent Application No. PCT/IB2015/053179.
International Search Report and Written Opinion dated Jul. 23, 2015 for PCT Patent Application No. PCT/IB2015/053203.
International Search Report and Written Opinion dated Jul. 9, 2015 for PCT Patent Application No. PCT/IB2015/052480.
Jawagi, Study of Analytical Determination of Parasitic Resistances in Gallium Nitride (GaN) MESFETs, California State University, Northridge, May 2012, 78 pages.
Jena et al., Polarization-Engineering in III-V Nitride Heterostructures: New Opportunities For Device Design, Dec. 3, 2011, Phys. Status Solidi A, 208: 1511-1516, pp. 1-7.
Katsumasa et al., Structural Design of AlN/GaN Superlattices for Deep-Ultraviolet Light-Emitting Diodes with High Emission Efficiency, Applied Physics Letters 99, 151108, Oct. 2011, 3 pages.
Kipshidze, et al., AlN/AlGaInN superlattice light-emitting diodes at 280 nm, J. Appl. Phys. 93(3), Feb. 2003, pp. 1363-6.
Nath et al., "Molecular beam epitaxy of N-polar InGaN," Aug. 2010, Applied Physics Letters 97, 071903.
Nikishin et al., Deep Ultraviolet Light Emitting Diodes Based on Short Period Superlattices of AlN/AlGa(In)N, Jpn. J. Appl. Phys 42, Nov. 2003, pp. L 1362-L 1365.
Nikishin et al., Digital Alloys of AlN/AlGaN for Deep UV Light Emitting Diodes, Jpn. J. Appl. Phys. 44(10), Oct. 2005, pp. 7221-6.
Notice of Allowance dated Aug. 1, 2018 for U.S. Appl. No. 15/853,379.
Notice of Allowance dated Feb. 21, 2017 for U.S. Appl. No. 14/976,208.
Notice of Allowance dated Jul. 12, 2019 for U.S. Appl. No. 16/182,097.
Notice of Allowance dated Jul. 19, 2019 for U.S. Appl. No. 16/154,558.
Notice of Allowance dated Jul. 3, 2018 for U.S. Appl. No. 15/594,015.
Notice of Allowance dated Jul. 8, 2019 for U.S. Appl. No. 14/976,814.
Notice of Allowance dated Mar. 1, 2017 for U.S. Appl. No. 14/976,337.
Notice of Allowance dated Sep. 18, 2017 for U.S. Appl. No. 15/601,890.
Office Action dated Apr. 15, 2019 for Taiwan Patent Application Serial No. 104113397.
Office Action dated Aug. 20, 2018 for Taiwan Patent Application Serial No. 104113397.
Office Action dated Dec. 14, 2017 for U.S. Appl. No. 14/976,814.
Office Action dated Feb. 5, 2019 for Japan Patent Application No. 2016-568438.
Office Action dated Jan. 22, 2019 for China Patent Application Serial No. 201580027680.9.
Office Action dated Jan. 28, 2019 in China Patent Application Serial No. 2015800276796.
Office Action dated Jul. 27, 2018 for U.S. Appl. No. 14/976,814.
Office Action dated Jun. 25, 2018 for China Patent Application Serial No. 201580027680.9.
Office Action dated Jun. 9, 2016 for U.S. Appl. No. 14/976,208.
Office Action dated Mar. 15, 2019 for U.S. Appl. No. 16/154,558.
Office Action dated Mar. 19, 2019 for Japanese Patent Application No. 2016-569627.
Office Action dated Mar. 26, 2019 for Japanese Patent Application No. 2016-568023.
Office Action dated Mar. 9, 2018 for U.S. Appl. No. 15/594,015.
Office Action dated May 9, 2018 for People's Republic of China Patent Application No. 201580027679.6.
Office Action dated Nov. 1, 2018 for U.S. Appl. No. 14/976,814.
Office Action dated Nov. 3, 2016 for U.S. Appl. No. 14/976,208.
Office Action dated Oct. 8, 2019 for Japanese Patent Application No. 2016-568438.
Office Action dated Apr. 8, 2019 for U.S. Appl. No. 16/182,097.
Official Letter and Search report dated Aug. 2, 2018 for Taiwan Patent App. No. 104116463.
Official Letter and Search report dated Jul. 30, 2018 for Taiwan Patent App. No. 104116670.
Park et al., "Spontaneous polarization effects in wurtzite GaN/AlGaN quantum wells and comparison with experiment," Apr. 2000, Appl. Phys. Lett. 76, pp. 1981-1983.

(56) References Cited

OTHER PUBLICATIONS

Pereira et al., "Strain and composition distributions in wurtzite InGaN/GaN layers extracted from x-ray reciprocal space mapping," May 2002, Appl. Phys. Lett. 80, pp. 3913-3915.
Saengkaew, Epitaxial growth and properties of AlGaN-based UV-LEDs on Si(111) substrates, Mar. 2010, 227 pages.
Simon, Polarization-Engineered III-V Nitride Heterostructure Devices By Molecular Beam Epitaxy, University of Notre Dame, Apr. 2009, 140 pages.
Smith et al., "Determination of Wurtzite GaN Lattice Polarity Based on Surface Reconstruction", Feb. 1998, Appl. Phys. Lett., 72, 2114, pp. 1-7.
Taniyasu et al., Aluminum Nitride Deep-Ultraviolet Light-Emitting Diodes, NTT Technical Review, Dec. 2006, vol. 4, No. 12, pp. 54-58.
Taniyasu et al., An aluminium nitride light-emitting diode with a wavelength of 210 nanometres, Nature 441, 325-328 May 18, 2006, pp. 1-6. Accessed on Aug. 22, 2013, file://S:\CJP\LETTERS.htm.
Office Action dated May 22, 2020 for U.S. Appl. No. 16/676,139.
Wang et al., A Gadolinium Doped Superlattice GaN Schottky Diode for Neutron Detection, Innovation in Radiation Detectors: New Designs, Improvements, and Applications, Jun. 26-30, 2011, 209-210, vol. 104, Transactions of the American Nuclear Society, Hollywood, Florida.
Yoo, Growth and Characterization of III-Nitrides Materials System for Photonic and Electronic Devices by Metalorganic Chemical Vapor Deposition, Georgia Institute of Technology, Aug. 2007, 173 pages.
Office Action dated Oct. 28, 2020 for U.S. Appl. No. 16/676,139.
Office Action dated Feb. 2, 2021 for Japanese Patent application No. 2019-228049.
Simon, John et al.,"Polarization Induced Graded AlGaNp-n Junction grown by MBE", 2008 Device Research Conference, US, 2008, https://ieeexplore.ieee.org/stamp/stamp.jsp?tp=&arnumber=4800843.
Office Action dated May 19, 2020 for Japan Patent application No. 2016-568438.
Pre-appeal re-examination report dated May 11, 2020 for Japan Patent application No. 2016-569627.
Office Action dated Jul. 13, 2021 for Japan Patent Application No. 2019-228049.
Office Action dated Jul. 20, 2021 for Japan Patent Application No. 2016-569627.
Notice of Allowance and Fees dated May 13, 2021 for U.S. Appl. No. 16/676,139.
Office Action dated May 1, 2021 for Korean Patent application No. 10-2016-7033467.
Office Action dated May 17, 2021 for Korean Patent application No. 10-2016-7033172.
Office Action dated Nov. 17, 2021 for Republic of Korea Patent Application No. 10-2016-7033462.
Office Action dated Feb. 8, 2022 for Republic of Korea Patent Application No. 10-2021-7038889.
Office Action dated Mar. 15, 2022 for Japan Patent Application No. 2021-024285.

\* cited by examiner

2800

$$M:N \equiv [\,M\!\times\!(1ML\_GaN) / N\!\times\!(1ML\_AlN)\,]_{SL}$$

| GaN Layer Thickness (Angstroms) | Number of GaN Monolayers (ML) | $A_{SL}$ | AlN Layer Thickness (Angstroms) | | | | | | |
|---|---|---|---|---|---|---|---|---|---|
| | | | 2.49 | 4.98 | 7.47 | 9.96 | 12.46 | 14.95 | 17.44 |
| | | | Number of AlN monolayers (ML) | | | | | | |
| | | | 1 | 2 | 3 | 4 | 5 | 6 | 7 |
| 2.59 | 1 | | 5.08 | 7.57 | 10.07 | 12.56 | 15.05 | 17.54 | 20.03 |
| 5.19 | 2 | | 7.68 | 10.17 | 12.66 | 15.15 | 17.64 | 20.13 | 22.62 |
| 7.78 | 3 | | 10.27 | 12.76 | 15.25 | 17.74 | 20.23 | 22.72 | 25.21 |
| 10.37 | 4 | | 12.86 | 15.35 | 17.84 | 20.33 | 22.83 | 25.32 | 27.81 |
| 12.96 | 5 | | 15.45 | 17.94 | 20.44 | 22.93 | 25.42 | 27.91 | 30.40 |
| 15.56 | 6 | | 18.05 | 20.54 | 23.03 | 25.52 | 28.01 | 30.50 | 32.99 |
| 18.15 | 7 | | 20.64 | 23.13 | 25.62 | 28.11 | 30.60 | 33.09 | 35.58 |

$$M:N \equiv [ M \times (1ML\_GaN) / N \times (1ML\_AlN) ]_{SL}$$

| | | | AlN Layer Thickness (Angstroms) | | | | | | | |
|---|---|---|---|---|---|---|---|---|---|---|
| | | | 1.25 | 2.49 | 3.74 | 4.98 | 6.23 | 7.47 | 8.72 | 9.96 |
| | | | Number of AlN monolayers (ML) | | | | | | | |
| | | $\Lambda_{SL}$ | 0.5 | 1 | 1.5 | 2 | 2.5 | 3 | 3.5 | 4 |
| 1.30 | Number of GaN Monolayers (ML) | 0.5 | 2.54 | 3.79 | 5.03 | 6.28 | 7.52 | 8.77 | 10.01 | 11.26 |
| 2.59 | | 1 | 3.84 | 5.08 | 6.33 | 7.57 | 8.82 | 10.07 | 11.31 | 12.56 |
| 3.89 | | 1.5 | 5.13 | 6.38 | 7.63 | 8.87 | 10.12 | 11.36 | 12.61 | 13.85 |
| 5.19 | | 2 | 6.43 | 7.68 | 8.92 | 10.17 | 11.41 | 12.66 | 13.90 | 15.15 |
| 6.48 | | 2.5 | 7.73 | 8.97 | 10.22 | 11.46 | 12.71 | 13.95 | 15.20 | 16.45 |
| 7.78 | | 3 | 9.02 | 10.27 | 11.51 | 12.76 | 14.01 | 15.25 | 16.50 | 17.74 |
| 9.07 | | 3.5 | 10.32 | 11.56 | 12.81 | 14.06 | 15.30 | 16.55 | 17.79 | 19.04 |
| 10.37 | | 4 | 11.62 | 12.86 | 14.11 | 15.35 | 16.60 | 17.84 | 19.09 | 20.33 |

FIG.30

OPTOELECTRONIC DEVICE

CROSS-REFERENCE TO RELATED APPLICATION

This application is a continuation-in-part of U.S. patent application Ser. No. 14/976,814, filed Dec. 21, 2015, which is a continuation of International Patent Application number PCT/IB2015/052480, filed Apr. 6, 2015, which claims priority to Australian Provisional Patent Application number 2014902007, filed May 27, 2014 and entitled "An Optoelectronic Device", all of which are incorporated herein by reference in their entirety.

FIELD OF THE INVENTION

This invention relates generally to optoelectronic devices. In particular, the invention relates to optoelectronic devices that emit light at ultra-violet wavelengths. However, the invention is not limited to ultraviolet wavelengths.

BACKGROUND OF THE INVENTION

Although it has been possible to produce optoelectronic devices, such as light emitting diodes (LEDs), that emit light in the deep ultra-violet (UV) wavelengths ($\lambda \leq 280$ nm) using group III metal nitride semiconductor materials, such as aluminium gallium nitride (AlGaN), the optical emission intensity from such LEDs to date has been relatively poor compared to visible wavelength LEDs. This is partly due to an inherent limitation in the AlGaN semiconductor material electronic band structure. It is found that the emission of deep ultraviolet light from crystalline AlGaN films in a direction substantially parallel to the layer formation growth axis is not favourable in traditional LED structures. In particular, deep ultraviolet LEDs are traditionally formed using a high aluminium content AlGaN alloy in order to obtain the required bandgap for the desired optical emission wavelength. Such high aluminium content compositions are particularly affected by the aforementioned limitation.

It has been widely believed that a poor deep ultraviolet emission intensity in such LEDs is due to an inferior crystalline structural quality of deposited group III metal nitride materials which leads to poor electrical behaviour of the LEDs. In comparison with other technologically mature group III-V compound semiconductors, such as gallium aluminium arsenide (GaAlAs), the group III metal nitrides exhibit crystalline defects at least two to three orders of magnitude higher. The structural quality of the group III metal nitrides can be improved by epitaxial deposition on native substrates, such as, aluminium nitride (AlN) and gallium nitride (GaN). However, even if AlN substrates are available, the deep ultraviolet LED formed using high aluminium content AlGaN materials is still unable to emit light efficiently in a vertical direction (i.e., parallel light emission perpendicular to the plane of the layer).

Yet a further problem exists in the prior art for operation of LEDs based on group III metal nitrides. The highest crystalline structure quality of group III metal nitride materials is formed using wurtzite crystal structure type films. These films are deposited on native or dissimilar hexagonal crystal symmetry substrates, with the so called c-plane orientation. Such c-plane oriented group III metal nitride films have the unique property of forming extremely large internal charge sheets at the interface boundary of two dissimilar AlGaN compositions. These charges are called pyroelectric charges and appear at every layer composition discontinuity. Furthermore, each and every different AlGaN composition possesses a slightly different crystal lattice parameter, and therefore each dissimilar AlGaN layer readily forms crystal misfit dislocations at the interface boundary which propagate into the interior of the layer if not correctly managed. If the dissimilar AlGaN layers are formed to minimize the crystal misfit dislocations, then yet another problematic internal charge is generated, called a piezoelectric charge. These internal pyroelectric and piezoelectric charges therefore impose further challenges to LED design as they generate internal electric fields within the LED that tend to oppose the recombination of the charge carriers that is required for light generation.

A further problem is the inherently high refractive index of group III metal nitride materials which further limits the amount of the light generated within the LED which can escape from the surface. Significant efforts have been made in surface texturing to improve an escape cone of light from the surface. These solutions have had some success by improving the light emission from deep UV LEDs but are still far from achieving optical power densities of commercial significance when compared to UV gas—lamps technologies. Even with surface texturing, and the use of optical coupling structures, such as photonic bandgap patterned structures, UV LEDs have been unable to emit light efficiently in a vertical direction.

A yet further limitation found in the prior art is that in comparison to group III metal arsenide semiconductors, group III metal nitride semiconductors are extremely challenging to grow via film deposition. Even though a convincing range of arbitrary alloy compositions of indium gallium nitride ($In_xGa_{1-x}N$), aluminium gallium nitride ($Al_xGa_{1-x}N$) and indium gallium aluminium nitride ($In_xGa_yAl_{1-x-y}N$) have been demonstrated using both molecular beam epitaxy (MBE) and metal organic chemical vapor deposition (MOCVD), there remain large technical challenges in deposition a large number of dissimilar compositions as part of a single epitaxial stack of an LED. In practice, this limits the complexity and the range of bandgap engineered structures that can be realized using group III metal nitride semiconductors and such growth techniques.

There is therefore a need for an improved solid state optoelectronic device for use at UV frequencies, particularly deep UV frequencies. There is yet a further need to improve the film formation method for engineering such optoelectronic devices.

SUMMARY OF THE INVENTION

In one form, although it need not be the only or indeed the broadest form, the invention resides in an optoelectronic device comprising a semiconductor structure including:
  a p-type active region; and
  an n-type active region;
  wherein:
    the semiconductor structure is comprised solely of one or more superlattices;
    each superlattice is comprised of a plurality of unit cells; and
    each unit cell comprises at least two distinct substantially single crystal layers.

Preferably, the semiconductor structure is a substantially single crystal structure.

Suitably, the semiconductor structure includes an i-type active region between the n-type active region and the p-type active region.

Preferably, throughout the semiconductor structure, unit cells that are adjacent one another have substantially the same average alloy content.

Preferably, the i-type active region has a thickness of greater than or equal to 1 nm and less than or equal to 100 nm.

Preferably, the i-type active region has a lateral width selected from the range of 1 nm to approximately 10 μm.

Preferably, the semiconductor structure is constructed by epitaxial layer growth along a predetermined growth direction.

Suitably, an average alloy content of each of the plurality of unit cells is constant within each superlattice.

Suitably, the average alloy content of each of the plurality of unit cells is constant in a substantial portion of the semiconductor structure.

Suitably, the average alloy content of each of the plurality of unit cells is non-constant along the growth direction within at least one of the one or more superlattices.

Suitably, the average alloy content of each of the plurality of unit cells varies periodically along the growth direction within a portion of at least one of the one or more superlattices.

Suitably, the average alloy content of each of the plurality of unit cells varies periodically and aperiodically along the epitaxial growth direction in distinct regions of at least one of the one or more superlattices.

In some embodiments, the at least two layers in each of the plurality of unit cells each have a thickness of less than or equal to 6 monolayers of a material of which the respective layer is composed along the growth direction.

In some embodiments, one of the at least two layers of each of the plurality of unit cells within at least a portion of the one or more superlattices comprises 1 to 10 monolayers of atoms along the growth direction and the other one or more layers in each of the respective unit cells comprise a total of 1 to 10 monolayers of atoms along the growth direction.

In some embodiments, all or a majority of the distinct substantially single crystal layers of each unit cell within each superlattice have a thickness of 1 monolayer to 10 monolayers of atoms along a growth direction.

Suitably, an average thickness in the growth direction of each of the plurality of unit cells is constant within at least one of the one or more superlattices.

Suitably, the unit cells in two or more of the n-type active region, the p-type active region and the i-type active region have a different average thickness.

Preferably, the at least two distinct substantially single crystal layers of each unit cell have a wurtzite crystal symmetry and have a crystal polarity in the growth direction that is either a metal-polar polarity or nitrogen-polar polarity.

Suitably, the crystal polarity is spatially varied along the growth direction, the crystal polarity being alternately flipped between the nitrogen-polar polarity and the metal-polar polarity.

Suitably, each layer in each unit cell in one or more superlattices has a thickness that is selected to control electronic and optical properties of the optoelectronic device by controlling quantized energy states and spatial wavefunctions for electrons and holes in the electronic band structure of the superlattice.

Suitably, the optoelectronic device is configured as a light emitting device and optical energy is generated by recombination of electrically active holes and electrons supplied by the p-type active region and the n-type active region, the recombination occurring in a region substantially between the p-type active region and the n-type active region.

Suitably, light emitted by the optoelectronic device is ultra violet light.

Suitably, light emitted by the optoelectronic device is ultra violet light in the wavelength range of 150 nm to 280 nm.

Suitably, light emitted by the optoelectronic device is ultra violet light in the wavelength range of 210 nm to 240 nm.

Suitably, the optoelectronic device emits light having a substantially transverse magnetic optical polarization with respect to the growth direction.

Suitably, the optoelectronic device operates as an optical waveguide with light spatially generated and confined along a direction substantially parallel to the plane of the one or more layers of the unit cells of the one or more superlattices of the semiconductor structure.

Suitably, the optoelectronic device emits light having a substantially transverse electric optical polarization with respect to the growth direction.

Suitably, the optoelectronic device operates as a vertically emitting cavity device with light spatially generated and confined along a direction substantially perpendicular to the plane of the one or more layers of the unit cells of the one or more superlattices of the semiconductor structure.

Suitably, the vertically emitting cavity device has a vertical cavity disposed substantially along the growth direction and formed using metallic reflectors spatially disposed along one or more portions of the semiconductor structure.

Suitably, the reflectors are made from a high optical reflectance metal.

Suitably, the cavity is defined by the optical length between the reflectors being less than or equal to a wavelength of the light emitted by the device.

Suitably, the wavelength is determined by the optical emission energy of the one or more superlattices comprising the semiconductor structure and optical cavity modes determined by the vertical cavity Suitably, the high optical reflectance metal is aluminium (Al).

Suitably, at least one region of the semiconductor structure is substantially transparent to the optical energy.

Suitably, the at least one region is selected from at least one of the p-type active region and the n-type active region.

Suitably, a reflector layer is provided to improve the out coupling of the optical energy generated within the semiconductor structure.

Suitably, the reflector layer is positioned atop the optoelectronic device to substantially retroreflect emitted light from the interior of the device.

Suitably, the optoelectronic device comprises a crystalline substrate on which the semiconductor structure is grown.

Suitably, optical energy generated by the semiconductor structure is directed out of the optoelectronic device through the substrate.

Suitably, a buffer layer is grown first on the substrate followed by the semiconductor structure with the buffer acting as a strain control mechanism providing a predetermined in-plane lattice constant.

Suitably, the buffer layer includes one or more superlattices.

Suitably, a transparent region is provided adjacent to the buffer layer and the substrate, and the buffer layer is transparent to optical energy emitted from the device.

Suitably, the optical energy is coupled externally through the transparent region, the buffer layer and the substrate.

Suitably, either the p-type active region or the n-type active region is grown first.

Suitably, each of the at least two distinct substantially single crystal layers of each unit cell in each superlattice comprises at least one of the following compositions:

a binary composition single crystal semiconductor material ($A_xN_y$), where $0<x\leq1$ and $0<y\leq1$;

a ternary composition single crystal semiconductor material ($A_uB_{1-u}N_y$), where $0\leq u\leq1$ and $0<y\leq1$;

a quaternary composition single crystal semiconductor material ($A_pB_qC_{1-p-q}N_y$), where $0\leq p\leq1$, $0\leq q\leq1$ and $0<y\leq1$;

where A, B and C are distinct metal atoms selected from group II and/or group III elements and N are cations selected from at least one of a nitrogen, oxygen, arsenic, phosphorus, antimony, and fluorine.

Suitably, each of the at least two distinct substantially single crystal layers of each unit cell in each superlattice comprises at least one of the following compositions:

a group III metal nitride material ($M_xN_y$);
a group III metal arsenide material ($M_xAs_y$);
a group III metal phosphide material ($M_xP_y$);
a group III metal antimonide material ($M_xSb_y$);
a group II metal oxide material ($M_xO_y$);
a group II metal fluoride material ($M_xF_y$);
where $0<x\leq3$ and $0<y\leq4$, and where M is a metal.

Suitably, each of the at least two distinct substantially single crystal layers of each unit cell in each superlattice comprises at least one of the following compositions:

aluminium nitride (AlN);
aluminium gallium nitride ($Al_xGa_{1-x}N$) where $0\leq x<1$;
aluminium indium nitride ($Al_xIn_{1-x}N$) where $0\leq x<1$;
aluminium gallium indium nitride ($Al_xGa_yIn_{1-x-y}N$) where $0\leq x<1$, $0\leq y\leq1$ and $0<(x+y)<1$.

Suitably, one or more layers of each unit cell of the one or more superlattices is not intentionally doped with an impurity species.

Suitably, one or more layers of each unit cell of the one or more superlattices of the n-type active region and/or the p-type active region is intentionally doped with one or more impurity species or formed with one or more impurity species.

Suitably, the one or more impurity species in the n-type active region are selected from:

silicon (Si);
germanium (Ge);
silicon-germanium where $0<x<1$;
crystalline silicon-nitride ($Si_xN_y$), where $0<x<3$ and $0<y<4$;
crystalline germanium-nitride ($Ge_xN_y$), where $0<x<3$ and $0<y<4$;
crystalline silicon-aluminium-gallium-nitride ($Si_u[Al_xGa_{1-y}]_zN_v$) where $u>0$, $x>0$, $0<y<1$, $z>0$ and $v>0$; or
crystalline germanium-aluminium-gallium-nitride ($Ge_u[Al_xGa_{1-y}]_zN_v$) where $u>0$, $x>0$, $0<y<1$, $z>0$ and $v>0$.

Suitably, the one or more impurity species in the p-type active region are selected from:

magnesium (Mg);
zinc (Zn);
magnesium-zinc ($Mg_xZn_{1-x}$), where $0\leq x\leq b$ 1
crystalline magnesium-nitride ($Mg_xN_y$), where $0<x<3$ and $0<y\leq2$; or
magnesium-aluminium-gallium-nitride ($Mg_u[Al_xGa_{1-y}]_zN_v$), where $u>0$, $x>0$, $0<y<1$, $z>0$ and $v>0$.

Suitably, the one or more impurity species in the n-type active region or the p-type active region are selected from:

hydrogen (H);
oxygen (O);
carbon (C); or
fluorine (F).

Suitably, the one or more impurity species are incorporated post growth via ion-implantation.

Suitably, at least a portion of the at least one of the one or more superlattices includes uniaxial strain or a biaxial strain to enhance the activation energy of an intentionally doped region to improve an electron or hole carrier concentration.

Suitably, exposed or physically etched layers of the one or more superlattices are covered by a passivation layer.

Suitably, a first lateral contact extends partially into the n-type active region from a first contact layer formed on a surface of the n-type active region.

Suitably, a second lateral contact extends partially into the p-type active region from a second contact layer formed on a surface of the p-type active region.

Suitably, the second lateral contact is surrounded by a layer of p-type GaN between the second lateral contact and the p-type active region.

Suitably, the second contact layer is a metal contact layer and a p-type contact layer is formed between the p-type active region and the metal contact layer.

Suitably, the at least two distinct substantially single crystal layers of each unit cell each have a thickness that is less than or equal to a critical layer thickness required to maintain elastic strain.

Preferably, one or more of the at least two distinct substantially single crystal layers are distinct substantially single crystal semiconductor layers.

Suitably, one or more of the at least two distinct substantially single crystal layers are metal layers.

Further features and advantages of the present invention will become apparent from the following detailed description.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 28 is a chart showing the preferred range of layered thicknesses for an example superlattice.

FIG. 30 is a chart showing further possible implementations of unit cells formed by using on GaN and AlN materials.

Figure 1:
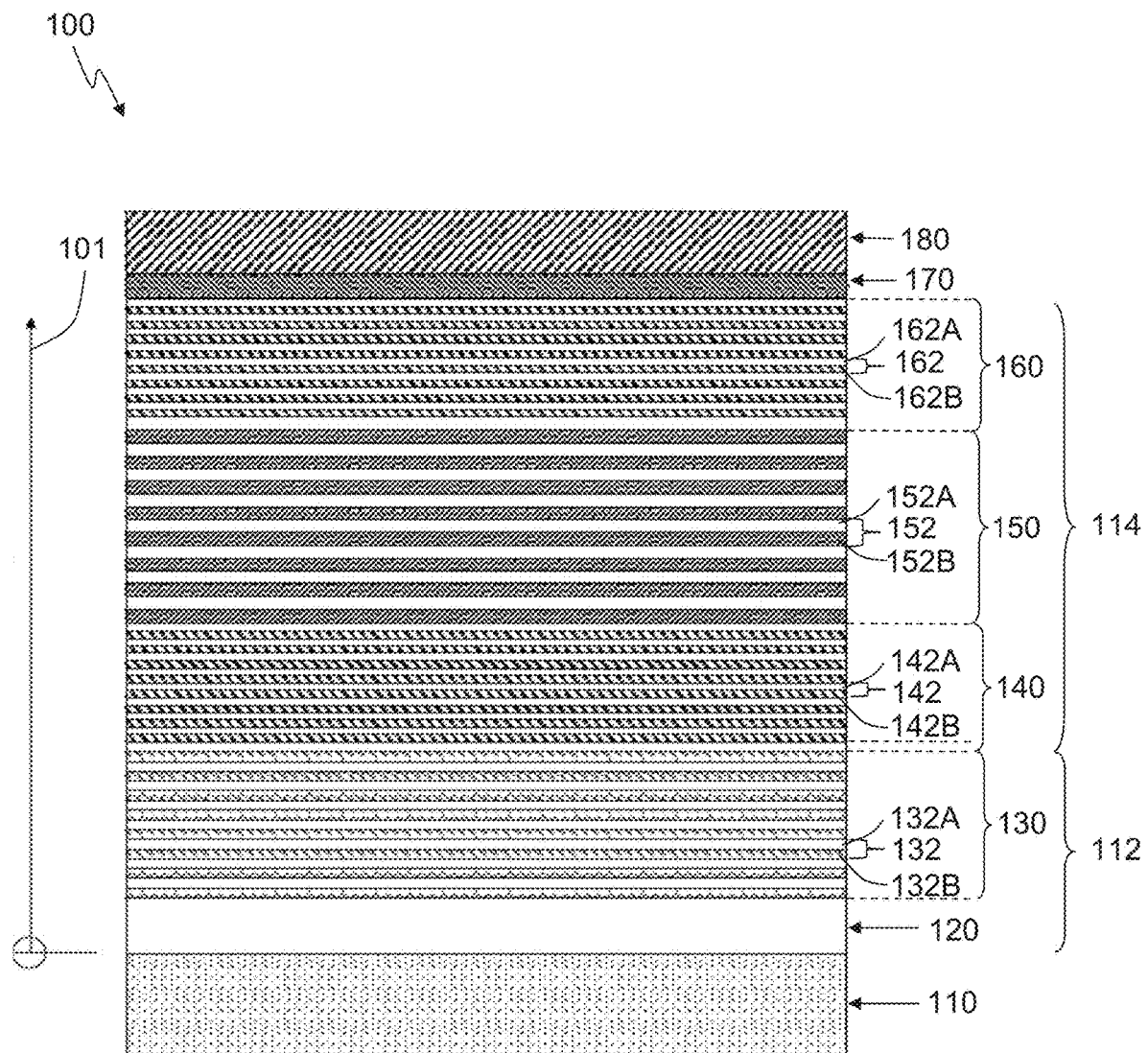
FIG. 1 is a diagram showing a sectional view of a stack for an optoelectronic device according to a first embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The optoelectronic device components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE PREFERRED EMBODIMENT

According to one aspect, the invention resides in an optoelectronic device comprising a semiconductor structure. In preferred embodiments, the semiconductor structure is constructed by growth, for example, epitaxial layer growth, along a predetermined growth direction. The semiconductor structure is comprised solely of one or more superlattices. For example, where the semiconductor structure comprises more than one superlattice, the superlattices are formed atop one another in a contiguous stack. In preferred embodiments, the one or more superlattices are short period superlattices. Each of the one or more superlattices is comprised of a plurality of unit cells, and each of the plurality of unit cells comprises at least two distinct substantially single crystal layers. In preferred embodiments, one or more of the at least two distinct substantially single crystal layers are distinct single crystal semiconductor layers, and more preferably all of the at least two distinct substantially single crystal layers are distinct single crystal semiconductor layers. However, in some embodiments, one or more of the at least two distinct substantially single crystal layers are metal layers. For example, the metal layers can be formed of aluminium (Al).

The semiconductor structure includes a p-type active region and an n-type active region. The p-type active region of the semiconductor structure provides p-type conductivity and an n-type active region provides n-type conductivity. In preferred embodiments, the semiconductor structure includes an i-type active region between the n-type active region and the p-type active region to form a p-i-n device.

In some embodiments, each region of the semiconductor structure is a separate superlattice. However, in some alternative embodiments, the n-type active region, the p-type active region and/or the i-type active region are regions of a single superlattice. In other alternative embodiments, the active region, the p-type active region and/or the i-type active region each comprise one or more superlattices.

In preferred embodiments, the optoelectronic device is a light emitting diode or a laser and/or emits ultra violet light, preferably, in the wavelength range of 150 nm to 280 nm, and more preferably in the wavelength range of 210 nm to 240 nm. However, in alternative embodiments, the optoelectronic device emits ultra violet light, preferably, in the wavelength range of 240 nm to 300 nm, and more preferably in the wavelength range of 260 nm to 290 nm. When the optoelectronic device is configured as a light emitting device, the optical energy is generated by recombination of electrically active holes and electrons supplied by the p-type active region and the n-type active region. The recombination of holes and electrons occurs in a region substantially between the p-type active region and the n-type active region, for example, in the i-type active region or around an interface of the p-type active region and n-type active region when an i-type active region is omitted.

Each layer in each unit cell in the one or more superlattices has a thickness that can be selected to control electronic and optical properties of the optoelectronic device by controlling quantized energy states and spatial wavefunctions for electrons and holes in the electronic band structure of the superlattice. From this selection a desired electronic and optical energy can be achieved. In preferred embodiments, an average thickness in the growth direction of each of the plurality of unit cells is constant within at least one of the one or more superlattices. In some embodiments, the unit cells in two or more of the n-type active region, the p-type active region and the i-type active region have a different average thickness.

In some embodiments, one of the at least two layers of each of the plurality of unit cells within at least a portion of the one or more superlattices comprises 1 to 10 monolayers of atoms along the growth direction and the other one or more layers in each of the respective unit cells comprise a total of 1 to 10 monolayers of atoms along the growth direction. In some embodiments, all or a majority of the distinct substantially single crystal layers of each unit cell within each superlattice have a thickness of 1 monolayer to 10 monolayers of atoms along a growth direction. In some embodiments, at least two layers in each of the plurality of unit cells each have a thickness of less than or equal to 6 monolayers of a material of which the respective layer is composed along the growth direction. In some embodiments, the thickness of each unit cell is chosen based on the composition of the unit cell.

An average alloy content of each of the plurality of unit cells can be constant or non-constant along the growth direction within at least one of the one or more superlattices. Maintaining a constant average alloy content enables lattice matching of the effective in-plane lattice constant of the unit cells of dissimilar superlattices. In preferred embodiments, throughout the semiconductor structure, unit cells that are adjacent one another have substantially the same average alloy content. In some embodiments, the average alloy content of each of the plurality of unit cells is constant in a substantial portion of the semiconductor structure.

In some embodiments, the average alloy content of each of the plurality of unit cells varies periodically and/or aperiodically along the growth direction within a portion of at least one of the one or more superlattices. In some embodiments, the average alloy content of each of the plurality of unit cells varies periodically and aperiodically along the epitaxial growth direction in distinct regions of at least one of the one or more superlattices.

In preferred embodiments, the at least two distinct substantially single crystal layers of each unit cell have a wurtzite crystal symmetry and have a crystal polarity in the growth direction that is either a metal-polar polarity or nitrogen-polar polarity. In some embodiments, the crystal polarity is spatially varied along the growth direction, the crystal polarity being alternately flipped between the nitrogen-polar polarity and the metal-polar polarity.

Preferably, each of the at least two distinct substantially single crystal layers of each unit cell in each superlattice comprises at least one of the following compositions: a binary composition single crystal semiconductor material ($A_xN_y$), where $0<x\leq1$ and $0<y\leq1$; a ternary composition single crystal semiconductor material ($A_uB_{1-u}N_y$), where $0\leq u\leq1$ and $0<y\leq1$; a quaternary composition single crystal semiconductor material ($A_pB_qC_{1-p-q}N_y$), where $0\leq p\leq1$, $0\leq q\leq1$ and $0<y\leq1$. Here A, B and C are distinct metal atoms selected from group II and/or group III elements and N are cations selected from at least one of a nitrogen, oxygen, arsenic, phosphorus, antimony, and fluorine.

More preferably, each of the at least two distinct substantially single crystal layers of each unit cell in each superlattice comprises at least one of the following compositions: a group III metal nitride material ($M_xN_y$); a group III metal arsenide material ($M_xAs_y$); a group III metal phosphide material ($M_xP_y$); a group III metal antimonide material ($M_xSb_y$); a group II metal oxide material ($M_xO_y$); a group II metal fluoride material ($M_xF_y$). Here $0<x\leq3$ and $0<y\leq4$, and where M is a metal. In some embodiments, the metal M is selected from one or more group II, group III or group IV elements. For example, each of the at least two distinct substantially single crystal layers of each unit cell in each superlattice comprises at least one of the following compositions: aluminium nitride (AlN); aluminium gallium nitride ($Al_xGa_{1-x}N$) where $0\leq x<1$; aluminium indium nitride ($Al_xIn_{1-x}N$) where $0\leq x<1$; aluminium gallium indium nitride ($Al_xGa_yIn_{1-x-y}N$) where $0\leq x<1$, $0\leq y\leq1$ and $0<(x+y)<1$. In some embodiments, one of the at least two distinct substantially single crystal layers comprises a narrower band gap material and another of the at least two distinct substantially single crystal layers comprises a wider bandgap material.

In some embodiments, one or more of the at least two distinct substantially single crystal layers of each unit cell is formed of a metal. For example, each unit cell can comprise an aluminium (Al) layer and an aluminium nitride (AlN) layer.

In some embodiments, one or more layers of each unit cell of the one or more superlattices is not intentionally doped with an impurity species, for example, in the n-type active region, the p-type active region and/or the i-type active region. Alternatively or additionally, one or more layers of each unit cell of the one or more superlattices of the n-type active region and/or the p-type active region is intentionally doped with one or more impurity species or formed with one or more impurity species. For example, the one or more impurity species in the n-type active region are selected from: silicon (Si); germanium (Ge); silicon-germanium ($Si_xGe_{1-x}$), where $0<x<1$; crystalline silicon-nitride ($Si_xN_y$), where $0<x<3$ and $0<y<4$; crystalline germanium-nitride ($Ge_xN_y$), where $0<x<3$ and $0<y<4$; crystalline silicon-aluminium-gallium-nitride ($Si_u[Al_xGa_{1-y}]_zN_v$) where $u>0$, $x>0$, $0<y<1$ and $v>0$; or crystalline germanium-aluminium-gallium-nitride ($Ge_u[Al_xGa_{1-y}]_zN_v$) where $u>0$, $x>0$, $0<y<1$ and $v>0$. For example, the one or more impurity species in the p-type active region are selected from: magnesium (Mg); zinc (Zn); magnesium-zinc ($Mg_xZn_{1-x}$), where $0\leq x\leq1$; crystalline magnesium-nitride ($Mg_xN_y$), where $0<x\leq3$ and $0<y\leq2$; or magnesium-aluminium-gallium-nitride ($Mg_u[Al_xGa_{1-y}]_zN_v$), where $u>0$, $x>0$, $0<y<1$ and $v>0$. The one or more impurity species in the n-type active region or the p-type active region can also be selected from: hydrogen (H); oxygen (O); carbon (C); or fluorine (F).

At least a portion of the at least one of the one or more superlattices can include a uniaxial strain, a biaxial strain or a triaxial strain to modify a level of activated impurity doping. That is, by the action of crystal deformation in at least one crystal direction, the induced strain can deform advantageously the energy band structure of the materials in the layers of the one or more superlattices. The resulting energy shift of the conduction or valence band edges can then be used to reduce the activation energy of a given impurity dopant relative to the superlattice. For example, a group III nitride material such as p-type Mg-doped GaN with a wurtzite lattice structure can be subjected to an elastic tensile strain substantially parallel to the c-plane and perpendicular to the growth direction. The resulting shift in energy of the valence band edges results in a reduced energy separation between the said valence band edge and the Mg impurity level. This energy separation is known as the activation energy for holes and is temperature dependent. Therefore, reducing the activation energy of a specific carrier due to an impurity dopant via the application of a strain dramatically improves the activated carrier density of the doped material. This built-in strain can be selected during an epitaxial material formation step during the formation of the superlattice. For example, a GaN epilayer can be formed to include a tensile in-plane strain if deposited directly upon a single crystal AlN layer. If, for example, in the p-type active region, the AlN and Mg doped GaN layers are each limited in thickness to 1 to 7 monolayers, then they will both elastically deform without the creation of deleterious crystal defects, such as interfacial dislocations. Here the AlN layer will undergo an in-plane compressive stress, whereas the Mg-doped GaN layer will undergo in-plane tensile stress. Therefore, strain can enhance the activation energy of one or more of the intentionally doped regions that contain the impurity species. This improves an electron or hole carrier concentration in the one or more of the intentionally doped regions.

FIG. 1 is a diagram showing a sectional view of a stack 100 for an optoelectronic device according to some embodiments of the present invention. In one embodiment, the optoelectronic device is a Light Emitting Diode (LED). However, it should be appreciated that the present invention may also be adapted to fabricate superluminescent LEDs and lasing devices with the positioning of suitable reflective layers or mirrors in the optoelectronic device.

The stack 100 comprises a crystalline substrate 110. A buffer region 112 is grown first on the substrate 110 followed by a semiconductor structure 114. The buffer region 112 and the semiconductor structure 114 are formed or grown in a growth direction indicated by arrow 101. The buffer region 112 includes a buffer layer 120 and one or more superlattices 130. In preferred embodiments, the buffer region acts as a strain control mechanism providing a predetermined in-plane lattice constant.

The semiconductor structure 114 comprises, in growth order, an n-type active region 140, an i-type active region 150 and a p-type active region 160. A p-type contact layer 170 is optionally formed on the p-type active region 160. A first contact layer 180 is formed on the p-type contact layer 170 or the p-type active region 160 if the p-type contact layer is not present. In preferred embodiments, at least one region of the semiconductor structure is substantially transparent to an optical energy emitted by the optoelectronic device. For example, the p-type active region and/or the n-type active region are transparent to the emitted optical energy.

In preferred embodiments, the substrate 110 has a thickness of between 300 μm and 1,000 μm. The thickness of the substrate 110 can be chosen based on a diameter of the substrate 110. For example, a substrate having a diameter of two inches (25.4 mm) and made of c-plane sapphire may have a thickness of about 400 μm and a substrate having a diameter of six inches may have a thickness of about 1 mm. The substrate 110 can be a native substrate made of a native material that is native to the n-type active region or a non-native substrate made from a non-native material that is non-native to the n-type active region. For example, if the n-type active region comprises one or more group III metal nitride materials, the substrate 110 can be made of a similar group III metal nitride material, such as AlN or GaN, or from a non-native material, such as $Al_2O_3$ or Si(111). However, a person skilled in the art will realise that the substrate 110 may be made from many other materials which are compatible with a layer formed above the substrate 110. For example, the substrate can be made of a crystalline metal oxide material, such as magnesium oxide (MgO) or zinc-oxide (ZnO), silicon-carbide (SiC), Calcium Fluoride ($CaF_2$), a crystalline thin film semiconductor on amorphous glass, or a crystalline thin film semiconductor on a metal.

The buffer region 112 functions as a transition region between the substrate 110 and semiconductor structure 114. For example, the buffer region 112 provides a better match in lattice structure between the substrate 110 and the semiconductor structure 114. For example, the buffer region 112 may comprise a bulk like buffer layer followed by at least one superlattice designed to achieve a desired in-plane lattice constant suitable for depositing the one or more superlattices of the semiconductor structure of the device.

In preferred embodiments, the buffer layer 120 in the buffer region 112 has a thickness of between 50 nm and several micrometres, and preferably, between 100 nm and 500 nm. The buffer layer 120 can be made from any material that is suitable for matching the lattice structure of the substrate 110 to the lattice structure of a lowest layer of the one or more superlattices. For example, if the lowest layer of the one or more superlattices is made of a group III metal nitride material, such as AlN, the buffer layer 120 can be made of AlN. In alternative embodiments, the buffer layer 120 can be omitted.

The one or more superlattices 130 in the buffer region 112 and the one or more superlattices in the semiconductor structure 114 can be considered to comprise a plurality of unit cells. For example, the unit cells 132 in the buffer region 112, the unit cells 142 in the n-type active region 140, the unit cells 152 in the i-type active region 150, and the unit cells 162 of the p-type active region 160. Each of the plurality of unit cells comprises two distinct substantially single crystal layers. A first layer in each unit cell is labelled "A" and a second layer in each unit cell is labelled "B".

In different regions of the semiconductor structure, the first layer and/or the second layer in each unit cell can have the same or a different composition, and/or the same or a different thickness. For example, FIG. 1 shows the first layers and the second layers having a greater thickness in the i-type active region 150 than in the n-type active region 140 and the p-type active region 160.

The n-type active region 140 provides n-type conductivity. In preferred embodiments, one or both of the first layer 142A and the second layer 142B in each unit cell 142 in the n-type active region 140 is doped with, or formed of, a dopant material, such as the materials described above. In some embodiments, the dopant material is different in the first layer and the second layer of each unit cell.

The i-type active region 150 is the main active region of the optoelectronic device. In preferred embodiments, the i-type active region is designed to optimize the spatial electron and hole recombination to a selected emission energy or wavelength. In preferred embodiments, the first layer 152A and the second layer 152B in each unit cell 152 of the i-type active region 150 have a thickness that is adjusted to control the quantum mechanical allowed energies within the unit cell or the i-type active region 150. As the thickness of each layer of the unit cells is 1 to 10 monolayers in some embodiments, a quantum description and treatment of the superlattice structure is necessary to determine the electronic and optical configuration. If group III metal nitride materials having a wurtzite crystal symmetry and further having a polar nature are used to form the layers, there are many internal electric fields across each heterojunction of the unit cell and the one or more superlattices. These built in electric fields form due to spontaneous and piezoelectric charges that occur at each heterojunction. The complex spatial band structure along the growth direction creates a non-trivial potential variation in the conduction and valence bands which is modulated by the spatial variation in composition between the layers of the unit cells. This spatial variation is of the order of the deBroglie wavelength of the respective carriers within the conduction and valence bands, and thus requires a quantum treatment of the resulting confined energy levels and spatial probability distribution (defined herein as the carrier wavefunction) within the one or more superlattices.

Furthermore, a crystal polarity of the semiconductor structure is preferably selected from either a metal-polar or a nitrogen-polar growth along the growth direction 101, for example, for one or more superlattices formed of group III metal nitride materials. Depending on the crystal polarity of the semiconductor structure, at least a portion of the i-type active region 150 can be further selected to optimize the optical emission. For example, a metal-polar oriented growth along the growth direction 101, can be used to form a superlattice in the i-type active region of an n-i-p stack comprising alternating layers of GaN and AlN. As the n-type active region in an n-i-p stack is formed closest to the substrate, the i-type active region will have a linearly increasing depletion field across it spanning the distance between the n-type active region and the p-type active region (for example, see FIGS. 9, 15 and 21). The i-type active region superlattice will then be subjected to yet a further electric field due to the built-in depletion field of the n-i-p stack. Alternatively, the built-in depletion field across the i-type active region can be generated in other configurations. For example, the stack can be a p-i-n stack with the p-type active region 160 closest to the substrate and/or grown using nitrogen-polar crystal growth orientation along 101.

The said depletion field across the depletion region of a p-n stack or the i-type active region 150 of a p-i-n stack can also partially set an optical emission energy and emission wavelength of the optoelectronic device. In preferred embodiments, one or both of the first layer 152A and the second layer 152B in each unit cell in the i-type active region is un-doped or not intentionally doped. In some embodiments, the i-type active region 150 has a thickness of less than or equal to 100 nm and a thickness of greater than or equal to 1 nm. The i-type active region has a lateral width selected from the range of 1 nm to approximately 10 μm.

The total width of the i-type active region 150 can be selected to further tune the depletion field strength across the i-type active region 150 between the p-type active region 160 and the n-type active region 140. Depending upon the crystal growth polarity, the width and the effective electron and hole carrier concentrations of the n-type active region 140 and the p-type active region 160, the depletion field strength will provide either a blue-shift or a red-shift in the emission energy or wavelength of the light emitted from the i-type active region.

The p-type active region 160 provides p-type conductivity. In preferred embodiments, one or both of the first layer 162A and the second layer 162B in each unit cell 162 in the p-type active region is doped with, or formed of, a dopant material, such as the materials described above.

In preferred embodiments, the first layer and the second layer of each of the plurality of unit cells in each of the one or more superlattices in the semiconductor structure are composed of group III metal nitride materials. For example, the first layers can be composed of aluminium nitride (AlN), and the second layers can be composed of gallium nitride (GaN). However, it should be appreciated that the first and second layers in each of the one or more superlattices can be composed of any of the materials specified above.

In preferred embodiments, the average alloy content, for example Al and/or Ga where the first layers consist essentially of AlN and the second layers consist essentially of GaN, of the one or more superlattices is constant. In alternative embodiments, the average alloy content of one or more of the one or more superlattices is non-constant.

In some embodiments, the average alloy content of the unit cells is the same in all superlattices of the semiconductor structure 114 and/or stack 100, but the period is changed between superlattices and/or within superlattices. Maintaining a constant average alloy content enables lattice matching of dissimilar superlattices. Such lattice matched growth of each unit cell enables large numbers of periods to be formed without an accumulation of strain. For example, using a specific period of the superlattice for an n-type active region 140 would make the n-type active region 140 more transparent to a wavelength of the emitted light. In another example, using a different period for the i-type active region 150, would cause the light to be emitted vertically i.e. in a same plane as the growth direction 101.

In another embodiment, the one or more superlattices have constant average alloy content and an optical emission that is substantially perpendicular to the plane of the superlattice layers. For example, a vertically emitting device is formed by using superlattices with layers of AlN and AlGaN with the Al percentage of the AlGaN layers less than 60%. In yet another preferred embodiment, a plurality of or all of the one or more the superlattices are constructed from unit cells comprising AlN and GaN thereby enabling an improved growth process that is optimized at a single growth temperature for only two materials.

Doping may be incorporated into the n-type active region and/or p-type active region of the one or more superlattices in several ways. In some embodiments, doping is introduced into just one of the first layer and the second layer in each unit cell. For example, Si can be introduced into GaN in the second layer of the unit cell to create an n-type material or Mg can be introduced into GaN in the second layer of the unit cell to create a p-type material. In alternative embodiments, doping can be introduced into more than one layer/material in each unit cell and the dopant material can be different in each layer of the unit cell. In some embodiments, the one or more superlattices include a uniaxial strain or a biaxial strain to modify a level of activated doping.

In preferred embodiments, the one or more superlattices of the semiconductor structure comprise a wurtzite lattice structure, preferably grown along the c-axis (0001). Where the one or more superlattices have a wurtzite lattice structure, a monolayer is defined as half a thickness of the "c" dimension of the hexagonal unit cell of the lattice. In some embodiments, the one or more superlattices of the semiconductor structure comprise a zinc-blend lattice structure, preferably grown along (001)-axis. Where the one or more superlattices have a zinc-blend lattice structure, one monolayer is defined as half a thickness of the "a" dimension of the cubic unit cell of the lattice.

While a single superlattice is shown in FIG. 1 for each region of the semiconductor structure, it should be appreciated that each region may include more than one superlattice stacked atop one another. For example, the n-type active layer 140 can include a first superlattice wherein respective layers in each unit cell have a first material composition and a second superlattice grown on the first super lattice wherein the respective layers in each unit cell have a second material composition. In some embodiments, the stack 100 can comprise a single superlattice comprising one or more of the buffer region 130, the n-type active region 140, the i-type active region 150 and the p-type active region 160.

In some embodiments, at least one of the one or more superlattices is periodic, meaning that each unit cell of the respective superlattice has the same structure. For example, each unit cell of the respective superlattice has the same number of layers, the same layer thicknesses and the same material compositions in respective layers.

In some embodiments, at least one of the one or more superlattices is aperiodic meaning that one of more of the unit cells have a different structure. The differences can be in materials chosen for each of the layers, the thicknesses of the layers, the number of layers in each unit cell, or a combination thereof.

Each of the superlattices may have a different structure to achieve different electronic and optical properties. Thus, one superlattice could be periodic, while the others could be aperiodic. In addition, all of the superlattices in a stack 100 can be periodic, or all of the superlattices can be aperiodic. In yet another embodiment, one or more superlattices can be periodic, while one or more superlattices are aperiodic. For example, a superlattice in the buffer region 130 can be aperiodic to assist in lattice matching.

The p-type contact layer 170 also known as a hole injection layer is formed on top of the p-type active region of the one or more superlattices. A first contact layer 180 is formed on the p-type contact layer 170, such that the p-type contact layer 170 is formed between the first contact layer 180 and the p-type active region 160. In preferred embodiments, the first contact layer 180 is a metal contact layer. The p-type contact layer 170 aids an electrical ohmic contact between the p-type active region 160 and the first contact layer 180. In preferred embodiments, the p-type contact layer 170 is made from p-type GaN and has a thickness of between 5 nm and 200 nm, and preferably, between 10 nm and 25 nm. The thickness of the p-type contact layer 170 can be optimized to reduce the optical absorption at a specific optical wavelength and/or to make the p-type contact layer 170 optically reflective to an emission wavelength of the stack 100.

The first contact layer 180 enables the stack 100 to be connected to a positive terminal of a voltage source. In preferred embodiments, the first contact layer 180 has a thickness of between 10 nm and several 1000 nm, and preferably, between 50 nm and 500 nm.

A second contact layer (not shown) is formed on the n-type active region 140 to connect to a negative terminal of a voltage source. In preferred embodiments, the second contact layer has a thickness of between 10 nm and several 1000 nm, and preferably, between 50 nm and 500 nm.

The first contact layer 180 and the second contact layer may be made from any suitable metal. In preferred embodiments, the first contact layer 180 is made from a high work function metal to aid in the formation of a low ohmic contact between the p-type active region 160 and the first contact layer 180. If the work function of the first contact layer 180 is sufficiently high, then the optional p-type contact layer 170 may not be required. For example, if the substrate is transparent and insulating, the light emitted by the semiconductor structure is directed substantially out through the substrate and the p-type active region 160 is disposed further from the substrate than the n-type active region 140, then the first contact layer 180 should ideally have the property of high optical reflectance at the operating wavelength, so as to retroreflect a portion of the emitted light back through the substrate. For example, the first contact layer 180 can be made from metals selected from Aluminium (Al), Nickel (Ni), Osmium (Os), Platinum (Pt), Palladium (Pd), Iridium (Ir), and Tungsten (W). Especially, for deep ultraviolet (DUV) operation in which the stack 100 emits DUV light, the first contact layer 180 may not in general fulfil the dual specification of low p-type ohmic contact and high optical reflectance. High work function p-type contact metals for group III metal nitrides are generally poor DUV wavelength reflectors. Platinum (Pt), Iridium (Ir), Palladium (Pd) and Osmium (Os) are an ideal high work function p-type contact metals to high Al % group III metal nitride compositions and superlattices. In preference, Osmium is a superior low ohmic contact metal to p-type regions comprising group III metal nitrides.

However, for ultraviolet and DUV operation of the stack 100, aluminium is the most preferred of all metals, as it has the highest optical reflectance over a large wavelength range spanning from 150 to 500 nm. In general, metals are preferred as DUV optical reflectors due to the low penetration depth and low loss of light into the metal. This enables optical microcavity structures to be formed. Conversely, relatively low work function metals, such as Aluminium (Al), Titanium (Ti) and Titanium Nitride (TiN) can be utilized to form low ohmic metal contacts to n-type group III metal nitride compositions and superlattices.

It should be appreciated that the stack 100 shown in FIG. 1 is an exemplary stack for an optoelectronic device, and that the stack 100 may be made in many other ways. For example, the n-type active layer 140 and the p-type active layer 160 may be reversed such that the p-type layer 160 is grown first. However, a reason for growing the n-type active layer 140 first is that it is generally less challenging to grow a low defect density n-type superlattice using group III metal nitride compositions on a substrate or buffer layer than a p-type superlattice. It should also be noted that the buffer layer 120 and/or the buffer region 130 are optional layers, and the one or more superlattices can be grown directly on the substrate 110. However it is generally easier to grow the one or more superlattices on the buffer layer 120 and/or buffer region 130, as the surfaces of such layers/regions are generally oriented in the c-plane of the crystal.

In some embodiments, the buffer region and the adjacent p-type or n-type active region are part of the same superlattice with the only difference between the buffer region and the p-type or n-type active region being the incorporation of an impurity dopant in the p-type or n-type active region. In some embodiments, a first superlattice is grown upon the substrate with a sufficient thickness to render the superlattice in a substantially relaxed or free standing state with a low defect density and a preselected in-plane lattice constant.

In another embodiment, the stack 100 may be fabricated without an i-type active layer 150 such that the stack forms a p-n junction rather than the p-i-n junction of FIG. 1. Furthermore, it should be appreciated that p-type contact layer 170 is optional, and the first contact layer 180 may be grown directly on the p-type active region 160 of the one or more superlattices. However, it is more difficult to fabricate the first contact layer 180 directly on the p-type active region 160 using conventional ex-situ fabrication techniques. For example a thin but heavily doped p-type contact layer 170 enables easier and more consistent post epitaxial process for metallization to achieve an ohmic contact. However, an in-situ metallization process directly onto a final epitaxial surface of the p-type active region 160 that is free of contamination provides an alternate means for formation of the first contact layer 180.

In preferred embodiments, the one or more superlattices are grown sequentially during at least one deposition cycle. That is dopants are introduced during epitaxy via a process of co-deposition. An alternative method is to physically grow at least a portion of the one or more superlattices without a dopant and then, post-growth, introduce the desired dopant. For example, experiments have found that n-type group III metal nitride materials are typically superior in crystal structure quality to p-type group III metal nitride materials. Therefore, in some embodiments, p-type materials are deposited as the final sequence of the fabrication of the stack. A post growth method for incorporating dopant introduced from a surface can then be used. For example, ion-implantation, and diffusion (e.g., via a spin-on dopant) followed by activation thermal anneals.

The semiconductor structure 114 can be grown with a polar, non-polar or semi-polar crystal polarity oriented along the growth direction 101. For example, a wurtzite lattice structure can be grown which is oriented with the hexagonal symmetry of the c-plane being substantially perpendicular to the growth direction. The plane of so formed unit cell layers are then said to be oriented upon a c-plane. Ionic wurtzite crystals such as the group III metal nitrides, further form polar crystals (that is, crystals that lack a centre of inversion symmetry). These polar crystals can be metal-polar or nitrogen polar along a crystal direction perpendicular to the c-plane.

Other growth plane orientations can also be achieved resulting in semi-polar and even non-polar crystal growth along the growth direction 101. A semiconductor structure formed of group III metal nitrides in a non-polar orientation can be via growth of a cubic and/or zinc-blend lattice structure. However, when the semiconductor structure is formed with such lattice structures it is typically less stable than when the semiconductor structure is formed with a wurtzite lattice structure. For example, group III metal nitrides can be grown with a semi-polar crystal polarity on an r-plane sapphire substrate, resulting in one or more a-plane oriented superlattices.

Reducing the crystal polarity from a polar to a semi-polar crystal along a growth direction is advantageous for the reduction of the spontaneous and piezoelectric charges that are created at each and every heterojunction. While such semi-polar and non-polar crystal polarities have some advantages, it is found that the highest crystalline quality superlattices are formed using wurtzite crystal structures having a single crystal polarity oriented along a growth direction. The internal polarization charges can be managed advantageously by keeping the effective alloy content constant in each unit cell of the one or more superlattices. Once the average alloy content in any one unit cell or superlattice varies from another, a net polarization charge is accumulated. This can be used advantageously to control the band edge energy position in the one or more superlattices relative to the Fermi energy.

For example, a wurtzite lattice can have charge polarization at the interface between layers of the unit cells when the first layers and second layers are composed of GaN and AlN respectively. By using one or more superlattices for the n-type active region, the i-type active region and the p-type active region, varying the period to tune the optoelectronic device and keeping an average Al content in each unit cell constant, the charge polarisation at the interfaces in the optoelectronic stack 100 can be reduced.

In a further embodiment, a single superlattice structure is used for n-type active region 140, the i-type active region 150, and the p-type active region 160 and the superlattice is strained via biaxial and or uniaxial stresses to further affect the desired optical and/or electronic tuning.

In some embodiments, the n-type active region 140 comprises a total thickness from 50 to 5000 nm, or from 200 to 1000 nm, or from 300 to 500 nm, and a total number of unit cells 142 from 10 to 5000, or from 100 to 500, or from 150 to 350. The unit cells 142 contain two distinct substantially single crystal layers 142A and 142B, one of which can be a barrier (e.g., AlN) and one of which can be a well (e.g., GaN). The barriers (e.g., AlN) in the unit cells 142 can be from 1 to 20 monolayer (ML), or from 2 to 12 ML, or from 4 to 8 ML thick. The wells (e.g., GaN) in the unit cells 142 can be from 1 to 10 ML, or from 0.1 to 3 ML, or from 0.2 to 1.5 ML thick.

In some embodiments, the i-type active region 150 comprises a total thickness from 10 to 2000 nm, or from 10 to 100 nm, or from 40 to 60 nm, and a total number of unit cells 152 from 1 to 5000, or from 25 to 400, or from 10 to 100, or from 20 to 30. The unit cells 152 contain two distinct substantially single crystal layers 152A and 152B, one of which can be a barrier (e.g., AlN) and one of which can be a well (e.g., GaN). The barriers (e.g., AlN) in the unit cells 152 can be from 1 to 20 ML, or from 2 to 20 ML, or from 5 to 10 ML thick. The wells (e.g., GaN) in the unit cells 152 can be from 1 to 10 ML, or from 0.1 to 2 ML, or from 0.2 to 1.5 ML thick.

In some embodiments, the p-type active region 160 comprises a superlattice with an approximately constant average composition, and comprises a total thickness from 20 to 5000 nm, or from 10 to 100 nm, or from 30 to 50 nm, and a total number of unit cells 162 from 1 to 5000, or from 1 to 100, or from 1 to 10. The unit cells 162 can contain two distinct substantially single crystal layers 162A and 162B, one of which can be a barrier (e.g., AlN) and one of which can be a well (e.g., GaN). The barriers (e.g., AlN) in the unit cells 162 can be from 0 to 20 ML, or from 1 to 20 ML, or from 0 to 12 monolayers (ML), or from 4 to 8 ML thick. The wells (e.g., GaN) in the unit cells 162 can be from 1 to 10 ML, or from 0.5 to 6 ML, or from 0.2 to 1.5 ML thick. In some cases, the unit cells 162 can contain only one distinct substantially single crystal layer, which is a well (e.g., GaN), and can be from 100 to 300 ML, or from 100 to 200 ML thick.

In some embodiments, the p-type active region 160 comprises a superlattice with an average composition that changes through the thickness of the superlattice, and the p-type active region 160 comprises a total thickness from 10 to 100 nm, or from 10 to 30 nm, and a total number of unit cells 162 from 1 to 50, or from 1 to 20, or from 5 to 15. The unit cells 162 contain two distinct substantially single crystal layers 162A and 162B, one of which can be a barrier (e.g., AlN) and one of which can be a well (e.g., GaN). In the embodiments where the average composition changes through the thickness of the superlattice, the starting and ending thickness of the barriers and/or the wells in unit cells 162 can be different. In such cases, the starting thickness of the barriers (e.g., AlN) in the unit cells 162 can be from 2 to 8 monolayers (ML), or from 3 to 5 ML thick; the starting thickness of the wells (e.g., GaN) in the unit cells 162 can be from 0.0 to 2 ML, or from 0.2 to 0.3 ML thick; the ending thickness of the barriers (e.g., AlN) in the unit cells 162 can be from 0 to 8 monolayers (ML), or from 3 to 5 ML thick; and the ending thickness of the wells (e.g., GaN) in the unit cells 162 can be from 4 to 20 ML, or from 5 to 10 ML thick. Some of the preceding ranges contain layers with thicknesses of 0 ML. These cases describe situations where the starting and/or ending thickness of the barriers and/or wells is 0 ML, meaning that the unit cell at the start or the end of the superlattice contains only one layer, either a barrier or a well.

Figure 2:
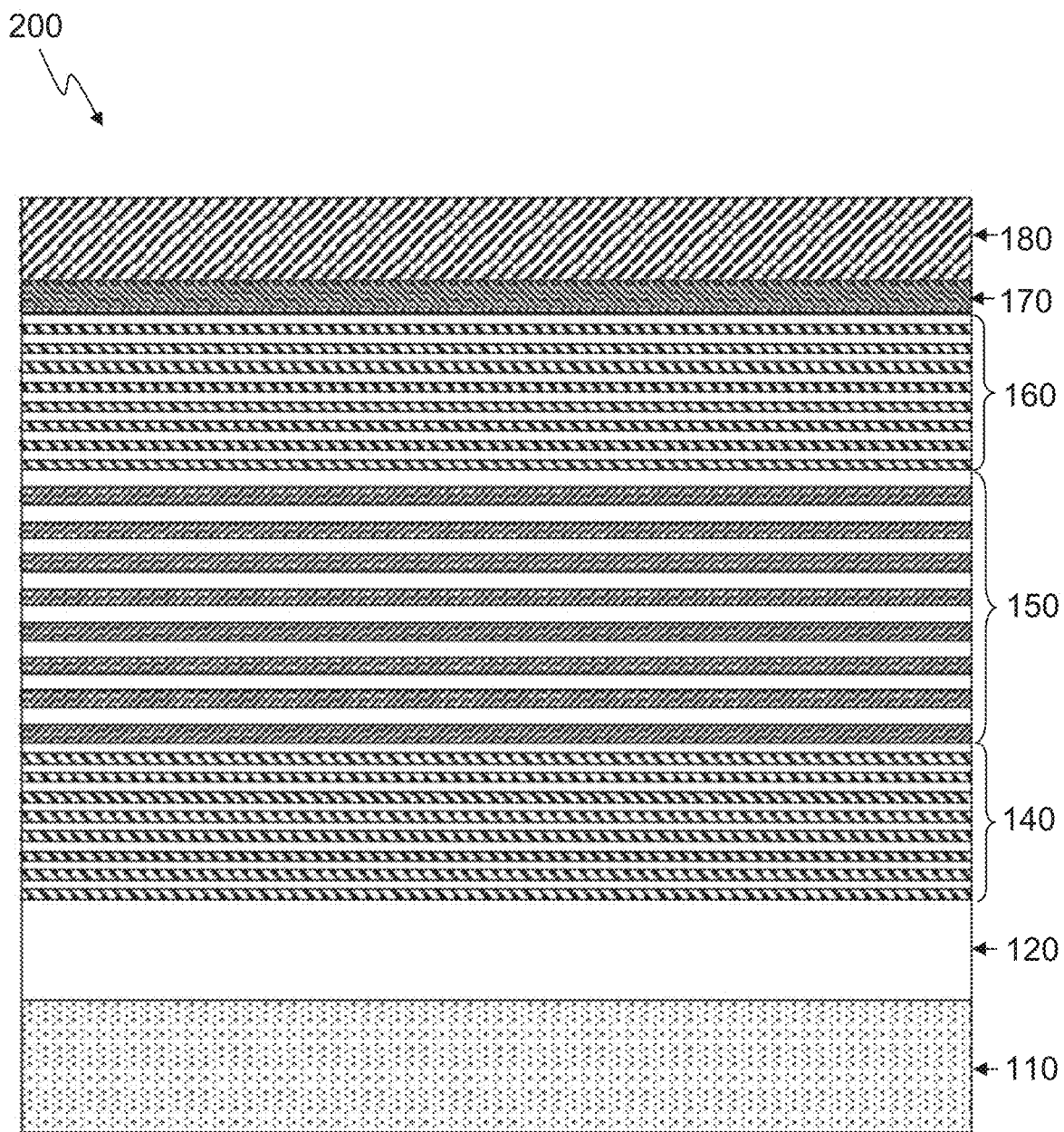
FIG. 2 is a diagram showing a sectional view of a stack for an optoelectronic device according to a second embodiment of the present invention.

FIG. 2 is a diagram showing a sectional view of a stack 200 for an optoelectronic device according to a second embodiment of the present invention. The stack 200 is similar to the stack 100 of FIG. 1 except that the buffer region 112 does not comprise the one or more superlattices 130.

Figure 3:
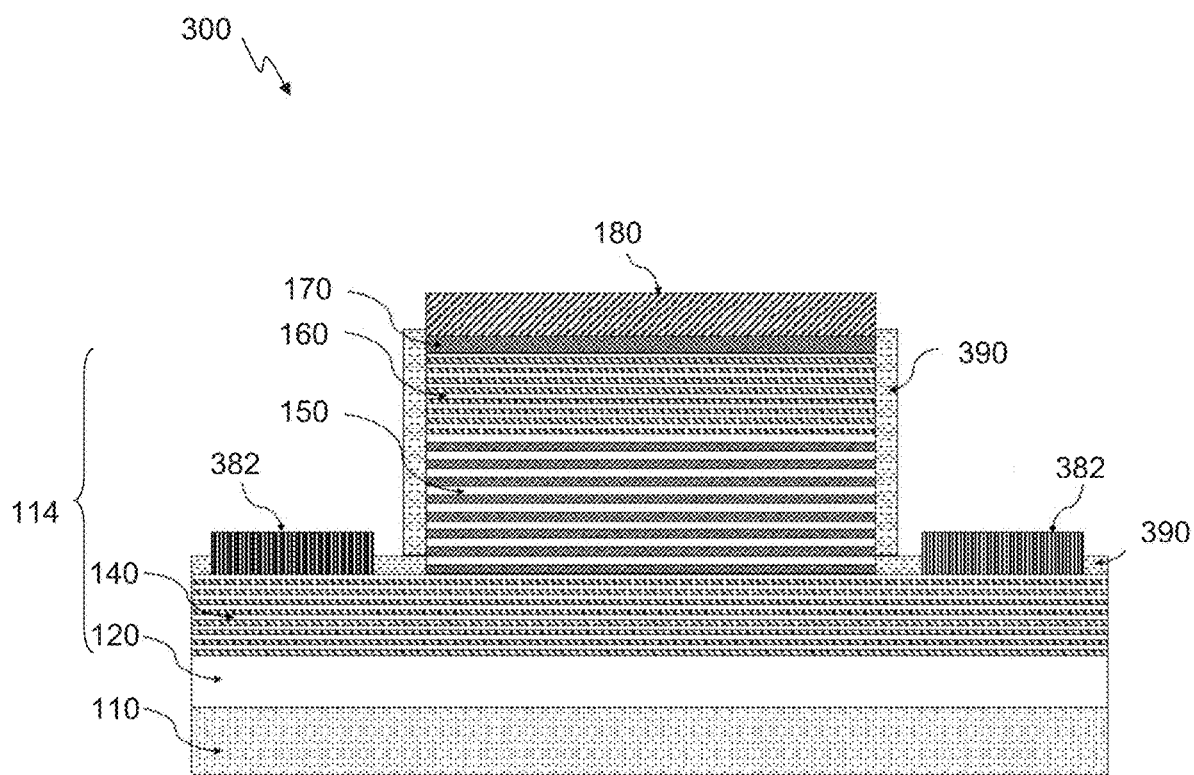
FIG. 3 is a diagram showing a sectional view of an optoelectronic device according to a third embodiment of the present invention.

FIG. 3 is a diagram showing a sectional view of an optoelectronic device 300 according to a third embodiment of the present invention. Similar to the stacks 100 and 200 of FIGS. 1 and 2, the optoelectronic device 300 comprises a substrate 110 on which a buffer layer 120 and a semiconductor structure 114 are formed. The semiconductor structure 114 comprises, in growth order, an n-type active region 140, an i-type active region 150 and a p-type active region 160. A p-type contact layer 170 is formed on the p-type active region 160 and a first contact layer 180 is formed on the p-type contact layer 170.

In the embodiment shown in FIG. 3, the i-type active region 150, the p-type active region 160, p-type contact layer 170 and the first contact layer 180 form a mesa on the n-type active region 140. The mesa shown in FIG. 3 has straight sidewalls. However, in alternative embodiments, the mesa can have angled side walls. The device 300 further comprises a second contact layer 382 formed on the n-type active region 140. In preferred embodiments, the second contact layer 382 forms a ring or loop around the mesa. The second contact layer 382 enables a negative terminal of a voltage source to be connected to the n-type active region 140. The device 300 further comprises a passivation layer 390 that covers the exposed or physically etched layers of the one or more superlattices. The passivation layer 390 is preferably made of a material having a wider band gap than the exposed or physically etched layers that it covers. The passivation layer 390 reduces current leakage between the layers of the one or more superlattices.

The device 300 can be operated as a vertically emissive device or a waveguide device. For example, in some embodiments, the optoelectronic device 300 can behave as a vertically emissive device with light out coupled from the interior of an electron-hole recombination region of the i-type active region 150 through the n-type active region 140 and the substrate 110. In preferred embodiments, light propagating upwards (in the growth direction) in the optoelectronic device 300 is also retroreflected, for example, from the first contact layer 180.

Figure 4:
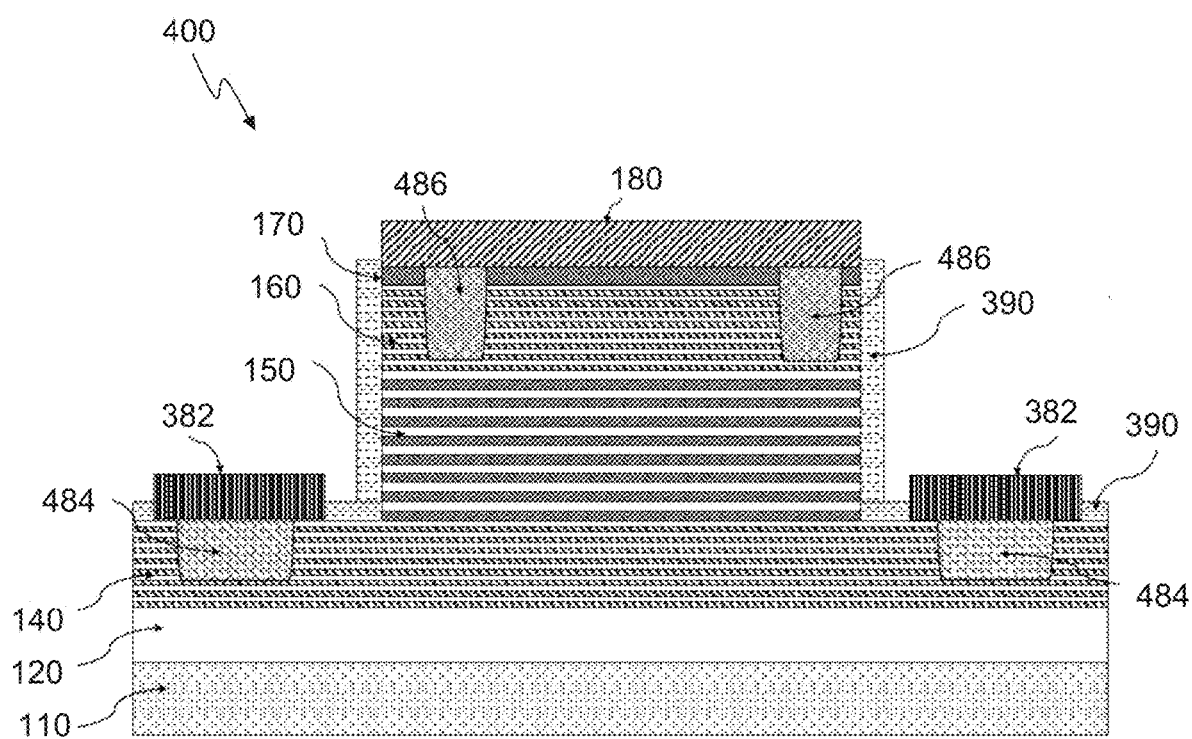
FIG. 4 is a diagram showing a sectional view of an optoelectronic device according to a fourth embodiment of the present invention.

FIG. 4 is a diagram showing a sectional view of an optoelectronic device 400 according to a fourth embodiment of the present invention. The optoelectronic device 400 is similar to the optoelectronic device 300 of FIG. 3. However, the optoelectronic device comprises a first lateral contact 486 and a second lateral contact 484.

The first lateral contact 486 extends partially into the p-type active region 160 from the first contact layer 180. In preferred embodiments, the first lateral contact 486 is an annular shaped protrusion extending from the first contact layer 180 into in the p-type active region 160 and (where applicable) the p-type contact layer 170. In some embodiments, the first lateral contact 486 is made from the same material as the first contact layer 180.

The second lateral contact 484 extends partially into the n-type active region 140 from the second contact layer 482 formed on a surface of the n-type active region 140. In preferred embodiments, the second lateral contact 484 is an annular shaped protrusion extending into in the n-type active region 140 from the second contact layer 382. In some embodiments, the second lateral contact 484 is made from the same material as the second contact layer 382 to improve electrical conduction between the n-type active region 140 and the second contact layer 382.

In preferred embodiments, the first lateral contact 486 and the second lateral contact 484 contact a plurality of narrower bandgap layers of the one or more superlattices in the semiconductor structure 114, and therefore couple efficiently for both vertical transport of charge carriers perpendicular to the plane of the layers and parallel transport of charge carriers parallel to the plane of the layers. In general, carrier transport in the plane of the layers achieves higher mobility than carrier transport perpendicular to the plane of the layers. However, efficient transport perpendicular to the plane of the layers is achieved by using thin wider bandgap layers to promote quantum mechanical tunnelling. For example, in a superlattice comprising alternating layers of AlN and GaN, it is found that electron tunnelling between adjacent allowed energy states in each GaN layer is enhanced when the interposing AlN layers have a thickness of less than or equal to 4 monolayers. Holes on the other hand, and in particular the heavy-holes, have a tendency to remain confined in their respective GaN layers and be effectively uncoupled by tunnelling through the AlN layers, which act as barriers, when the AlN layers have thicknesses of 2 monolayers or greater.

In preferred embodiments, the first lateral contact 486, and the second lateral contact 484 improve electrical conductivity between the first contact layer 180 and the p-type active region 160, and between the second contact layer 482 and the n-type active region 140, respectively, by making use of a superior in-plane carrier transport compared to a vertical transport across the layer band discontinuities of the superlattice. The second lateral contact 484 and the first lateral contact 486 can be formed using post growth patterning and production of 3D electrical impurity regions to discrete depths.

Figure 5:
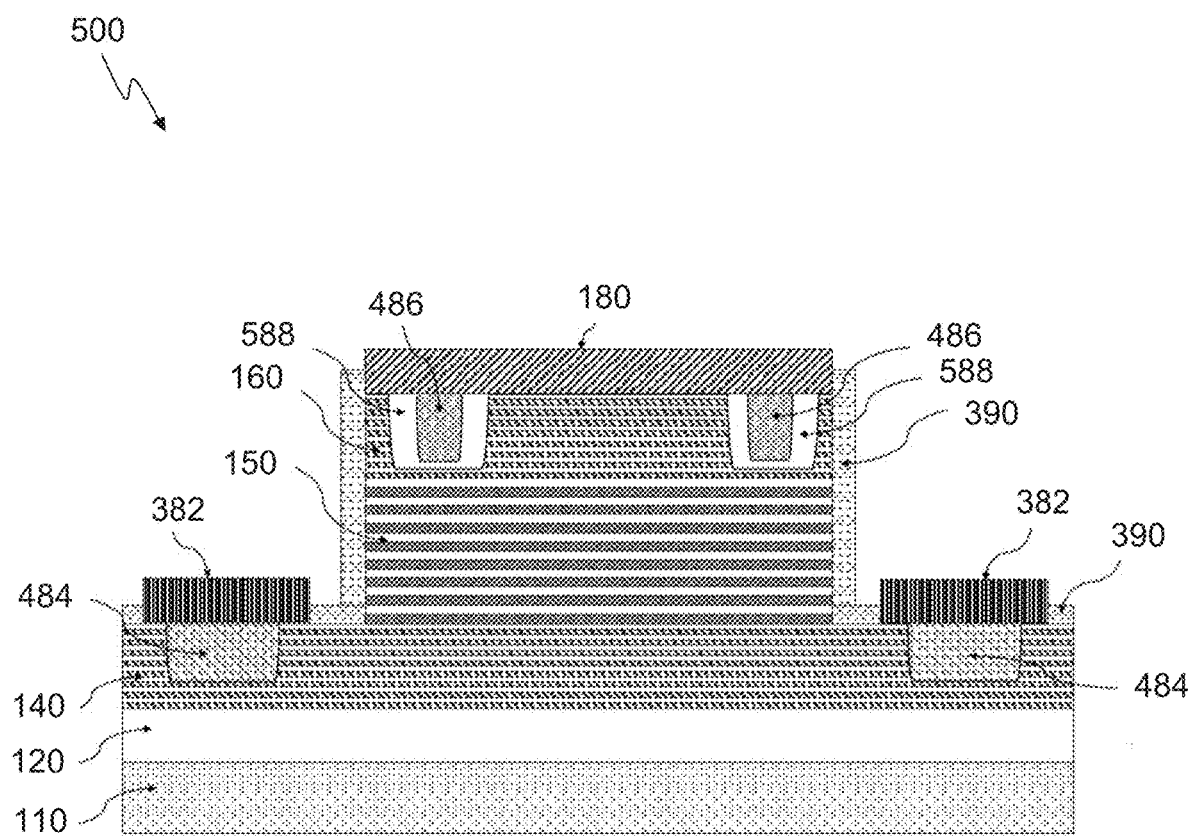
FIG. 5 is a diagram showing a sectional view of an optoelectronic device according to a fifth embodiment of the present invention.

FIG. 5 is a diagram showing a sectional view of an optoelectronic device 500 according to a fifth embodiment of the present invention. The optoelectronic device 500 is similar to the optoelectronic device 400 of FIG. 4, except that the optoelectronic device 500 does not include a p-type contact layer 170 and the first lateral contact 486 is surrounded by an enhancement layer 588, such as a layer of p-type GaN, between the first lateral contact 486 and the p-type active region 160. The enhancement layer 588 can improve an Ohmic connection between the p-type active region 160 and the first contact layer 180. The enhancement layer 588 can be created by selective area regrowth upon a patterned surface of the p-type active region 160.

Figure 6:
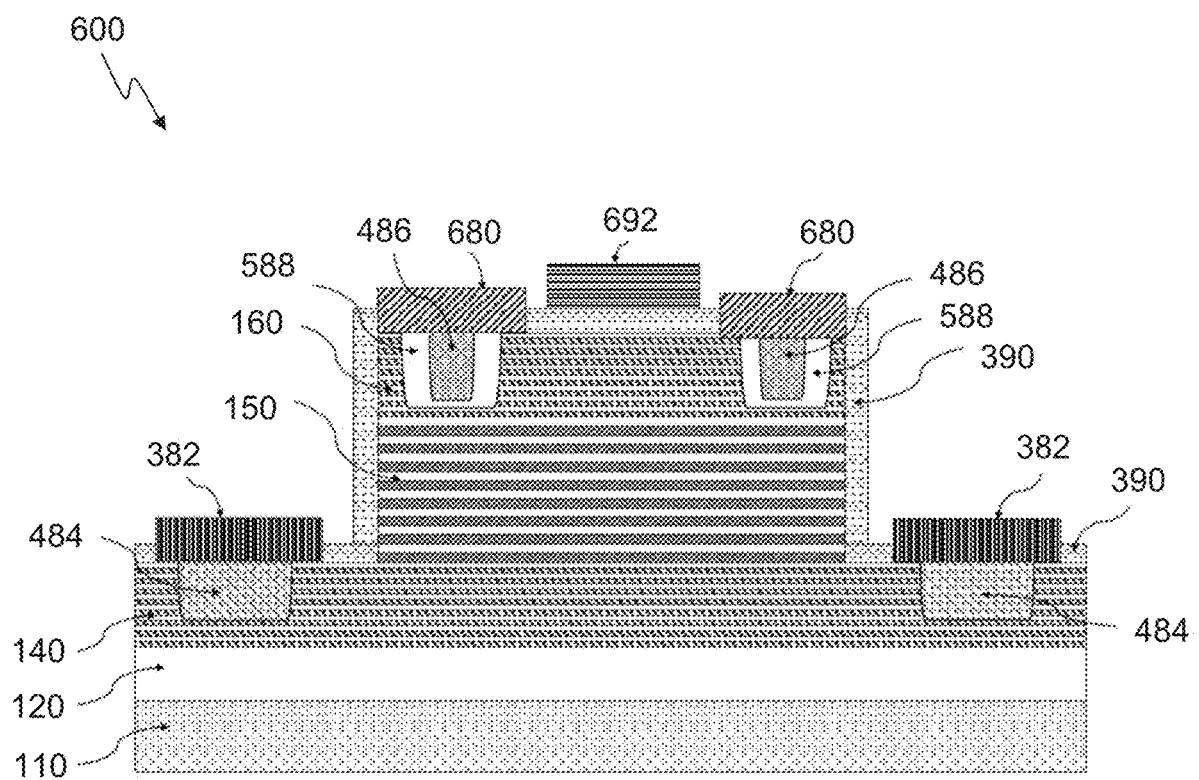
FIG. 6 is a diagram showing a sectional view of an optoelectronic device according to a sixth embodiment of the present invention.

FIG. 6 is diagram showing a sectional view of an optoelectronic device 600 according to a sixth embodiment of the present invention. The optoelectronic device 600 is similar to the optoelectronic device 500 of FIG. 5. However, the first contact layer 680 is annular shaped and a reflector layer 692 is provided to improve the out coupling of the optical energy generated within the semiconductor structure. The reflector layer 692 is positioned atop the optoelectronic device 600 to substantially retroreflect emitted light from the interior of the optoelectronic device 600.

In preferred embodiments, the passivation layer 390 is also provided within the annulus formed by the first contact layer 680, and the reflector 692 is formed atop of the passivation layer 390. In alternative embodiments, the reflector 692 may be formed on top of the p-type active region 160, or, if present, the p-type contact layer 170.

Figure 7:
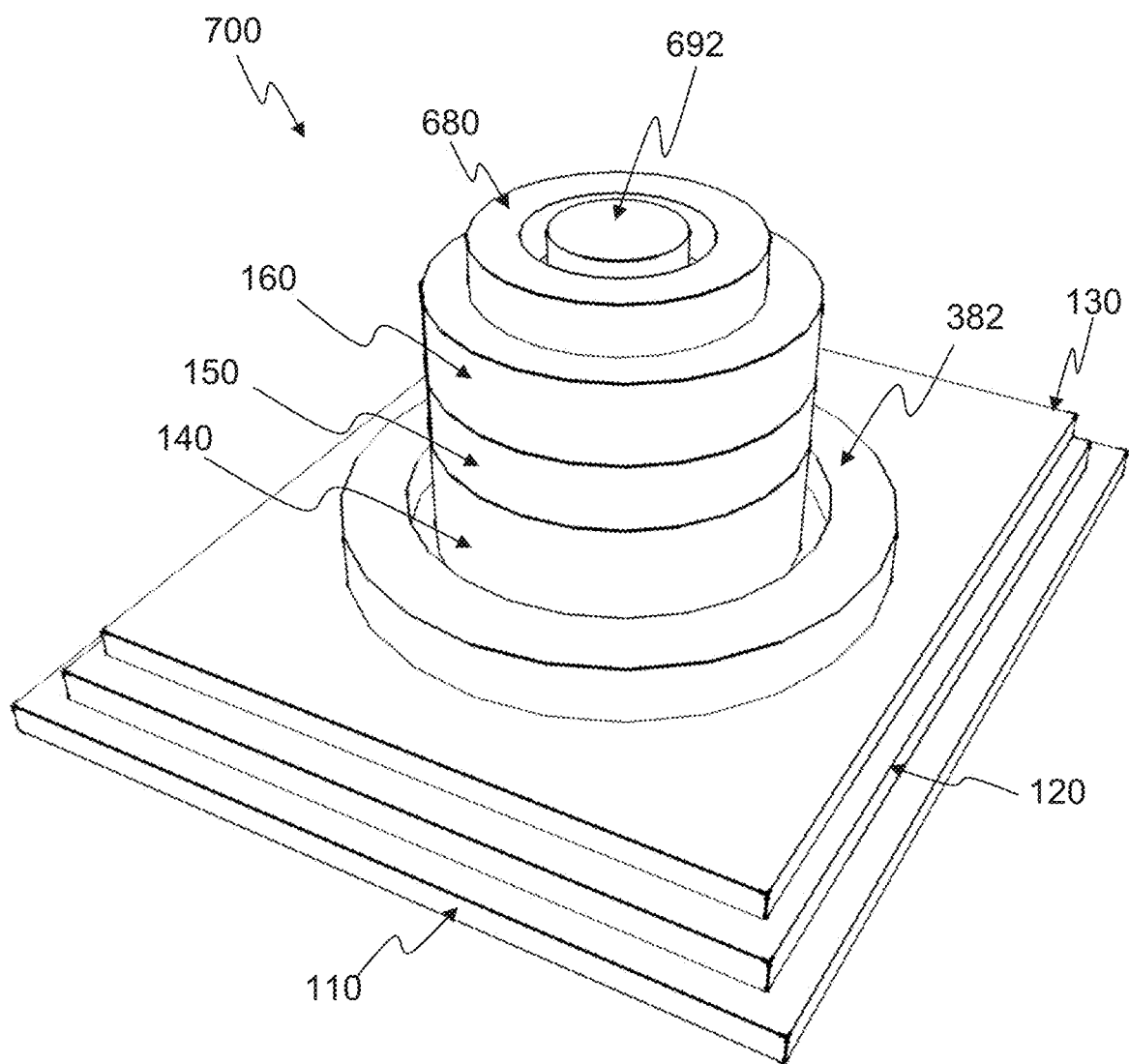
FIG. 7 is a diagram showing a perspective view of an optoelectronic device according to a seventh embodiment of the present invention.

FIG. 7 is a diagram showing a perspective view of an optoelectronic device 700 according to a seventh embodiment of the present invention. The optoelectronic device 700 is similar to the optoelectronic device 600 of FIG. 6. However, the optoelectronic device 700 comprises a buffer region 130 and the passivation layer 390 is not shown. The first contact layer 680 and the reflector layer 692 are shown above the p-type active region 160 on the mesa. The second contact layer 382 is formed on the buffer region 130 as a ring around the mesa.

Figure 8:
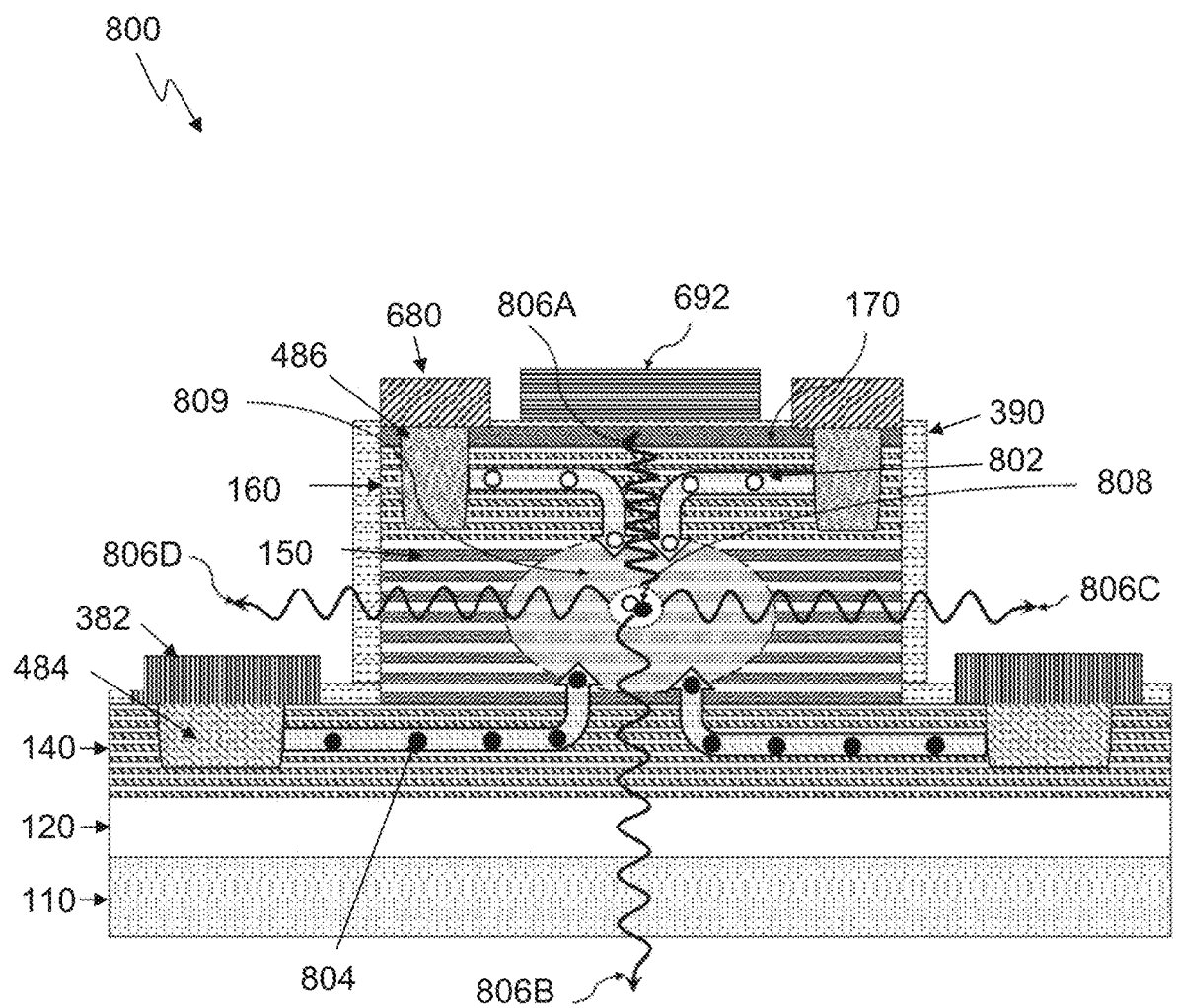
FIG. 8 is a diagram showing a sectional view of certain optical and electronic activity within an optoelectronic device according to an eighth embodiment of the present invention.

FIG. 8 is a diagram showing a sectional view of an optoelectronic device 800 according to an eighth embodiment of the present invention. The optoelectronic device 800 is similar to the optoelectronic device 600 of FIG. 6. However, the optoelectronic device does not comprise the enhancement layer 588.

As shown in FIG. 8, upon application of an external voltage and current source between the first contact layer 680 and the second contact layer 382, holes 802 are injected into the p-type active region and combine, for example at point 808, with electrons 804 generated in the n-type active region 140. The injected electrons 804 and holes 802 recombine advantageously in the electron-hole recombination (EHR) region 809 that is substantially confined spatially within the i-type active region 150. The EHR region 809 generates photons via electron-hole recombination with an energy and optical polarization of the photons dictated by the energy-momentum band structure of the one or more superlattices. As illustrated in FIG. 8, the EHR emits photons 806A, 806B, 806C, 806D, in directions that can be classified as substantially in the plane of the layers or vertically parallel to the growth direction. Light can also propagate in other directions and can propagate in a non-trivial way within the structure. In general, light generated with a propagation vector that is substantially vertical and within an escape cone (determined by the angle of total internal reflection and thus the refractive index of the material) will be the major source of photons that can be out coupled vertically through the transparent substrate 110. Photons 806A are emitted in a generally vertical direction and in the same direction as the growth direction 101 shown in FIG. 1. Photons 806B are emitted in a generally vertical direction and in an opposite direction to the growth direction 101. Photons 806C, 806D are emitted in a generally horizontal direction, parallel to the layers of the device, for example, parallel to the plane of the layers of the i-type active region 150.

In the embodiment shown in FIG. 8, some of the photons 806A are reflected off the optical reflector 692 and exit the light emitting device 800 through the substrate 110. It should be appreciated that with the addition of suitable mirrors (not shown) or an advantageous optical cavity and refractive index discontinuity between the substrate and i-type active region the device may therefore be modified to produce a microcavity LED or laser or a superluminescent LED. Superluminescence is found to improve the extraction efficiency of light by limiting the number of optical modes available for the generated light to couple into. This effective optical phase space compression improves selectivity of the device for advantageous vertical emission. An optical cavity can be formed using the total optical thickness formed by the buffer layer 120, the n-type active region 140, the i-type active region 150 and the p-type active region 160. If the optical cavity is formed between the reflector 692 and the substrate 110 and the thickness of the optical cavity along the growth direction is less than or equal to one wavelength of the emission wavelength, then the cavity is a microcavity. Such a microcavity possesses the properties necessary to create superluminescence and stable wavelength operation imposed by the optical cavity mode wavelength. In some embodiments of the present invention, an emission wavelength from the EHR region 809 is equal to the lowest order wavelength cavity mode of the microcavity and superluminescence is achieved. A second optical reflector can also be included within the buffer region 112. For example, a reflector comprising a superlattice having unit cells comprising elemental Al and AlN layers termed herein a metal-dielectric superlattice.

In some embodiments, a transparent region is provided adjacent to the buffer layer 120 and the substrate 110, and the buffer layer 120 is transparent to optical energy emitted from the device. The optical energy is coupled externally through the transparent region, the buffer layer 120 and the substrate 110. Photons 806C, 806D are emitted in a generally horizontal direction, parallel to the layers of the device, for example, parallel to the plane of the layers of the p-type active region 160.

In some embodiments, the optoelectronic device emits light having a substantially transverse magnetic optical polarization with respect to the growth direction. The optoelectronic device operates as an optical waveguide with light spatially generated and confined along a direction substantially parallel to the plane of the one or more layers of the unit cells of the one or more superlattices of the semiconductor structure.

Figure 9:
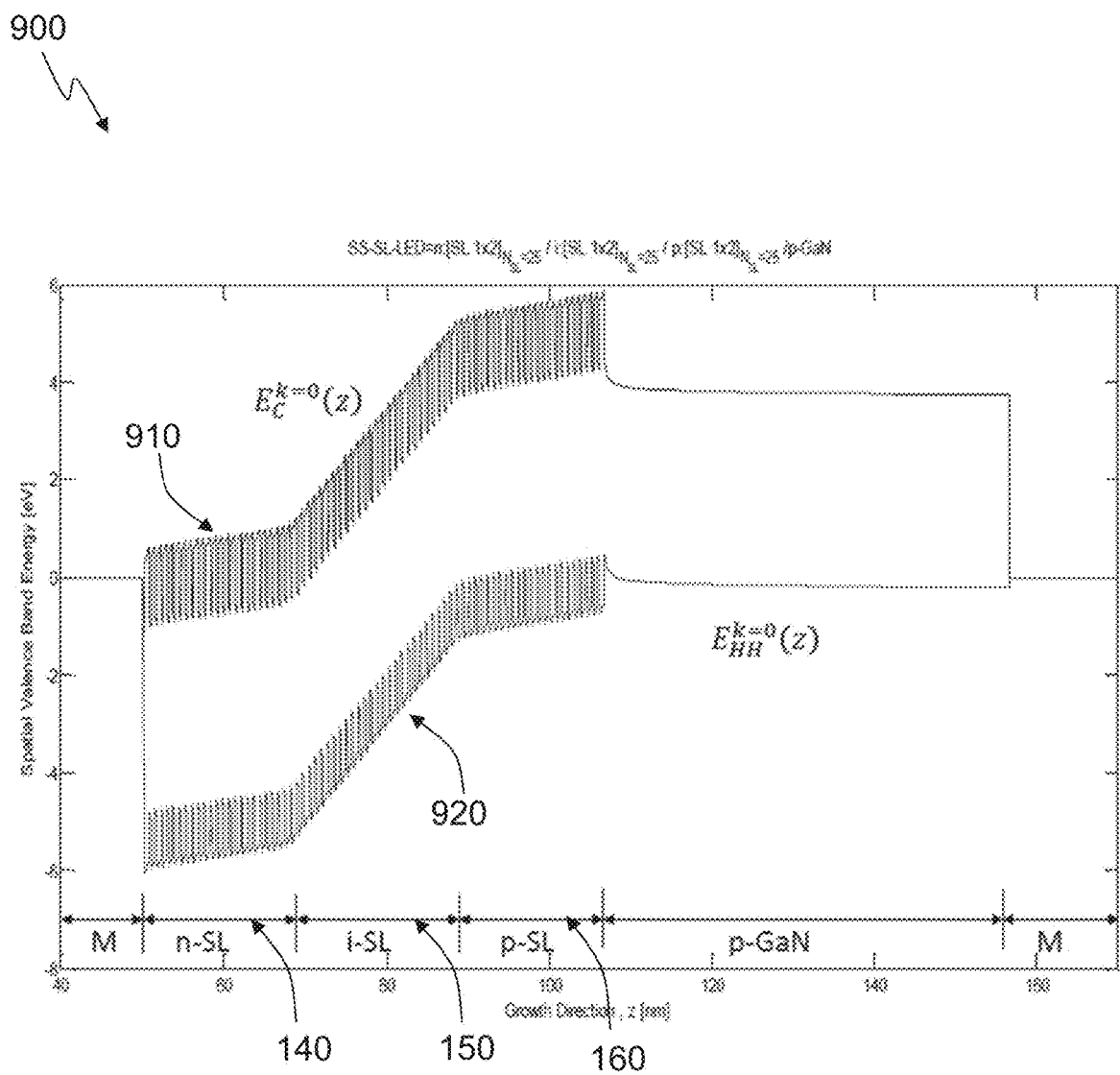
FIG. 9 is a graph of spatial energy levels in the conduction band and the valence band with respect to a distance along the growth direction z for an optoelectronic device, according to an embodiment of the present invention, wherein unit cells in the p-type, i-type and n-type active regions comprise 1 monolayer of GaN and 2 monolayers of AlN.

In some embodiments, the optoelectronic device emits light having a substantially transverse electric optical polarization with respect to the growth direction. The optoelectronic device operates as a vertically emitting cavity device with light spatially generated and confined along a direction substantially perpendicular to the plane of the one or more layers of the unit cells of the one or more superlattices of the semiconductor structure. The vertically emitting cavity device has a vertical cavity disposed substantially along the growth direction and formed using metallic reflectors spatially disposed along one or more portions of the semiconductor structure. The reflectors can be made from a high optical reflectance metal. The cavity is defined by the optical length between the reflectors being less than or equal to a wavelength of the light emitted by the device. The emission wavelength of the optoelectronic device is determined by the optical emission energy of the one or more superlattices comprising the semiconductor structure and optical cavity modes determined by the vertical cavity FIG. 9 is a graph 900 of spatial energy levels in the conduction band and the valence band with respect to a distance along the growth direction z for an optoelectronic device, according to an embodiment of the present invention. In this embodiment, a single superlattice comprises the n-type active region 140, the i-type active region 150 and the p-type active region 160 of the optoelectronic device. Each unit cell of the superlattice comprises a first layer formed of two monolayers of AlN and a second layer formed of one monolayer of GaN. The superlattice comprises 25 unit cells in each of the n-type active region 140, the i-type active region 150 and the p-type active region 160. The superlattice is deposited on a c-plane with a metal-polar crystal growth oriented parallel to the growth direction. A p-type contact layer made of p-GaN is deposited on the p-type active region 160. A first contact layer made of an idealized ohmic metal M is located on the p-GaN contact layer and a second contact layer made of an idealized ohmic metal M is located on the n-type active region 140.

The y-axis of FIG. 9 is the energy level in eV relative to the Fermi energy, and the x-axis is the distance in nanometres (nm) along the growth direction 101 from the base of the substrate. The positions of the n-type active region 140, the i-type active region 150 and the p-type active region 160 and other regions/layers of the device are shown above the x-axis. Trace 910 is the zone centre (i.e., k=0) energy in the conduction band; the troughs are due to GaN, and the peaks are due to AlN. Graph 900 shows in trace 910 that the conduction band energy $E_c^{k=0}(z)$ is close to the Fermi energy in the n-type active region 140 with the troughs of the conduction band energy $E_c^{k=0}(z)$ below the Fermi energy. This provides a highly activated n-type active region. Trace 920 is energy in the valence band; the troughs are due to AlN, and peaks are due to GaN. Graph 900 shows in trace 920 that the valence band energy $E_{HH}^{k=0}(z)$ is close to the Fermi energy in the p-type active region 160 with the peaks of the valence band energy $E_{HH}^{k=0}(z)$ above the Fermi energy. This provides a highly activated p-type active region. The metal polar oriented growth results in the pyroelectric and piezoelectric charges at each AlN/GaN and GaN/AlN heterojunction.

Figure 10:
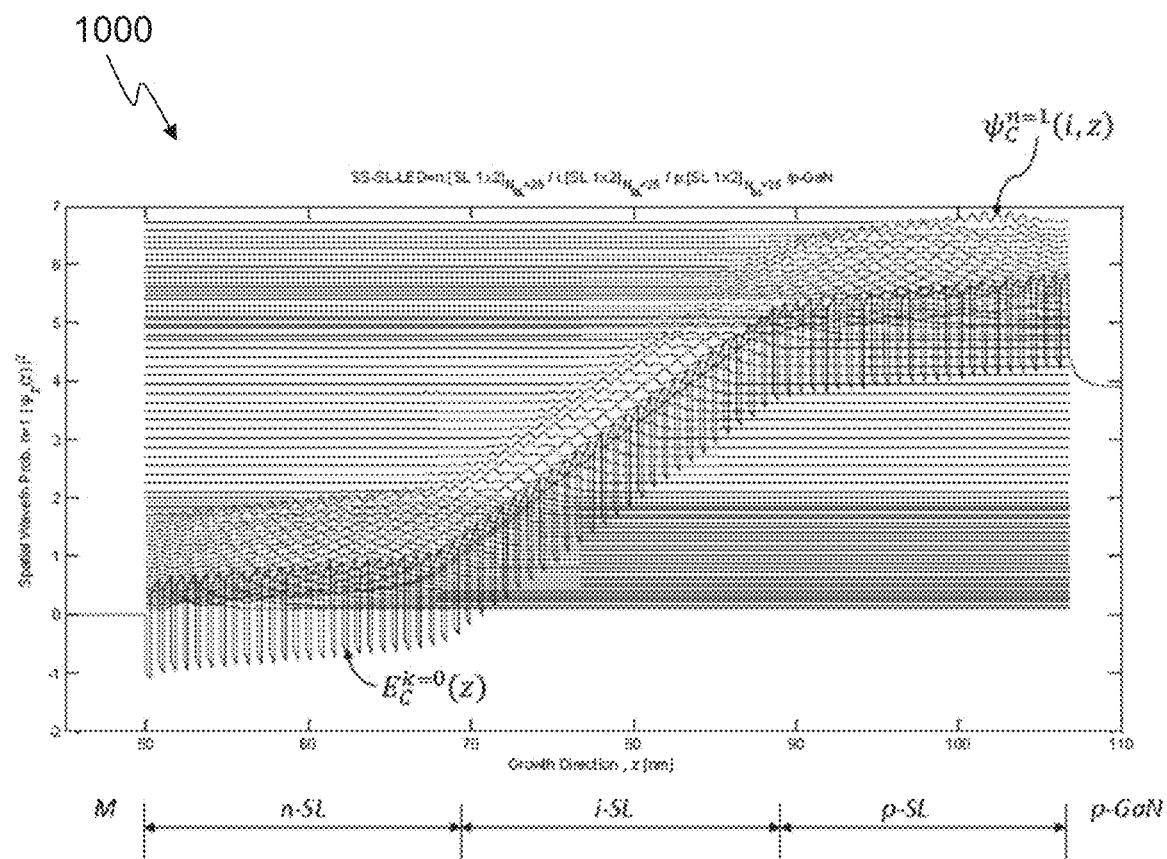
FIG. 10 is a graph showing the quantized lowest energy electron spatial wavefunctions with respect to a distance z along the growth direction for the optoelectronic device described with reference to FIG. 9.

A spatial wavefunction is a probability amplitude in quantum mechanics that describes the quantum state of a particle and how it behaves. FIG. 10 is a graph 1000 showing the quantized lowest energy electron spatial wavefunctions $\Psi_c^{n=1}(i,z)$ with respect to a distance z along the growth direction for the optoelectronic device described with reference to FIG. 9. The index i represents the distinct wavefunctions. Each quantized wavefunction is plotted at the corresponding allowed quantized eigenenergy within the energy band structure. A non-zero wavefunction probability above the respective quantized energy level indicates a finite probability of localizing an electron in the associated spatial region. The conduction band edge energy $E_c^{k=0}(z)$ is shown for reference.

It is evident from graph 1000 that the electron wavefunctions are delocalized over a large number of unit cells. This is indicative of high coupled GaN potential wells. The thin AlN barriers (2 monolayers) allow efficient quantum mechanical tunnelling and thus form energy manifolds spatially confined within the n-type and p-type active regions. An electron injected into the n-type active region would be efficiently transported along the growth direction toward the i-type active region. The allowed lowest energy wavefunctions within the i-type active region are more confined than within the n-type or p-type active regions, as is evidenced by the more localized wavefunctions in the i-type active region. The small thickness of the unit cells forces the quantized energy levels to be relatively close to the AlN conduction band edge and thus under the influence of a large depletion electric field generated across the i-type active region breaks the coupling between adjacent neighbouring GaN potential minima. As a result the electron wavefunctions in the i-type active region are not strongly confined to their respective GaN potential minima.

Figure 11:
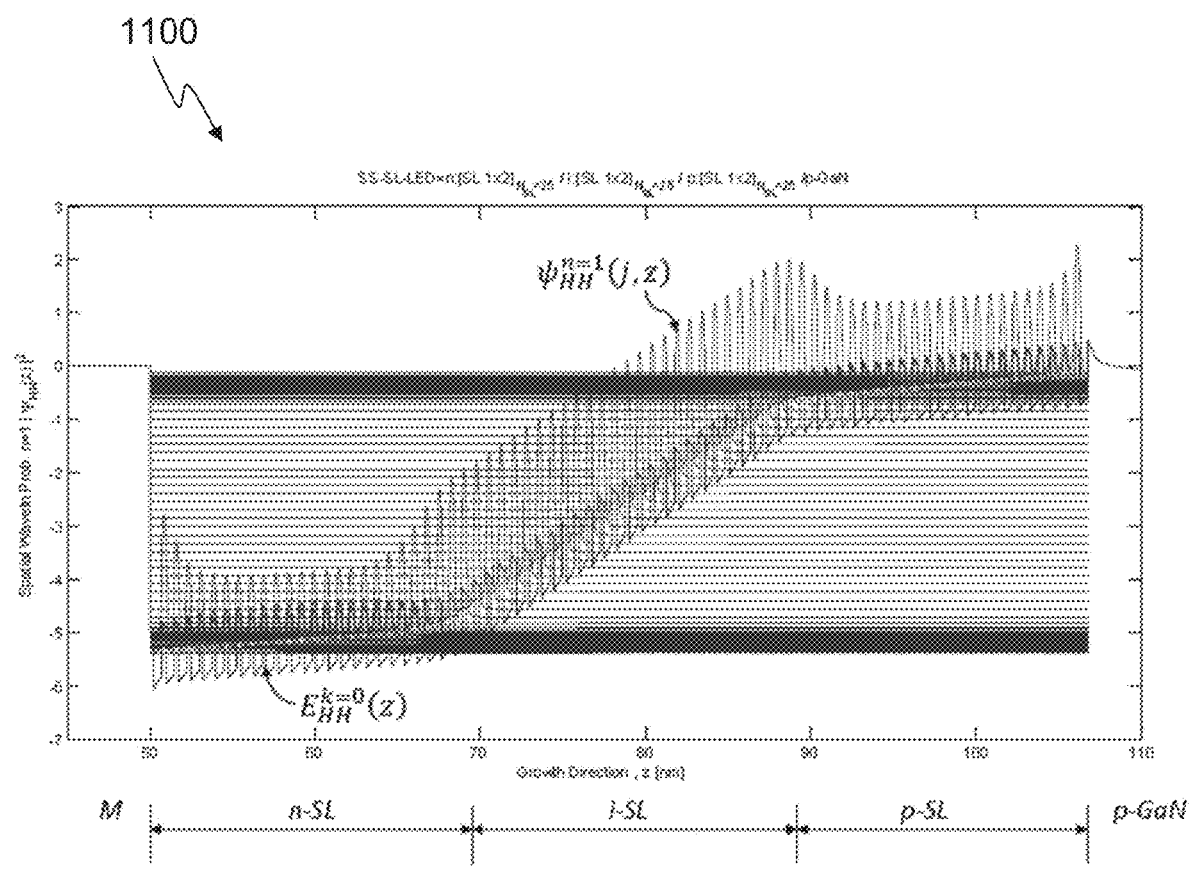
FIG. 11 is a graph showing the quantized lowest energy heavy hole spatial wavefunctions with respect to a distance along the growth direction for the optoelectronic device described with reference to FIG. 9.

FIG. 11 is a graph 1100 showing the quantized lowest energy heavy hole spatial wavefunctions $\Psi_{HH}^{n=1}(j,z)$ with respect to a distance along the growth direction for the optoelectronic device described with reference to FIG. 9. The heavy hole zone centre valence band energy $E_{HH}^{k=0}(z)$ is shown for reference. The group III metal nitride materials have a unique valence band structure comprising an energy momentum dispersion that has three distinct bands, namely, the heavy-hole (HH), light-hole (LH) and crystal field split (CF) bands. At zone centre, the superlattice has the heavy-hole band which is the lowest energy of the three, that is, $E_{HH}^{k=0} < E_{LH}^{k=0}$. For optical processes of interest herein it is sufficient to describe the HH band only. In the graph 1100, it is evident that there is substantial spatial delocalization of heavy-hole wavefunctions $\Psi_{HH}^{n=1}(j,z)$ within the p-type active region, whereas they are tightly confined to the GaN potential minima within the i-type active region. Again the built-in depletion electric field within the device breaks the coupling within the i-type active region.

Figure 12:
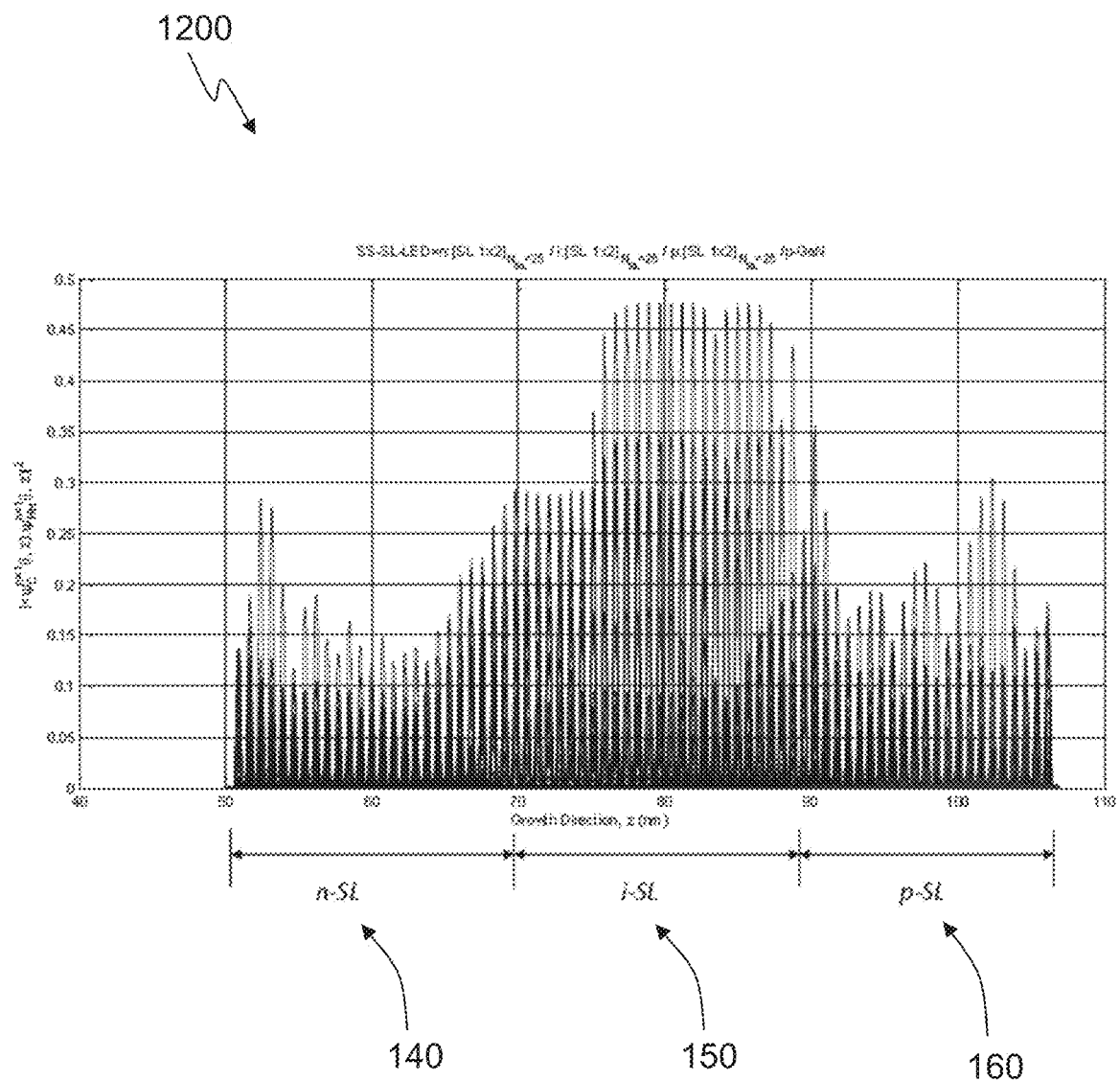
FIG. 12 is a graph showing the spatial overlap integral of each quantized electron spatial wavefunction of FIG. 10 and the quantized heavy hole spatial wavefunction of FIG. 11 with respect to a distance along the growth direction.

FIG. 12 is a graph 1200 showing the spatial overlap integral of the conduction and HH wavefunctions. The overlap integral is essentially the product of the electron spatial wavefunctions $\Psi_c^{n=1}(i,z)$ of FIG. 10 with each of the heavy hole spatial wavefunctions $\Psi_{HH}^{n=1}(j,z)$ of FIG. 11 with respect to a distance along the growth direction for the optoelectronic device described with reference to FIG. 9. It can be seen from graph 1200 that the probability that an electron and a hole are present at the same location is higher in the i-type active region 150 than the n-type active region 140 and the p-type active region 160. Hence emission is more likely to occur from the i-type active region 150 than the n-type active region 140 and the p-type active region 160 of the optoelectronic device.

Figure 13:
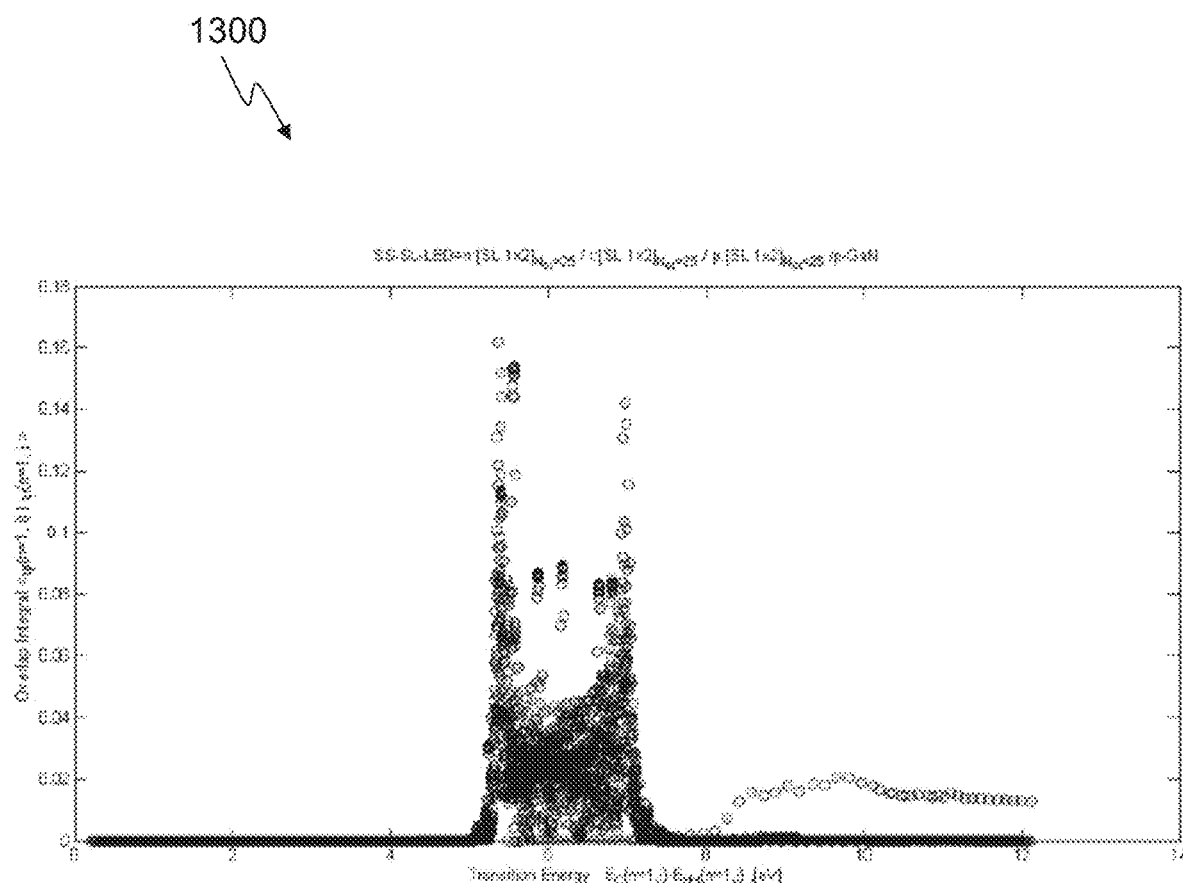
FIG. 13 is a graph showing the spatial overlap integral of each quantized electron spatial wavefunction of FIG. 10 and the quantized heavy hole spatial wavefunction of FIG. 11 with respect to a combined transition energy of the corresponding electrons and holes.

FIG. 13 is a graph 1300 showing the overlap integral of the electron spatial wavefunctions $\Psi_c^{n=1}(i,z)$ and the heavy hole spatial wavefunctions $\Psi_{HH}^{n=1}(j,z)$ with respect to a combined transition energy between the corresponding electron and hole quantized energy levels for the optoelectronic device described with reference to FIG. 9. The discrete plot of FIG. 13 shows the energy spectrum of allowed optical transitions between the lowest n=1 quantized electron states and the n=1 HH states within the entire semiconductor structure. The graph 1300 therefore shows the device is capable of emitting with a lowest energy optical emission of about 5.3 eV. The width of the emission spectrum in FIG. 13 is indicative of the miniband widths of quantized energy levels throughout the device.

Figure 14:
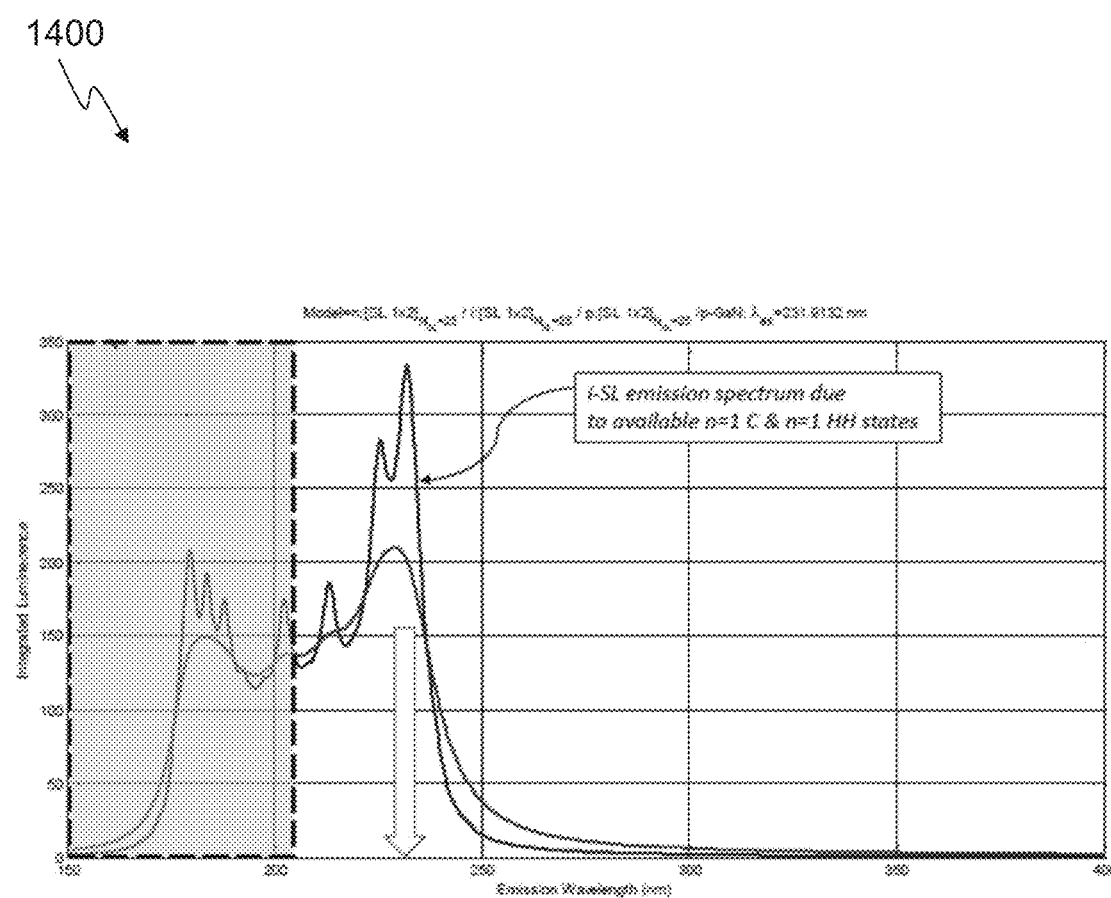
FIG. 14 is a graph showing an emitted luminance versus wavelength for the optoelectronic device described with reference to FIG. 9.

FIG. 14 is a graph 1400 showing an emitted luminance versus wavelength for the optoelectronic device described with reference to FIG. 9. The discrete overlap integrals of FIG. 13 are homogeneously broadened in energy to simulate thermal variations anticipated at room temperature. The sum of individual oscillator strength contributions are plotted as a function of wavelength for two choices of broadening parameters. The longest wavelength and sharpest transition is attributed to the lowest energy heavy-hole exciton experimentally observable. As shown in FIG. 14, the wavelength of maximum intensity is at approximately 230 nm corresponding to the lowest energy transition between the n=1 quantized electron and hole wavefunctions. Reference to FIG. 12 indicates that a substantial portion of the light generated will be from a region near the i-type active region and p-type active region interface. The shaded region of FIG. 14 shows the spectral region populated by the p-type and n-type active regions which will have states occupied and thus not available for optical recombination process. Furthermore, the actual emission energy is due to the lowest order exciton annihilation. An exciton is an intermediate particle comprising a bound electron-hole pair that is spatially confined to enhance the electrostatic binding energy. The n=1 exciton binding energy ($Ex^{n=1}$) in an AlN/GaN superlattice is of the order of 50-60 meV and is due to the electrostatic attraction of the n=1 electron and n=1 HH wavefunctions. In general, the emission energy of a photon, emitted from the n=1 exciton $E_\gamma^{n=1}$, is given by $E_\gamma^{n=1} = E_C^{n=1} - E_{HH}^{n=1} - E_X^{n=1}$, where the exciton binding energy reduces the observed emission energy.

Figure 15:
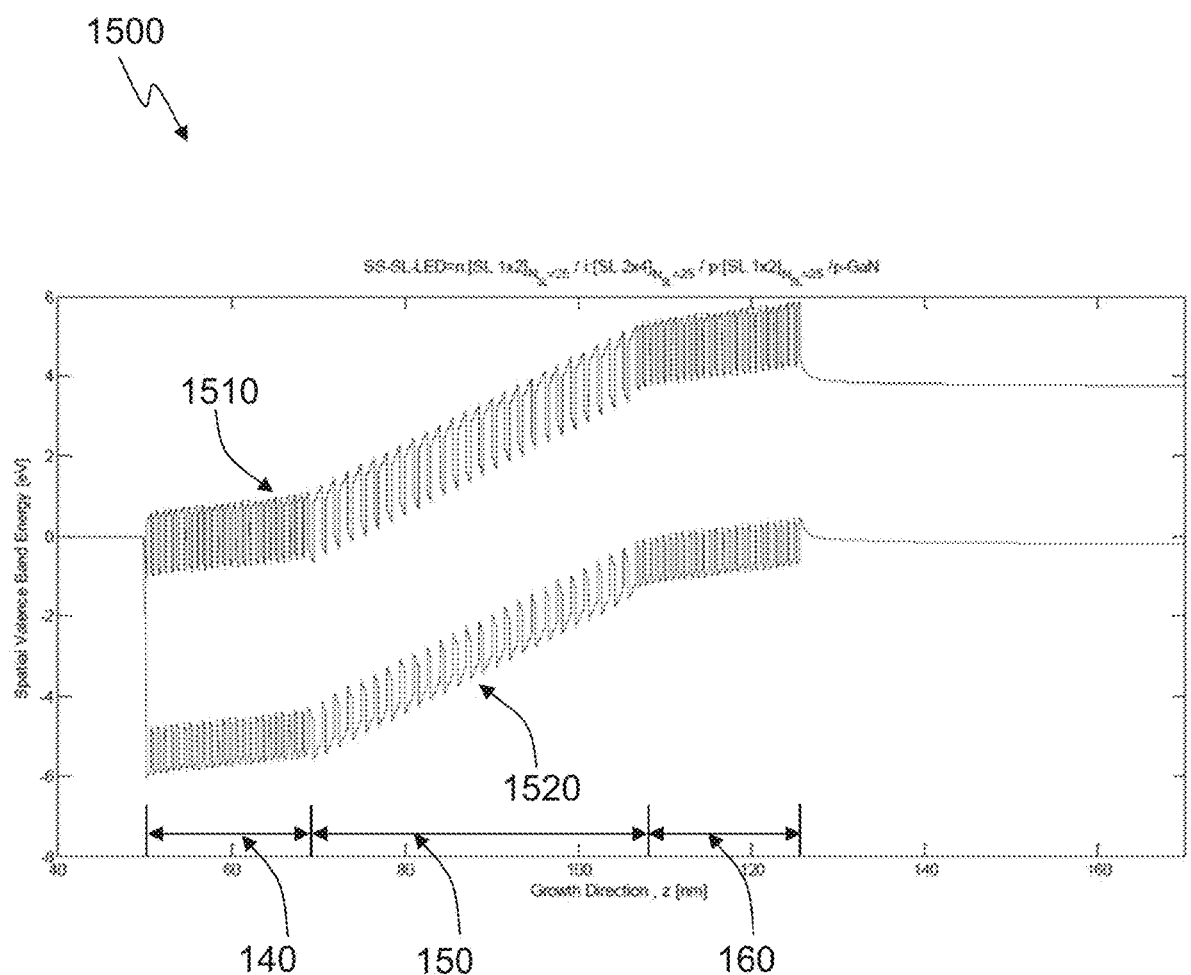
FIG. 15 is a graph of spatial energy levels in the conduction band and the valence band with respect to a distance along the growth direction z for an optoelectronic device, according to an embodiment of the present invention, wherein unit cells in the p-type and n-type active regions comprise 1 monolayer of GaN and 2 monolayers of AlN, and the unit cells in the i-type active region comprise 2 monolayers of GaN and 4 monolayers of AlN.

FIG. 15 is a graph 1500 of spatial energy levels in the conduction band and the valence band with respect to a distance along the growth direction z for an optoelectronic device, according to another embodiment of the present invention. In this embodiment, superlattice forming the n-type active region 140 and the p-type active region 160 of the device are the same as for the optoelectronic device of FIG. 9. However, in the i-type active region 150 the first layer in each unit cell is formed of 4 monolayers of AlN and the second layer in each unit cell is formed of 2 monolayers of GaN. The p-type and n-type regions are formed using impurity doped superlattices with a first layer formed of 2 monolayers of AlN and a second layer formed of 1 monolayer of GaN. The doped regions are therefore transparent to the n=1 exciton formed in the intrinsic region. While the period or thickness of the unit cells changes between the n-type and p-type active regions and the i-type active region, the unit cells in each region have the same average alloy content. That is, the Al fraction in the unit cells is constant. There are 25 repetitions of the unit cell in each region. It is found that a higher number of unit cell repetitions can also be used. The average alloy content of a simple unit cell comprising two compositions, such as, a GaN layer of thickness $t_{GaN}$ and AlN layer of thickness $t_{AlN}$, is given by $x_{ave}=t_{AlN}/(t_{AlN}+t_{GaN})$, where the $x_{ave}$ represents the effective Al fraction of the pair in the unit cell. In alternative embodiments, the unit cells can comprise three or more AlGaN compositions and in such embodiments the effective alloy content can be similarly determined. The average alloy content of other layer compositions comprising binary, ternary and quaternary materials can be defined according to one or more elemental constituents. For example, the Al fraction in a tri-layered unit cell comprising the triple layers of $AlN/Al_xGa_{1-x}N/GaN$ or $AlN/Al_xGa_{1-x}N/Al_yIn_zGa_{1-y-z}N$ can be determined. An optional p-type GaN Ohmic contact layer is included on the p-type active region. Ohmic metal contacts provided on the n-type active region and the optional p-type GaN Ohmic contact layer. The energy band structure is shown with zero external electrical bias applied between the Ohmic metal contacts.

The y-axis of FIG. 15 is the energy level in eV relative to the Fermi energy, and the x-axis is distance in nanometres (nm) along the growth direction from the base of the substrate. The positions of the n-type active region 140, the i-type active region 150 and the p-type active region 160 of the device are shown above the x-axis. Trace 1510 is energy in the conduction band; the troughs are due to GaN, and the peaks are due to AlN. The AlN layer and GaN layer in the unit cells forms a type-I superlattice, wherein the GaN conduction band is lower in energy than the AlN conduction band edge and the GaN valence band is higher in energy than the AlN valence band edge. That is, the AlN layer presents a potential barrier for both electrons and holes in the GaN layer. Trace 1520 is energy in the valence band; the troughs are due to AlN, and peaks are due to GaN. In particular, the heavy-hole valence band edge is shown. FIG. 15 shows that the period and amplitude of the peaks and troughs in traces 1510 and 1520 has increased in the i-type active region 150. The larger layer thicknesses of both the GaN and AlN layers in the unit cells in the i-type active region generates a larger built-in electric field across each due to the spontaneous and piezoelectric fields of the metal-polar heterointerfaces. This effect is particularly unique to polar wurtzite crystals. Again, the device of FIG. 15 is contacted by ideal metal contacts M and a p-GaN contact layer connects the p-type active region 160 to one of the metal contacts. Flat band conditions are shown, that is, zero external applied bias between both contacts, and thus the Fermi energy is continuous throughout the structure along the growth direction.

Figure 16:
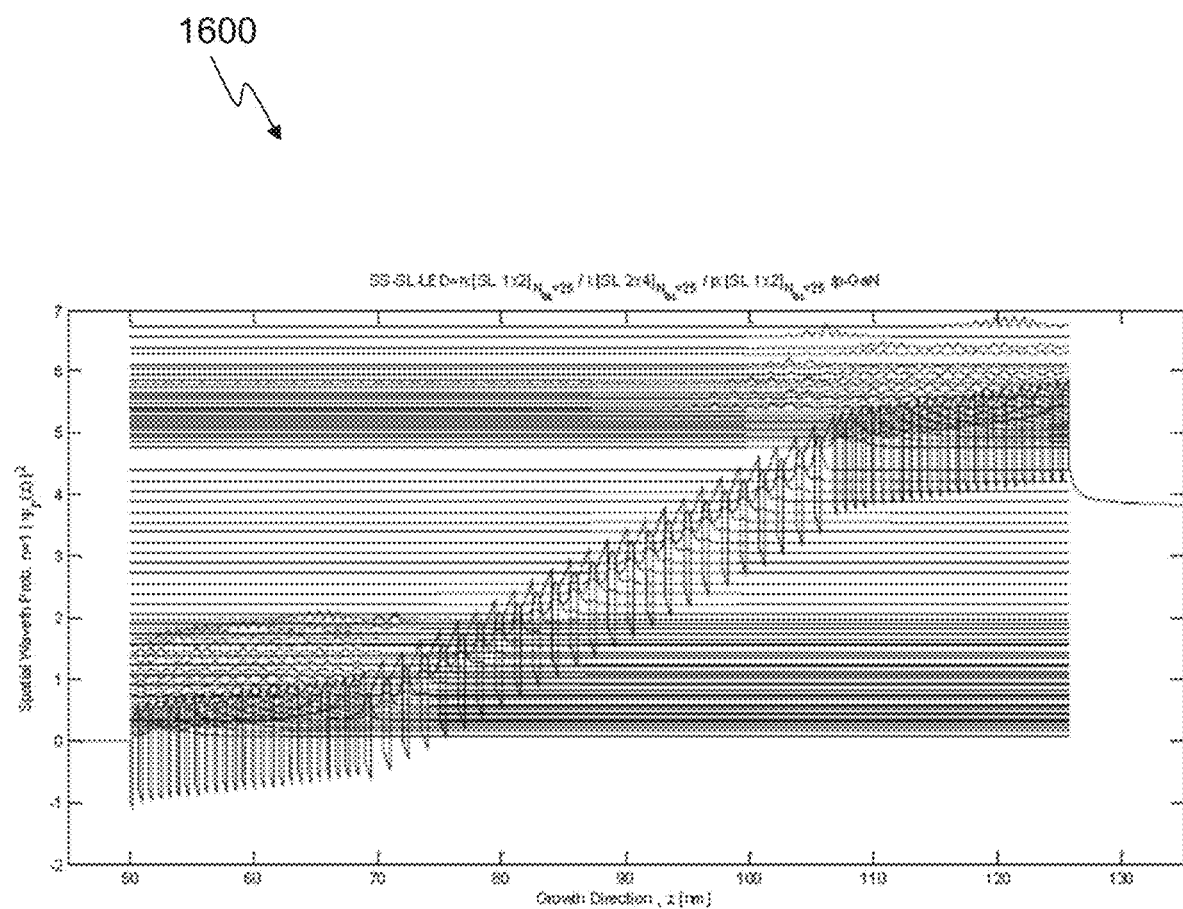
FIG. 16 is a graph showing the quantized lowest energy electron spatial wavefunctions with respect to a distance z along the growth direction for the optoelectronic device described with reference to FIG. 15.

FIG. 16 is a graph 1600 showing the quantized lowest energy ($n_{SL}=1$) electron spatial wavefunctions $\Psi_c^{n=1}(i,z)$ with respect to a distance z along the growth direction for the optoelectronic device described with reference to FIG. 15. The conduction band edge energy $E_c^{k=0}(z)$ is shown for reference.

The electron wavefunctions are clearly spread out across a large number of adjacent and neighbouring unit cells due to the thin AlN tunnel barriers in both the n-type and p-type active region. The larger unit cell period of the i-type active region shows a pronounced localization of the electron wavefunctions to at most a nearest neighbour penetration. There are no leaky wavefunctions outside of the superlattice within the forbidden gap of the i-type active region as was observed in the structure of FIG. 10. Therefore, the electrons injected from the n-type active region would undergo efficient transport through the n-type active region miniband and into the i-type active region. Electrons that are captured in the lowest energy quantized wavefunctions in the i-type active region are then available for recombination with a spatially coincident $n_{SL}=1$ heavy-hole in the valence band.

Figure 17:
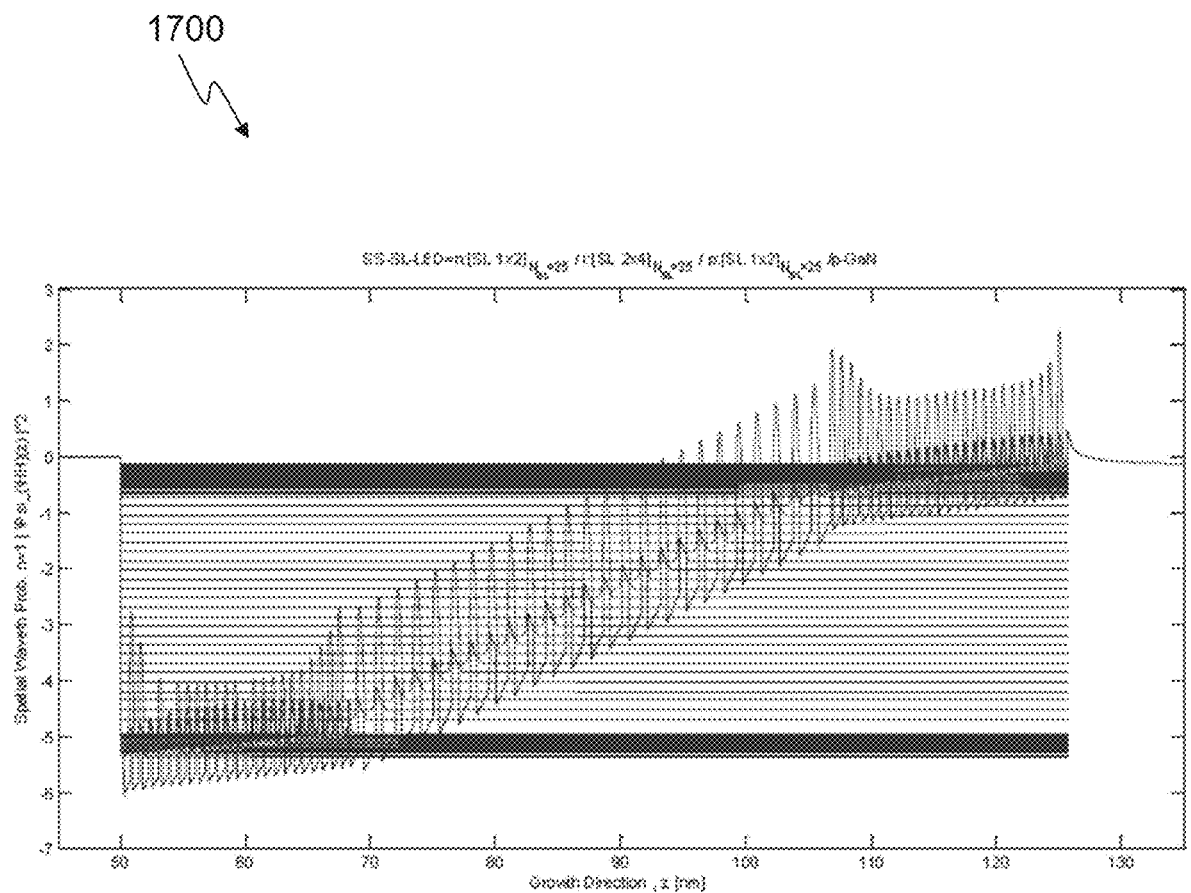
FIG. 17 is a graph showing the quantized lowest energy heavy hole spatial wavefunctions with respect to a distance along the growth direction for the optoelectronic device described with reference to FIG. 15.

FIG. 17 is a graph 1700 showing the quantized lowest energy heavy hole spatial wavefunctions $\Psi_{HH}^{n=1}(j,z)$ with respect to a distance along the growth direction for the optoelectronic device described with reference to FIG. 15. The heavy hole valence band energy edge $E_{HH}^{k=0}(z)$ is shown for reference. Once again, as observed in FIG. 11, the heavy hole wavefunctions are substantially delocalized across several unit cells in the n-type and p-type active regions. The i-type active region has a larger unit cell period than the n-type and p-type active regions, and the same average Al fraction within the unit cell as the p-type and n-type superlattice regions. Again, the GaN potential minima generate the lowest energy valence states as belonging to heavy hole states.

Figure 18:
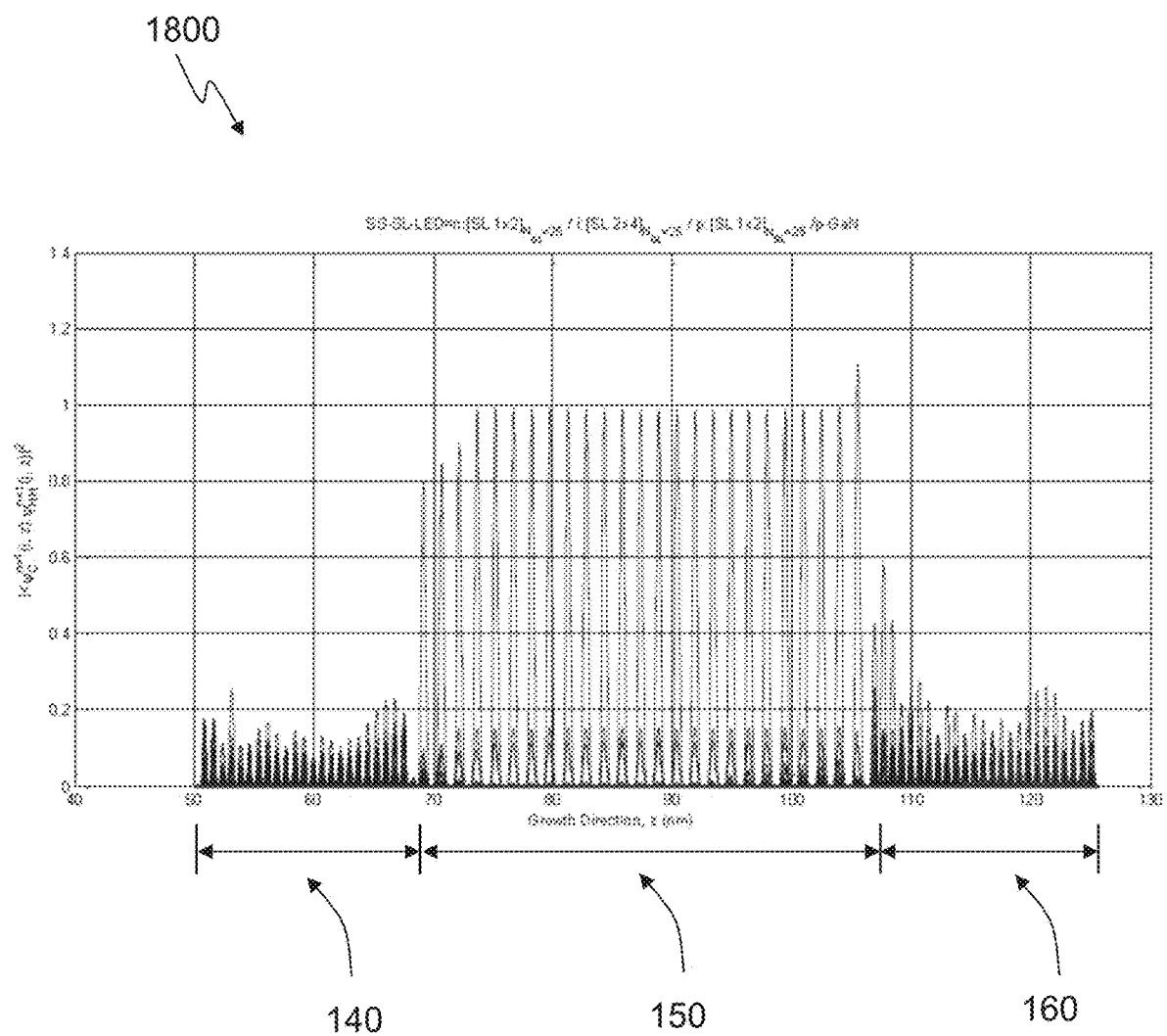
FIG. 18 is a graph showing the spatial overlap integral of each quantized electron spatial wavefunction of FIG. 16 and the quantized heavy hole spatial wavefunction of FIG. 17 with respect to a distance along the growth direction.

FIG. 18 is a graph 1800 showing the spatial overlap integral between the lowest energy quantized electron and heavy hole valence wavefunction states. The overlap integral is substantially the product of the quantized electron spatial wavefunctions $\Psi_c^{n=1}(i,z)$ of FIG. 16 and the heavy hole spatial wavefunctions $\Psi_{HH}^{n=1}(j,z)$ of FIG. 17 with respect to a distance along the growth direction for the optoelectronic device described with reference to FIG. 15. The strength of the overlap integral is proportional to the oscillator strength of the specific transition. In general, if the electron and hole wavefunction probabilities coincide spatially, then there is a finite probability for an electron-hole recombination event. The energy width of the allowed optical transitions is indicative of quantum mechanical tunnelling between GaN layers through a thin AlN barrier layer. The intrinsic region has thicker AlN barriers and thus reduced conduction band tunnelling. The oscillator strength of the intrinsic region is shown to be stronger compared to the n-type and p-type regions. It can be seen from graph 1800 that the probability that an electron and a hole are present at the same location is higher in the i-type active region 150 than the n-type active region 140 and the p-type active region 160. Hence optical emission due to electron and heavy hole recombination is more likely to occur from the i-type active region 150 than the n-type active region 140 and the p-type active region 160 of the optoelectronic device. Graph 1800 also shows that probability of emission from the i-type active region 150 is higher for the optoelectronic device described with reference to FIG. 15 than for the optoelectronic device described with reference to FIG. 9.

Figure 19:
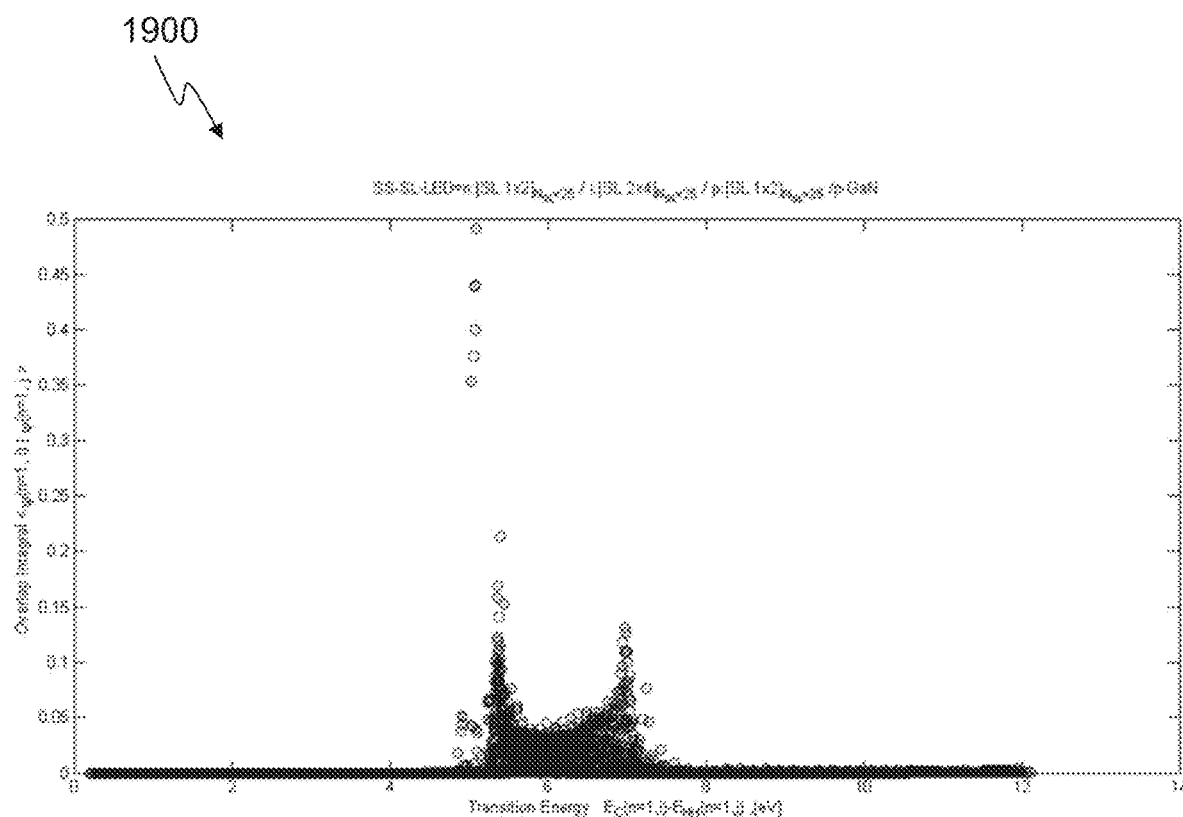
FIG. 19 is a graph showing the spatial overlap integral of each quantized electron spatial wavefunction of FIG. 16 and the quantized heavy hole spatial wavefunction of FIG. 17 with respect to a combined transition energy of the corresponding electrons and holes.

FIG. 19 is a graph 1900 showing the overlap integral of the electron spatial wavefunction $\Psi_c^{n=1}(i,z)$ and the heavy hole spatial wavefunction $\Psi_{HH}^{n=1}(j,z)$ with respect to a combined transition energy of the corresponding lowest energy quantized electrons and heavy holes for the optoelectronic device described with reference to FIG. 15.

The lowest energy optical transition due to the n=1 exciton is therefore due to recombination originating in the i-type active region which has a larger period than both the p-type and n-type active regions. The emission energy of the i-type active region is therefore selected to be at a longer wavelength than the lowest energy absorption of both the n-type and p-type active regions. This enables the generated photons within the i-type active region to propagate without absorption (and thus loss) within the cladding regions, i.e. the p-type and n-type active regions, and furthermore enables the light to be extracted from the interior of the device.

This represents a preferred implementation of the present invention wherein the emission and absorption properties of the regions of the semiconductor structure or the device are controlled by selection of the respective superlattice unit cell periods. Furthermore, the average alloy content is kept constant throughout the superlattice regions and thus the in-plane lattice constant of each unit cell is matched and no accumulation of strain energy is witnessed as a function of growth direction. This enables high crystal quality superlattice stacks to be realized. Furthermore, there is no discontinuity in the built-in electric fields due to polarization charges within the structure, enabling the stack to be polarization stabilized.

Figure 20:
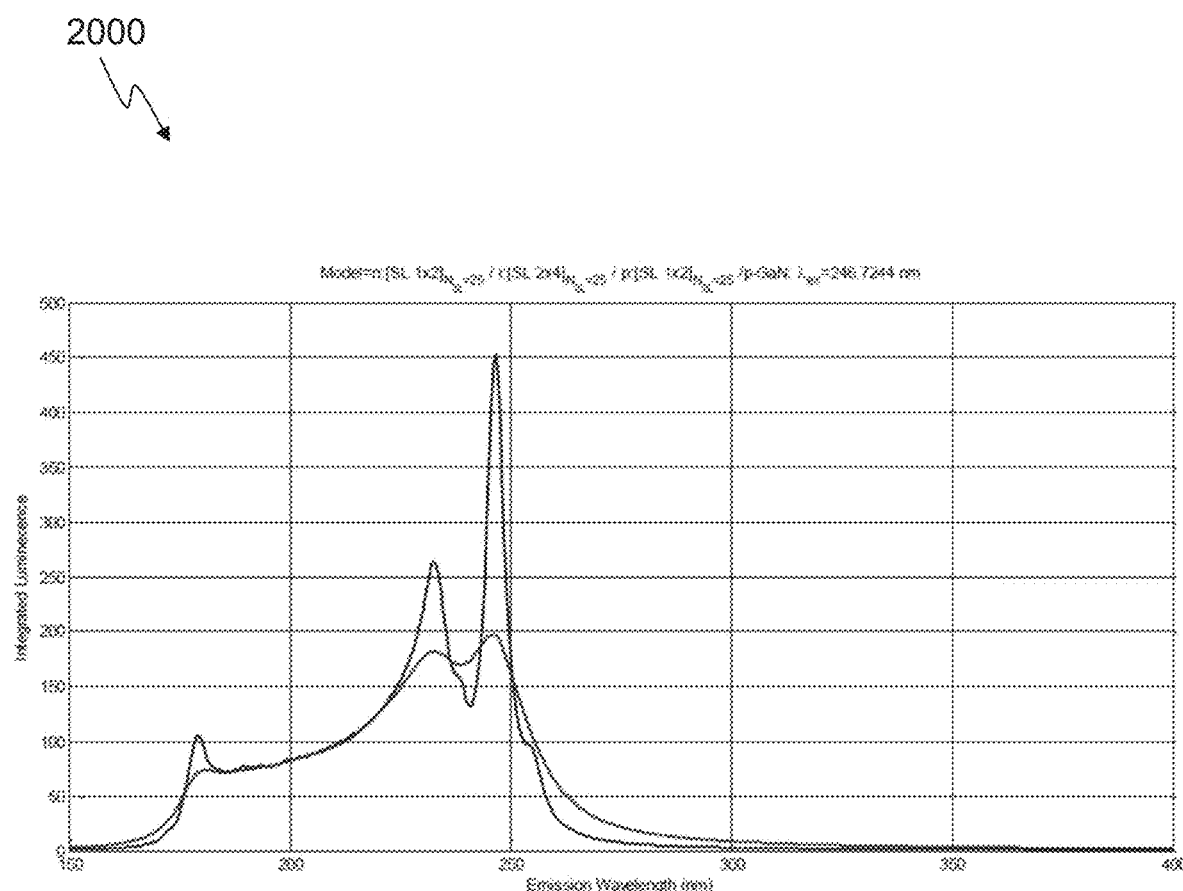
FIG. 20 is a graph showing an emitted luminance versus wavelength for the optoelectronic device described with reference to FIG. 15.

FIG. 20 is a graph 2000 showing an emitted luminance versus wavelength for the optoelectronic device described with reference to FIG. 15. The discrete overlap integrals of FIG. 19 are homogeneously broadened in energy to simulate thermal variations anticipated at room temperature. The sum of individual oscillator strength contributions are plotted as a function of wavelength for two choices of broadening parameters. The longest wavelength and sharpest transition is attributed to the lowest energy n=1 heavy-hole exciton and is spatially confined in the intrinsic region. As shown in FIG. 20, the wavelength of maximum intensity is at approximately 247 nm, which is longer than the wavelength of maximum intensity in FIG. 14 for the optoelectronic device described with reference to FIG. 9.

The optoelectronic devices of FIGS. 9 and 15 differ only in the choice of period for the one or more superlattices in the i-type active region. All the unit cells of all the one or more superlattices in the semiconductor structure are selected for these examples to have a fixed average alloy content. The average alloy content is selected to be defined as the Al fraction of the unit cell. For example, a unit cell comprising 1 monolayer of GaN and 2 monolayers of AlN has an Al fraction $x_{ave}=\frac{2}{3}$, and for a unit cell with 2 monolayers of GaN and 4 monolayers of AlN equally has an Al fraction $x_{ave}=\frac{4}{6}=\frac{2}{3}$. Again, for simplicity only, 25 unit cell repetitions are used in each region. That is, not only does the average Al fraction of the unit cell determine an equivalent ordered ternary alloy composition of the form of $Al_{xave}Ga_{1-xave}N$, but the period defines an optical emission energy for the said unit cell.

Figure 21:
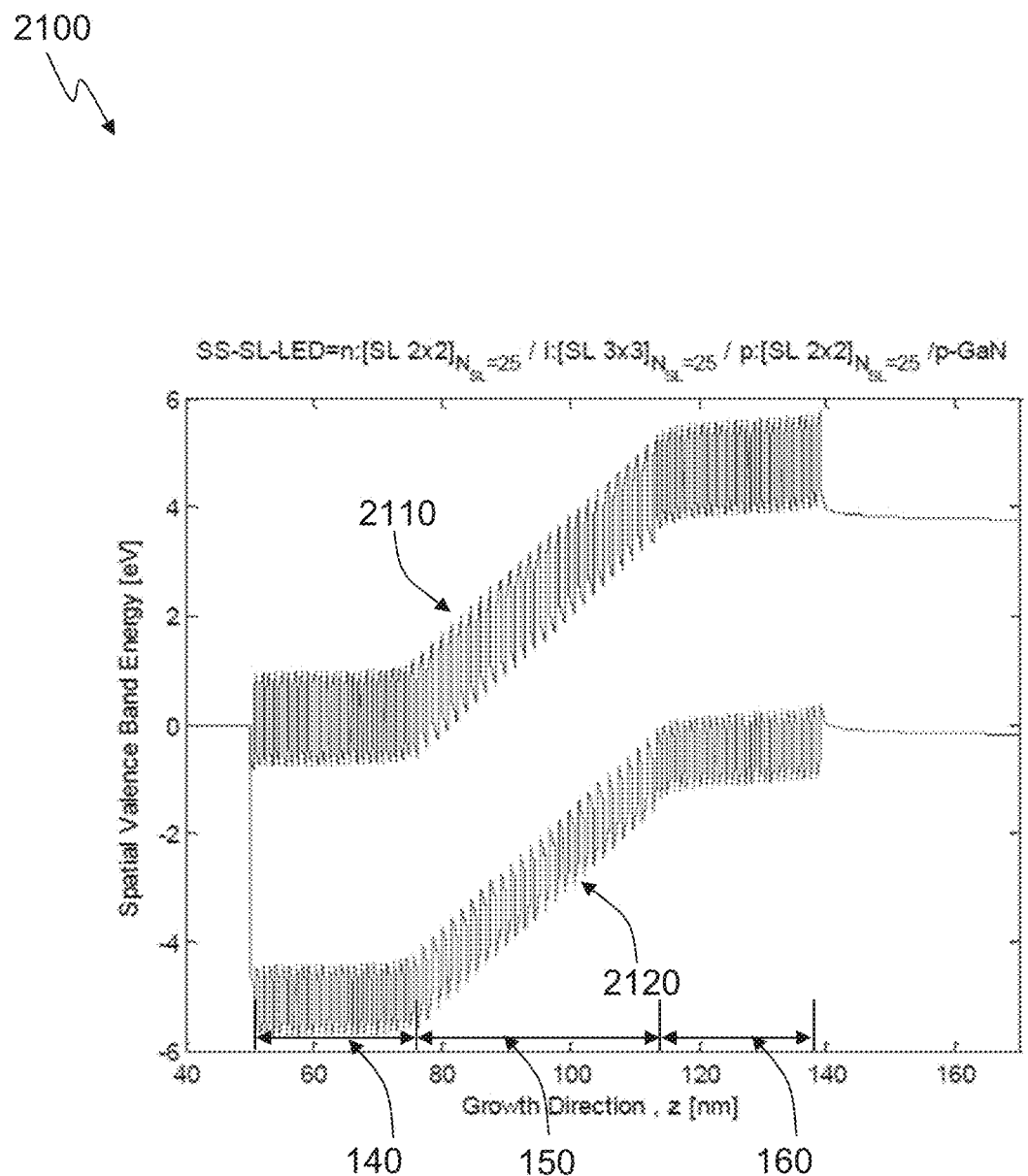
FIG. 21 is a graph of spatial energy levels in the conduction band and the valence band with respect to a distance along the growth direction z for an optoelectronic device, according to an embodiment of the present invention, wherein unit cells in the p-type and n-type active regions comprise 2 monolayer of GaN and 2 monolayers of AlN, and the unit cells in the i-type active region comprise 3 monolayers of GaN and 3 monolayers of AlN.

FIG. 21 is a graph 2100 of the spatially dependent energy levels in the conduction band and the valence band with respect to a distance along the growth direction for a optoelectronic device, according to another embodiment of the present invention. It is understood that reference to the zone centre ($\underline{k}=0$) conduction and heavy hole valence bands are sufficient to describe the device operation. In this embodiment, one or more superlattices forming the n-type active region, the i-type active region and the p-type active region are similarly composed of bilayered unit cells having an AlN layer and a GaN layer as in the case of the optoelectronic devices described with reference to FIGS. 9 and 15. The effective Al fraction in the case of FIG. 21 is however selected to have a lower Al fraction of $x_{ave}=0.5$. In the i-type active region 150, the first layer in each unit cell is formed of 3 monolayers of AlN and the second layer in each unit cell is formed of 3 monolayers of GaN. Both the n-type and p-type active regions are selected to also have $x_{ave}=0.5$ but designed to have a larger optical energy at the onset of absorption to render them substantially transparent to the optical emission energy generated by the i-type active region. The p-type and n-type active regions are selected to have unit cells comprising only 2 monolayers of GaN and 2 monolayers of AlN. The thinner layers of GaN results in an increase in the energy separation between the lowest quantized energy levels in the conduction and valence bands. The p-type and n-type regions are formed using impurity doped superlattices.

The y-axis of FIG. 21 is the energy level band diagram (in units of electron volts, eV) relative to the Fermi energy, and the x-axis is distance in nanometres (nm) along the growth direction from the base of the substrate. The spatial positions and extent of the n-type active region 140, the i-type active region 150 and the p-type active region 160 of the optoelectronic device are shown above the x-axis. Trace 2110 is the zone centre (or minimum) energy in the conduction band; the troughs are due to GaN, and the peaks are due to AlN. Careful inspection shows that the built-in pyroelectric and piezoelectric fields for the metal polar structure are different in the i-type active region to both the n-type and p-type active regions. This is due to the larger layer thicknesses of GaN and AlN in the i-type active region. Trace 2120 is spatial energy modulation in the valence band; the troughs are due to AlN, and peaks are due to GaN. FIG. 21 shows that the period of the unit cell (shown as the peaks and troughs) in the i-type active region 150 in traces 2110 and 2120 is roughly the same as the unit cell period shown in traces 1510 and 1520 shown in FIG. 15. However, the duty cycle (i.e. the relative GaN and AlN layer thickness within the unit cell) has changed. Again, the device is selected to have p-type and n-type active regions which are substantially transparent to the emission wavelength of the i-type active region.

Figure 22:
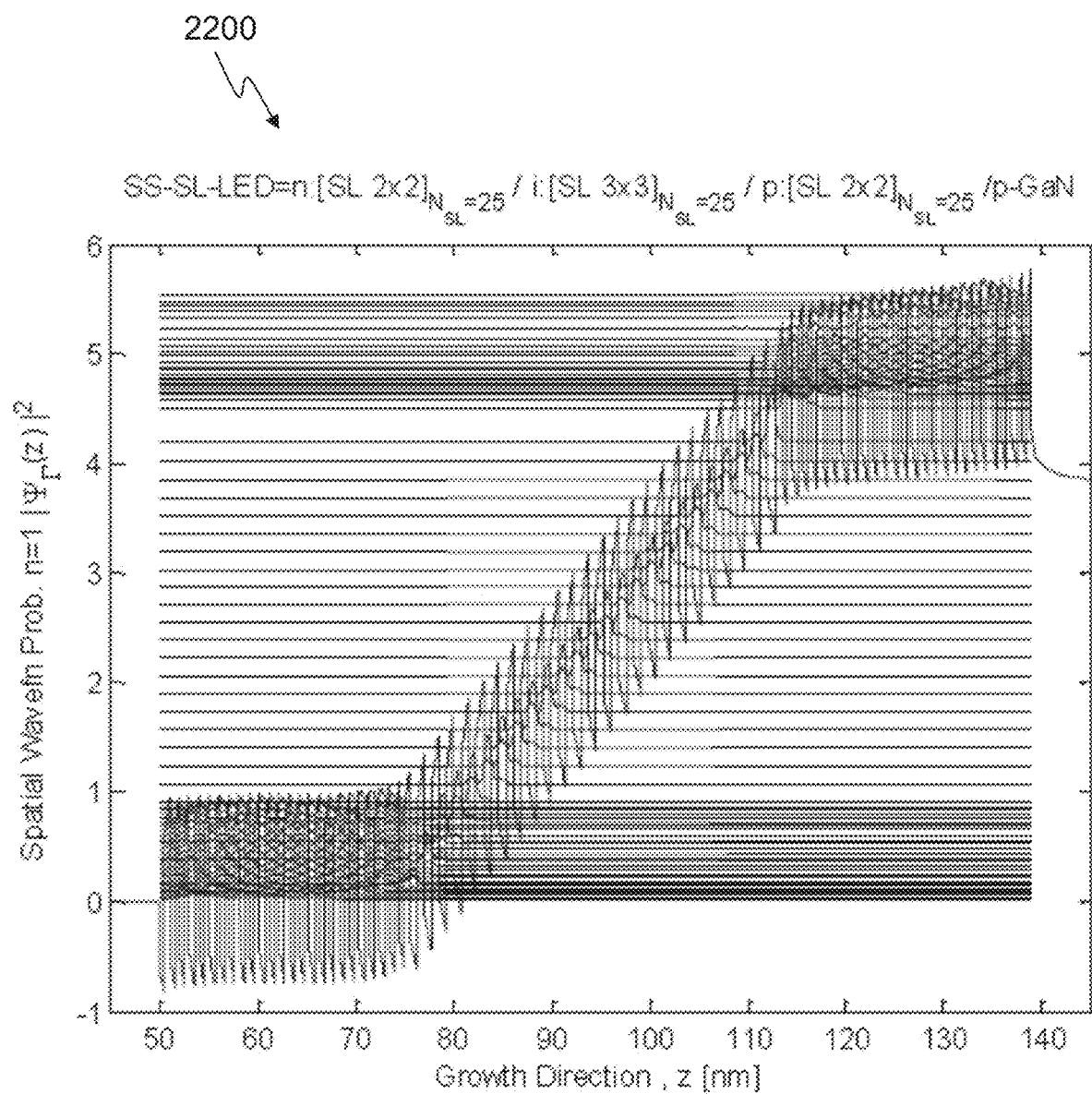
FIG. 22 is a graph showing the quantized lowest energy electron spatial wavefunctions with respect to a distance z along the growth direction for the optoelectronic device described with reference to FIG. 21.

FIG. 22 is a graph 2200 showing the lowest energy quantized electron spatial wavefunctions $\Psi_c^{n=1}(i,z)$ with respect to a distance along the growth direction for the optoelectronic device described with reference to FIG. 21. The zone centre ($\underline{k}=0$) conduction band energy $E_c^{k=0}(z)$ is shown for reference. The n-type and p-type spatial regions exhibit highly coupled wavefunctions and form an n=1 superlattice miniband. The intrinsic region shows electron wavefunctions coupled across only nearest neighbour potential wells by virtue of the built-in depletion field and the thicker AlN barriers.

Figure 23:
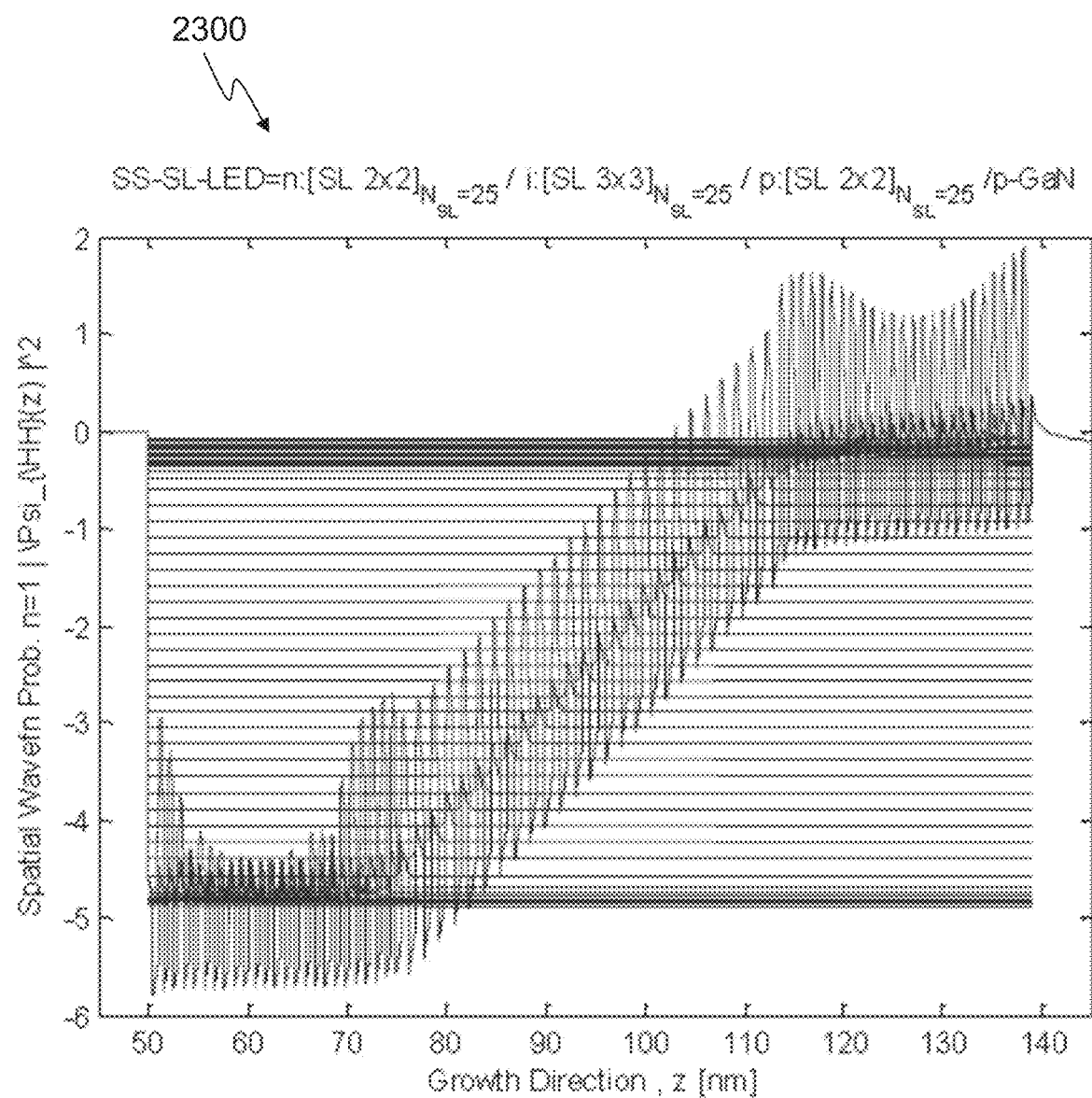
FIG. 23 is a graph showing the quantized lowest energy heavy hole spatial wavefunctions with respect to a distance along the growth direction for the optoelectronic device described with reference to FIG. 21.

FIG. 23 is a graph 2300 showing lowest energy quantized heavy hole spatial wavefunctions $\Psi_{HH}^{n=1}(j,z)$ with respect to a distance along the growth direction for the optoelectronic device described with reference to FIG. 21. The zone centre ($\underline{k}=0$) heavy hole valence band energy $E_{HH}^{k=0}(z)$ is shown for reference. The heavy-hole wavefunctions in the p-type and n-type regions are delocalized over a large number of neighbouring potential wells. Conversely, the heavy-hole wavefunctions in the i-type active region are highly localized to their respective potential well by virtue of the larger AlN barrier width and built-in depletion field.

Figure 24:
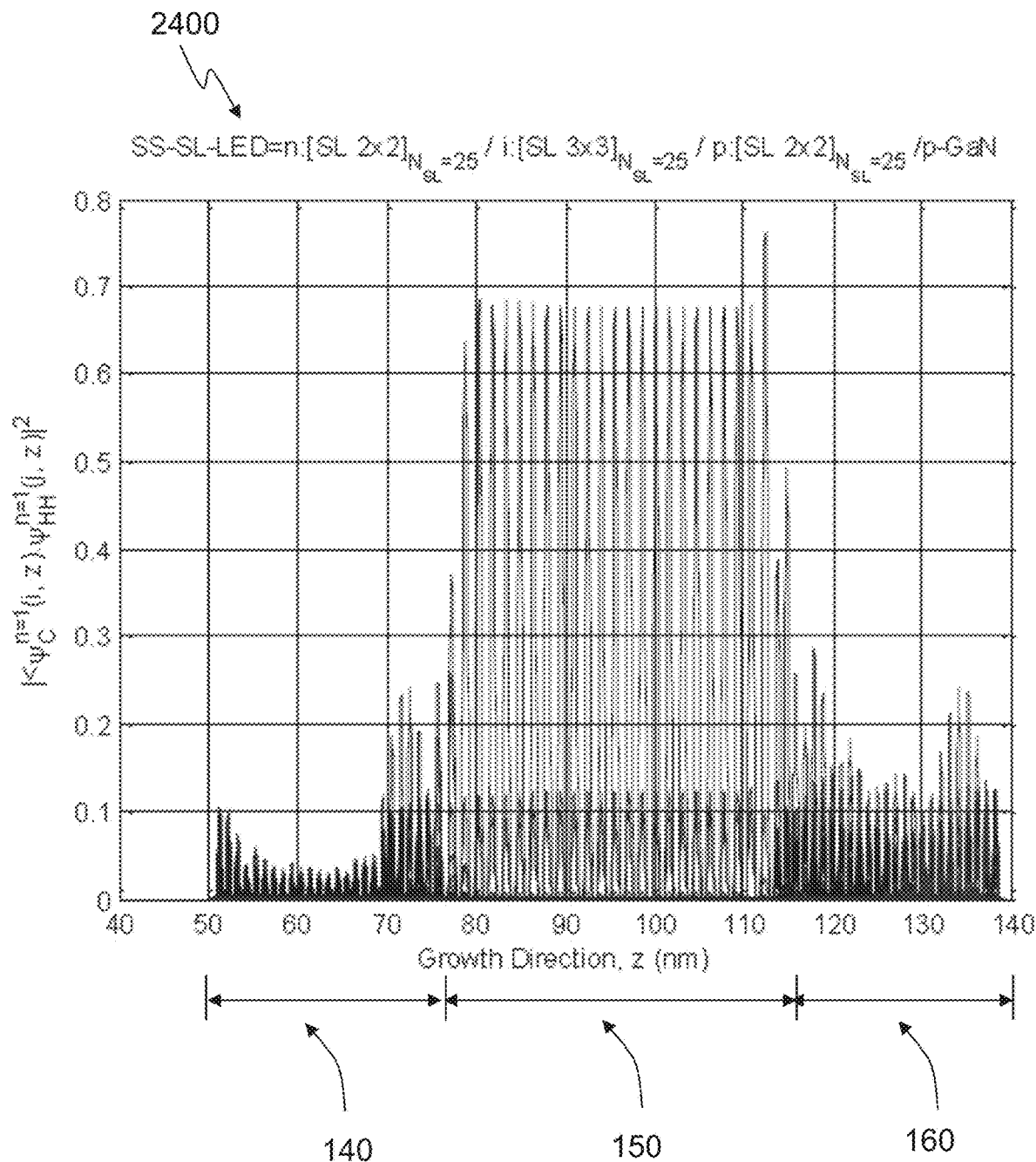
FIG. 24 is a graph showing the spatial overlap integral of each quantized electron spatial wavefunction of FIG. 22 and the quantized heavy hole spatial wavefunction of FIG. 23 with respect to a distance along the growth direction.

FIG. 24 is a graph 2400 showing the spatial overlap integral of the electron and heavy hole wavefunctions. The overlap integral is substantially the product of the electron spatial wavefunctions $\Psi_c^{n=1}(i,z)$ of FIG. 22 and the heavy hole spatial wavefunctions $\Psi_{HH}^{n=1}(j,z)$ of FIG. 23 with respect to a distance along the growth direction for the optoelectronic device described with reference to FIG. 21. The overlap integral represents the oscillator strength for the respective direct electron & heavy-hole transition. The energy width of the allowed optical transitions is indicative of quantum mechanical tunnelling between GaN layers through an AlN barrier layer. The i-type active region has thicker AlN barriers and thus reduced conduction band tunnelling. The oscillator strength of the i-type active region is shown to be stronger compared to the n-type and p-type active regions. It can be seen from graph 2400 that the probability that an electron and a hole are present at the same spatial location is higher in the i-type active region 150 than both the n-type active region 140 and the p-type active region 160. Hence emission is more likely to occur from the i-type active region 150 than the n-type active region 140 and the p-type active region 160 of the optoelectronic device. Graph 2400 also shows that probability of emission from the n-type active region 140 and the p-type active region 160 is lower for the optoelectronic device described with reference to FIG. 21 than for the optoelectronic devices described with reference to FIGS. 9 and 15.

Figure 25:
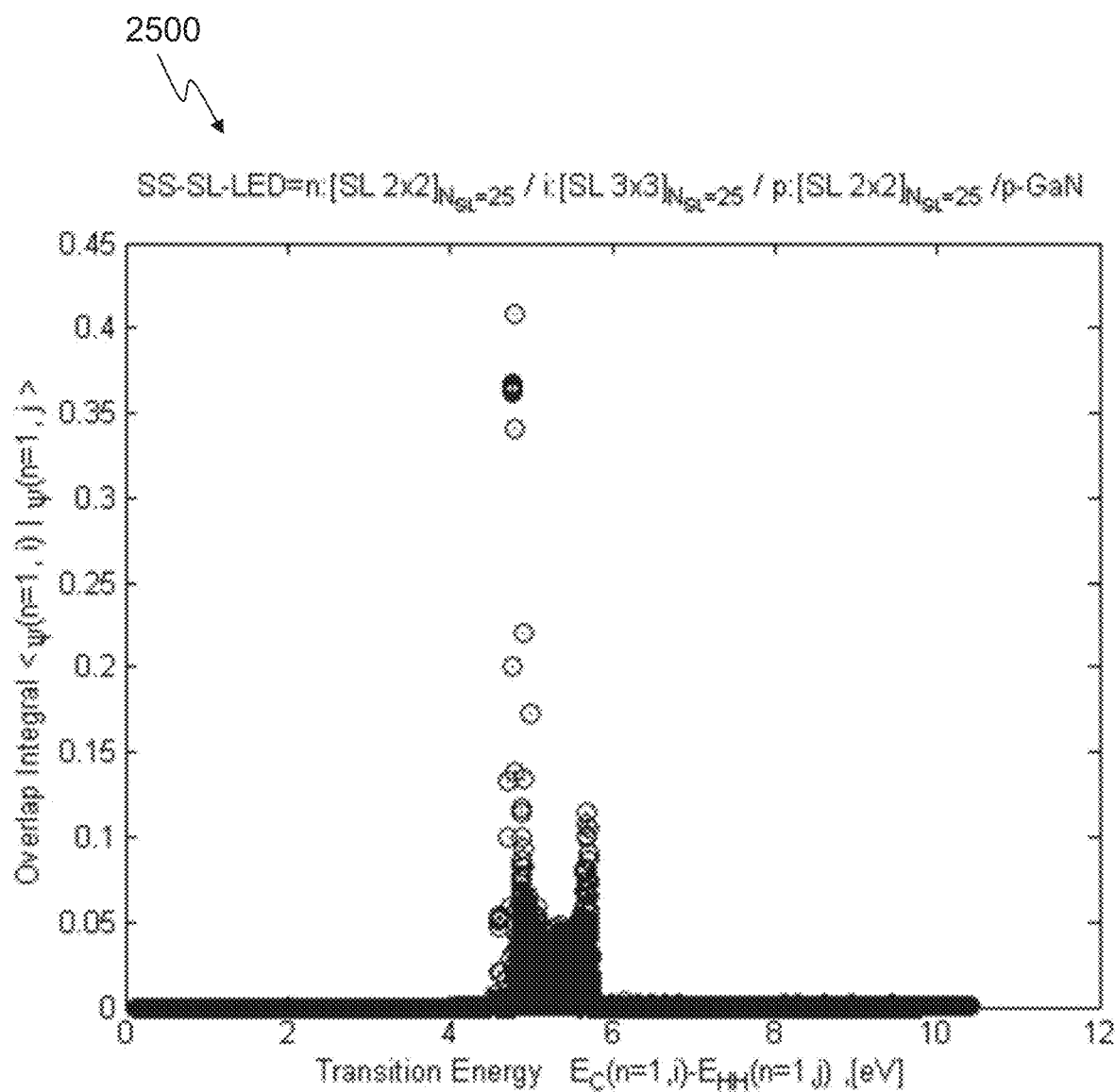
FIG. 25 is a graph showing the spatial overlap integral of each quantized electron spatial wavefunction of FIG. 22 and the quantized heavy hole spatial wavefunction of FIG. 23 with respect to a combined transition energy of the corresponding electrons and holes.

FIG. 25 is a graph 2500 showing the overlap integral of the electron spatial wavefunctions $\Psi_c^{n=1}(i,z)$ and the heavy hole spatial wavefunctions $\Psi_{HH}^{n=1}(j,z)$ with respect to a combined transition energy of the corresponding lowest energy quantized electrons and holes for the optoelectronic device described with reference to FIG. 21. A stronger oscillator strength of the lowest energy transitions in the i-type active region compared to the n-type and p-type active regions is due to electron and heavy-hole recombination in the i-type active region.

Figure 26:
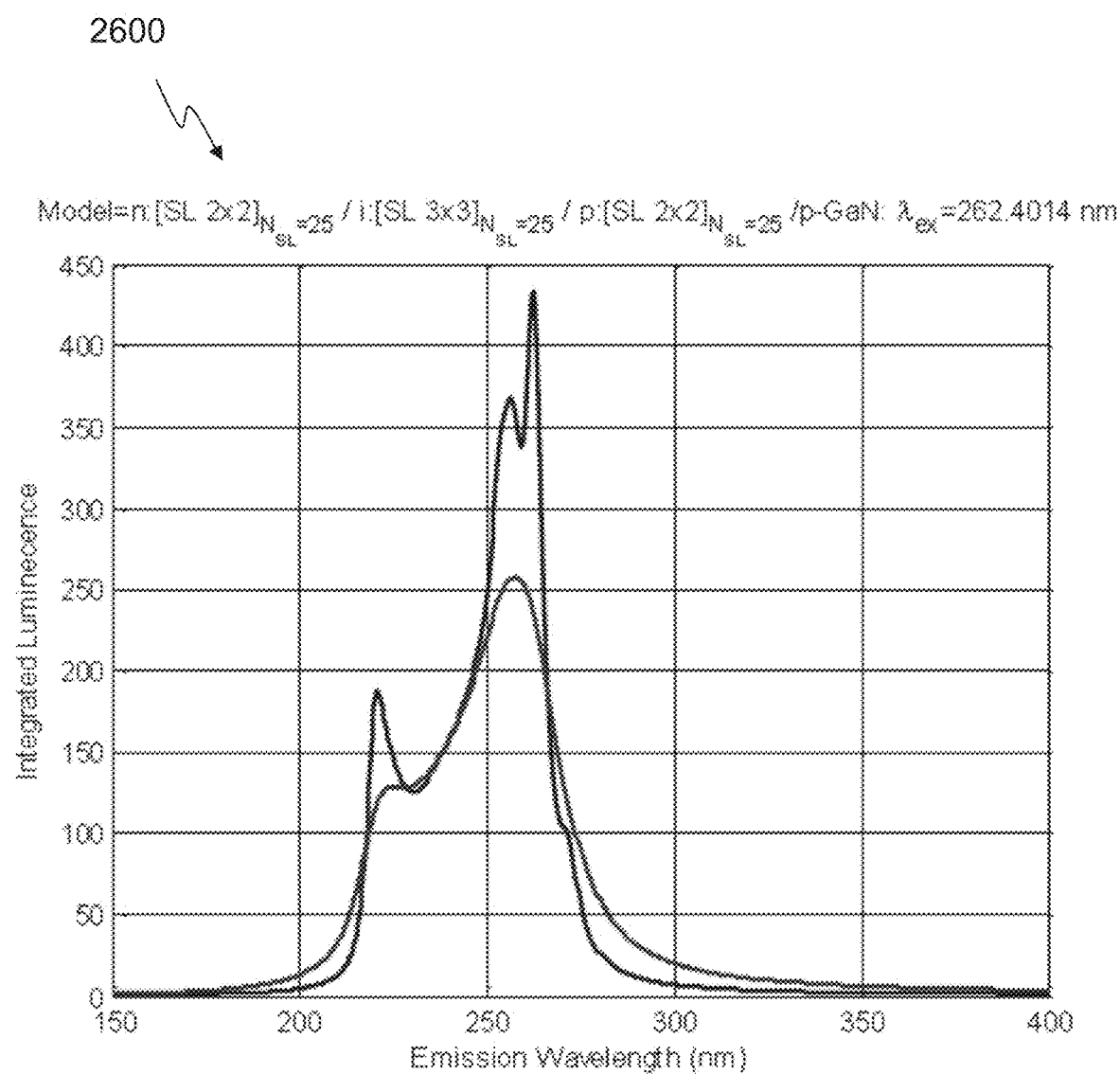
FIG. 26 is a graph showing an emitted luminance versus wavelength for the optoelectronic device described with reference to FIG. 21.

FIG. 26 is a graph 2600 showing an emitted luminance versus wavelength for the optoelectronic device described with reference to FIG. 21. The discrete overlap integrals of FIG. 25 are homogeneously broadened in energy to simulate thermal variations anticipated at room temperature. The sum of individual oscillator strength contributions are plotted as a function of wavelength for two choices of broadening parameters. The longest wavelength and sharpest transition is attributed to the lowest energy n=1 heavy-hole exciton and is spatially confined in the i-type active region As shown in FIG. 26, the wavelength of maximum intensity is at approximately 262 nm, which is substantially longer than the wavelengths of maximum intensity in FIGS. 14 and 20 for the optoelectronic devices described with reference to FIGS. 9 and 15 respectively.

The tuning of the emission wavelength and the other aspects of the device is discussed in further detail below.

The present invention utilizes a semiconductor structure that is preferably crystalline and more preferably formed as a single crystal atomic structure. In a preferred embodiment, for emission of ultraviolet and deep ultraviolet light, the semiconductor structure has a wurtzite crystal structure composed of ionic bonds and formed from one or more semiconductors, such as, group III metal nitride (III-N) semiconductors or group II metal oxide (II-VI) semiconductors.

Figure 27A:
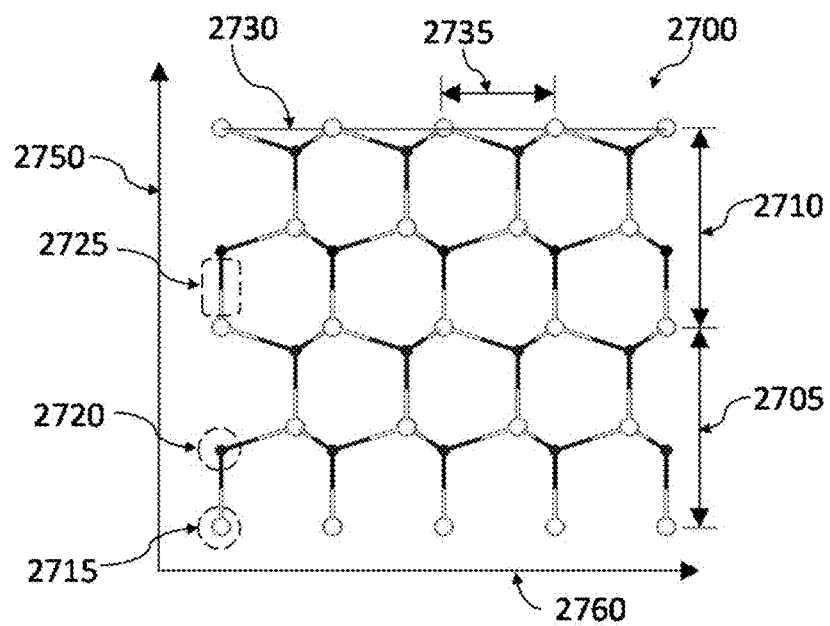
FIG. 27A is a view of a wurtzite crystal structure for a group III metal nitride semiconductor.

FIG. 27A shows a wurtzite crystal structure 2700 for a group III metal nitride semiconductor. The wurtzite crystal structure includes metal crystal sites 2715 and nitrogen atom sites 2720. The polarity of the crystal bonds along the miller notation [h k i l]=[0 0 0 1] direction 2750 is shown to be of a nitrogen-polar crystal orientation having a nitrogen polar bond 2725. The structure can be inverted by mirror reflection about 2760 and becomes a metal-polar polar oriented crystal. If the crystal axis 2750 is taken as the growth direction [0 0 0 1] then the c-plane (0 0 0 1) is identified as the plane labelled 2730. The horizontal crystal axis 2760 is one of the high symmetry slices through the wurtzite crystal having [1 1-2 0] direction.

Figure 27B:
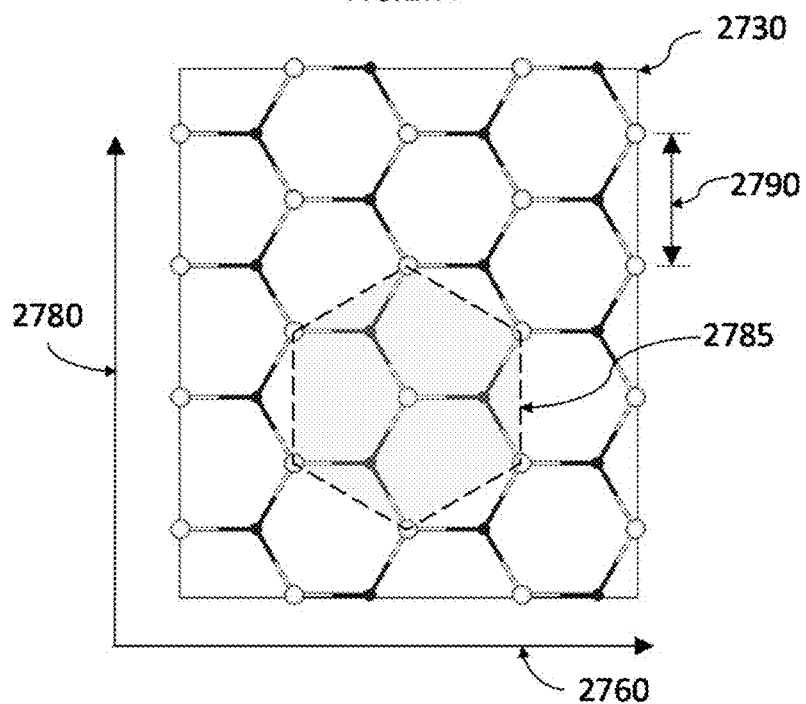
FIG. 27B is a view of the c-plane of the wurtzite crystal structure of FIG. 27A.

FIG. 27B shows a view of the c-plane 2730 with the metal atoms terminating the surface. Nitrogen atom surface terminations of the c-plane are also possible. The crystal directions 2760 and 2780 represent in miller notation the [1 1-2 0] and [0 0 1-1] directions, respectively. Abrupt surface terminations are further subject to surface reconstructions of lower symmetry bond patterns. These surface reconstructions minimize the growing surface energy, but ultimately form substantially idealized crystal structure within the bulk of the layer when the reconstructed surface is then overgrown with further material in the wurtzite crystal structure. The ideal metal terminated surface exhibits the hexagonal c-plane crystal cell identified as the hexagon 2785 having equal sides of in-plane lattice constant 2790. The crystal fundamental repeating unit is then characterized by a wurtzite cell parameterized as the lattice constant a, labelled as 2790, and the hexagonal column of height c, labelled as 2705 or 2710 in FIG. 27A. For example, a strain free AlN epilayer would have a=4.982 Å and c=5.185 Å. One monolayer (1 ML) is defined herein as equal to 1 ML=c/2, for film deposited upon a c-plane.

Figure 27C:
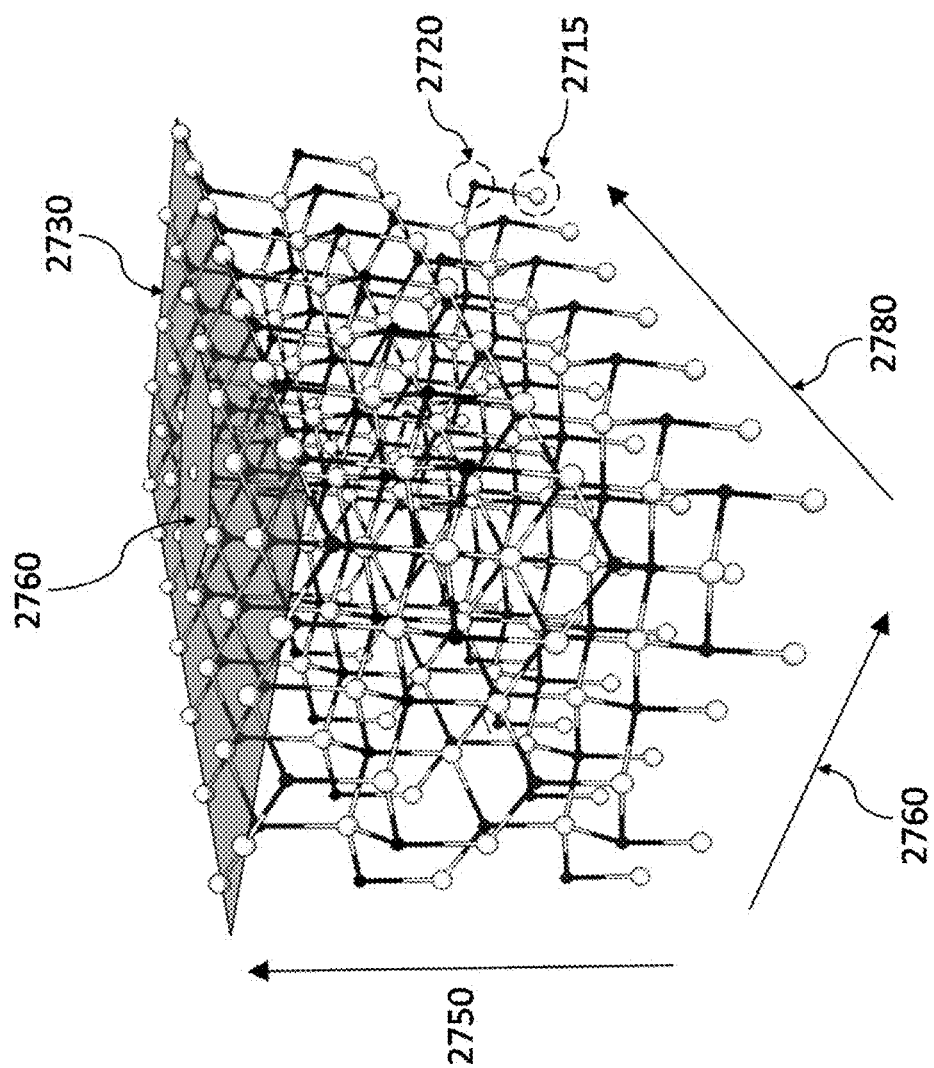
FIG. 27C is a perspective view of an AlN wurtzite crystal oriented along the c-axis and exposing an Al atom surface.

FIG. 27C shows perspective view of an AlN wurtzite crystal 2770 oriented along the c-axis 2750 and further exposing an Al atom surface. The Al terminated surface lies wholly in the c-plane 2730 with the wurtzite crystal unit cell defined by the hexagon 2760. The vertical thickness along the direction 2750 shows four monolayers of AlN material and the associated crystal orientations. For example, in some embodiments, a c-plane oriented epitaxial deposition upon a substrate cam include depositing with high uniformity a plurality of monolayered films which extend laterally in directions 2760 and 2780, spanning the substrate surface area.

FIG. 28 is a chart 2800 showing the preferred range of layered thicknesses for an example superlattice. The unit cells of the superlattice comprise two layers formed exclusively of binary compositions of GaN and AlN, respectively. For example, the superlattice is formed of wurtzite GaN and AlN films deposited upon a c-plane as shown schematically for an idealized spatial portion in FIG. 27C. The chart 2800 of FIG. 28 shows the columns tabulated in terms AlN thickness as a whole number of monolayers N along a c-axis, and the physical thickness in units of Angstroms (n.b., 1 Å=0.1 nm). Similarly, the rows tabulate in terms of whole monolayers M of GaN with the table entries calculating the unit cell period thickness: $A_{SL}=M.(1 \text{ ML GaN})+N.(1 \text{ ML AlN})=M.c_{GaN}/2+N.c_{AlN}/2$.

A superlattice having a unit cell which repeats $N_p$ times and has a constant Al fraction along a growth direction can be defined as a GaN and AlN pair having M and N monolayers, written for convenience herein as M:N.

Figure 29:
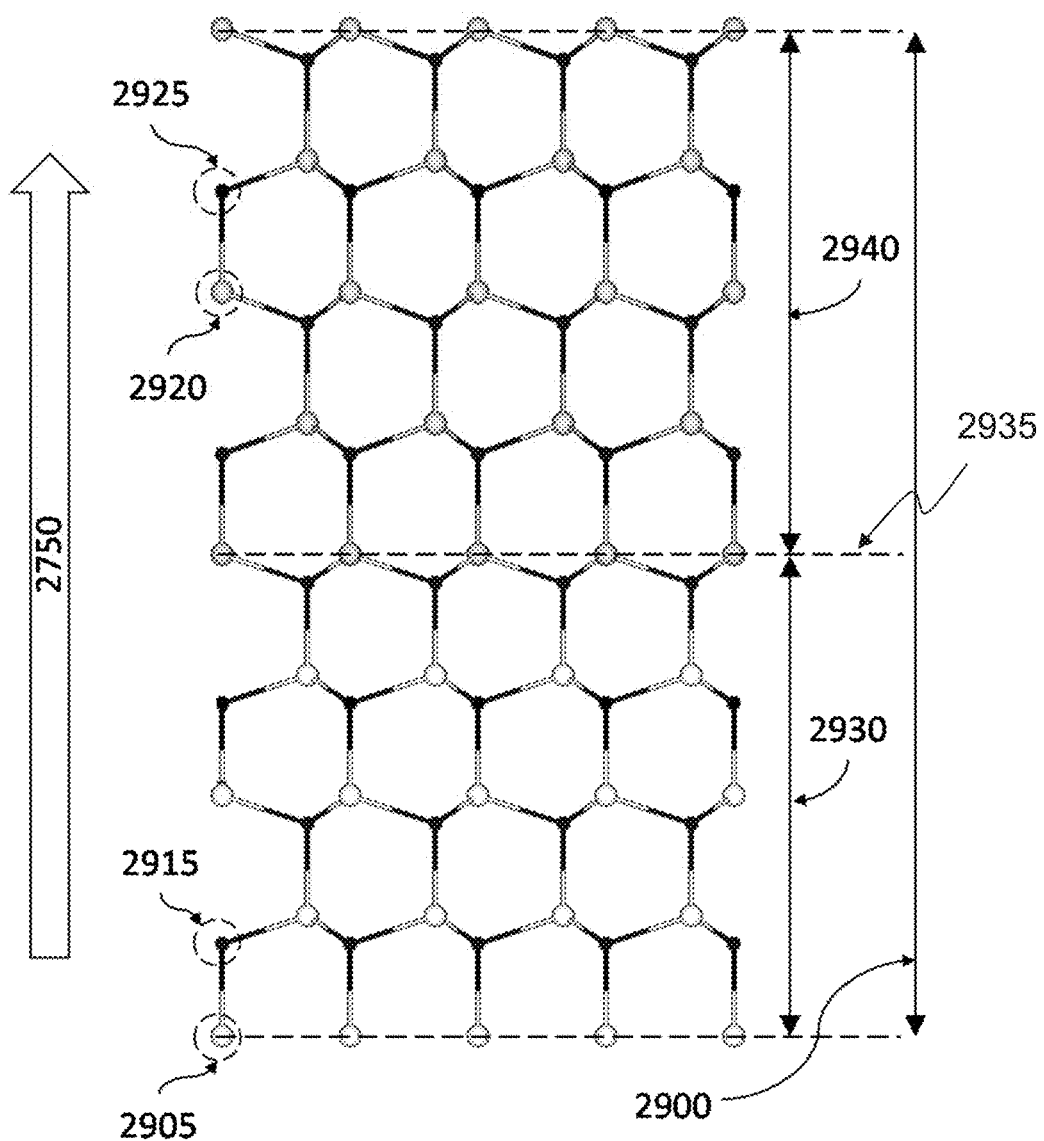
FIG. 29 is a side view of a crystal lattice structure of a unit cell of a superlattice, according to an embodiment of the present invention.

FIG. 29 shows a crystal lattice structure of one unit cell of a 4:4 superlattice wherein the 4 monolayers of GaN 2940 are deposited epitaxially upon 4 monolayers of AlN 2930 along a c-axis 2750 which defines a growth direction. The Al atoms sites are shown as the large white spheres 2905, the Ga atom sites are depicted as the large grey spheres 2920 and the nitrogen atom sites are shown as the small black spheres 2915 and 2925. The AlN/GaN heterointerface 2935 can be abrupt having purely Ga or Al metal terminations or can be an intermixed interface having random distribution of Ga and Al atoms in the plane 2935. The vertical height of the GaN epilayer 2940 is larger than the lower AlN epilayer 2930 by virtue of elastic deformation of the crystal unit cells. A free standing superlattice unit cell 2900 would ideally exhibit no interfacial dislocations (namely, misfit dislocations) and would have the AlN layer in state of in-plane tensile strain and the GaN epilayer in a state of in-plane compressive strain. The elastically deformed dissimilar epilayers are ideally deposited with a thickness along a c-axis 2750 that is below the critical layer thickness (CLT). The CLT is the maximum thickness that a lattice mismatched material can be deposited upon an underlying crystal without forming misfit dislocations. All of the M:N combinations disclosed in chart 2800 of FIG. 28 are representative of such superlattice unit cells which are deposited below the CLT of each material. Note, the CLT can be theoretically calculated and experimentally determined. For example, direct in-situ measurements using reflection high energy electron diffraction (RHEED) during heteroepitaxy in MBE can determine the CLT with great accuracy.

FIG. 30 is a chart 3000 showing further possible implementations of unit cells formed by using on GaN and AlN materials deposited along a c-axis as defined herein. Chart 3000 defines fractional monolayer pairs of M:N with table entries showing the unit cell thickness $A_{SL}$. These unit cell thicknesses can be applied to deep ultraviolet emitters using group III metal nitride semiconductors. It is also found that other material compositions can be used and more than two compositions comprising a superlattice unit cell are applicable.

FIGS. 28 and 30 show examples of layers of GaN and AlN making up the unit cells of a superlattice (e.g., in the i-type region) with combined thickness of the two layers from 2.5 Angstroms to 35.6 Angstroms.

Figure 31:
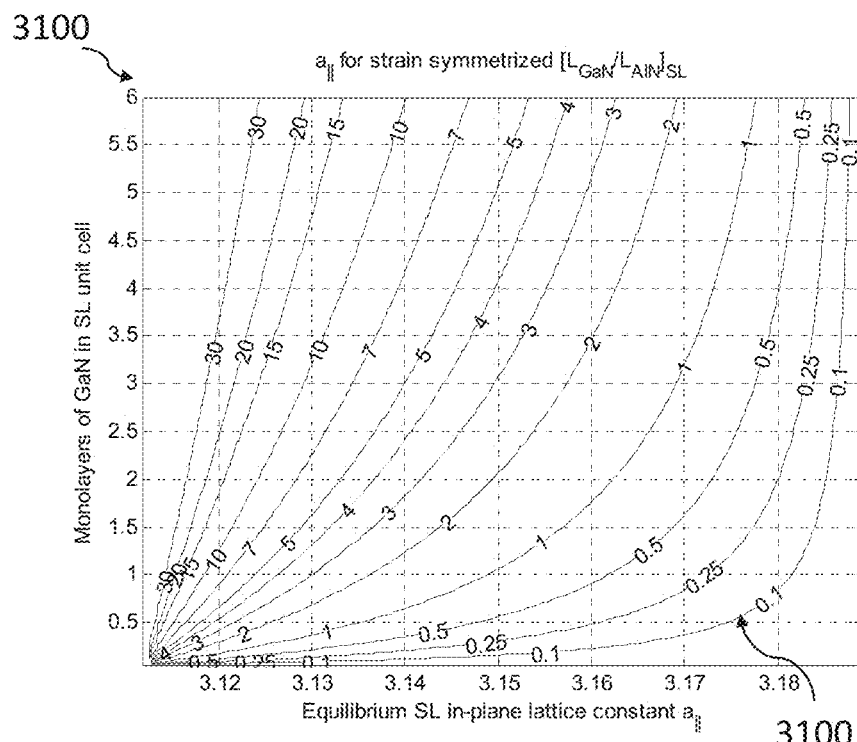
FIG. 31 is a graph of an equilibrium in-plane lattice constant $a_\parallel^{SL}$ of a superlattice for a given selection of M monolayers of GaN and N monolayers of AlN in each unit cell.

FIG. 31 shows a graph 3100 of an equilibrium in-plane lattice constant $a_{\parallel}^{SL}$ of a superlattice, constructed with unit cells having only a GaN and an AlN layer. The graph 3100 shows the calculated in plane lattice constant $a_{\parallel}^{SL}$ for a given selection of M monolayers of GaN and N monolayers of AlN in each unit cell. Each curve is parameterized by a distinct choice of N monolayers of AlN. The curves of graph 3100 can be used directly to design a superlattice LED comprising different unit cell M:N pairs and is discussed hereafter.

Figure 32:
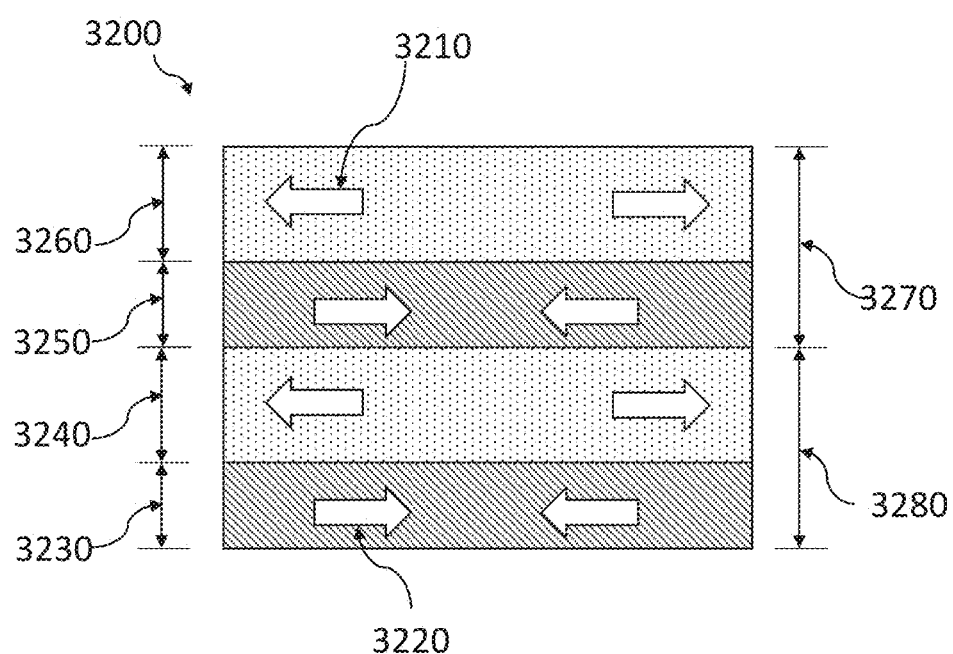
FIG. 32 is a schematic showing some of the atomic forces present in a structure comprising two unit cells.

FIG. 32 shows schematically the atomic forces present in a structure 3200 comprising two unit cells 3270 and 3280. Each unit cell comprises two layers and each of the two layers is formed of a dissimilar material, for example, first layers 3230 and 3250 can be GaN layers and second layers 3240 and 3260 can be AlN layers. The layers are formed by epitaxial deposition of crystals, which are elastically deformed due to the dissimilar crystal lattice constants in each adjacent layer. If the structure is deposited upon a c-plane, then the GaN layers 3230 and 3250 are subject to compressive in-plane stress 3220 and the AlN layers 3240 and 3260 have an induced tensile in-plane strain 3210. Such a superlattice formed using lattice mismatched materials with each layer of each unit cell being formed with thickness below the CLT can achieve high crystalline perfection when formed with a sufficient number of periods. For example, using GaN and AlN materials only, a superlattice according to the teaching of the present invention is formed on a bulk-like c-plane AlN surface, a (0001)-oriented Sapphire surface, or another suitable surface. After approximately 10 to 100 periods of superlattice growth the final unit cells attain idealized free-standing in-plane lattice constants $a_{\parallel}^{SL}$. This is one example method of forming a superlattice buffer 130 as discussed in relation to FIG. 1.

In some embodiments of the present invention, each superlattice in the semiconductor structure has a distinct configuration that achieves a selected optical and electronic specification.

Experiments show that keeping an average alloy content in each unit cell constant along the superlattice is equivalent to keeping the average in-plane lattice constant of the unit cell $a_{\parallel}^{SL}$ constant. Experiments also show that the thickness of the unit cell can then be selected to achieve a desired optical and electrical specification. This enables a plurality of distinct superlattices to have a common effective in-plane unit cell lattice constant and thus enables the advantageous management of strain along a growth direction.

Figure 33:
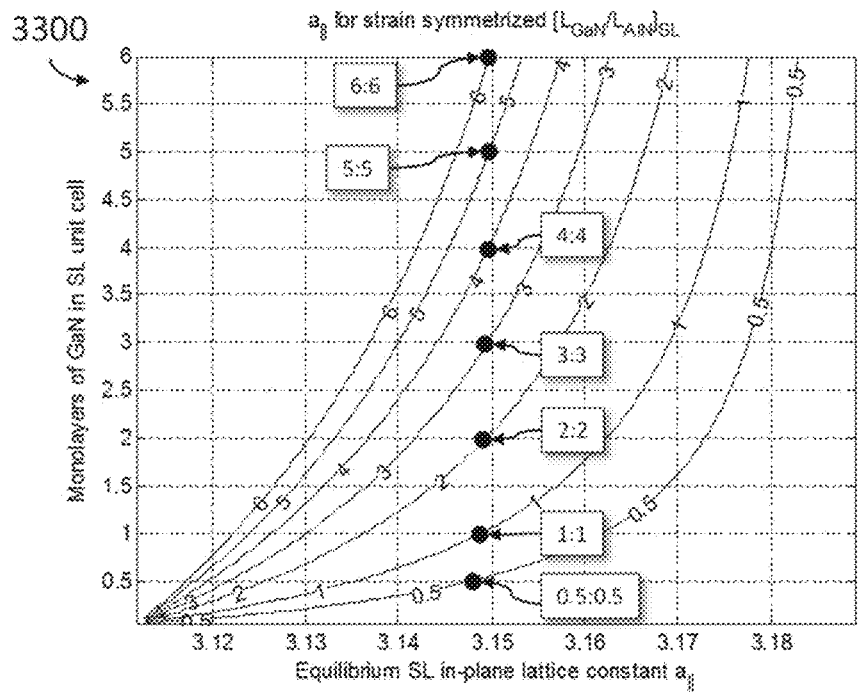
FIG. 33 is a graph of an equilibrium in-plane lattice constant $a_\parallel^{SL}$ of a superlattice for a given selection of M monolayers of GaN and N monolayers of AlN in each unit cell, where M=N.
Figure 34:
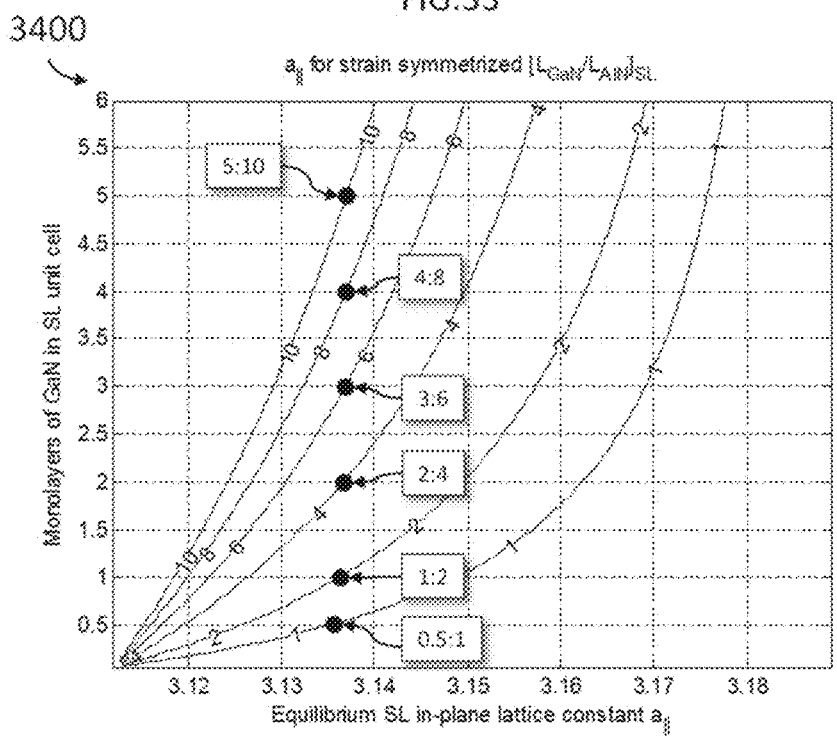
FIG. 34 is a graph of an equilibrium in-plane lattice constant $a_\parallel^{SL}$ of a superlattice for a given selection of M monolayers of GaN and N monolayers of AlN in each unit cell, where N=2M.

FIGS. 33 and 34 show graphs 3300 and 3400 of the equilibrium in-plane lattice constant $a_{\parallel}^{SL}$ of a superlattice, constructed with unit cells having only a GaN and an AlN layer. The graphs 3300 and 3400 show the calculated in plane lattice constant $a_{\parallel}^{SL}$ for a given selection of M monolayers of GaN and N monolayers of AlN in each unit cell. Each curve is parameterized by a distinct choice of N monolayers of AlN. Black dots are provided in each graph to show unit cell configurations having the same average alloy content. The black dots shown in the graph 3300 of FIG. 33 include M:N combinations where M=N and thus an effective Al fraction of $x_{ave}^{SL}=\frac{1}{2}$ is achieved. The black dots in graph 3400 in FIG. 34 include M:N combinations where N=2M and thus a $x_{ave}^{SL}=\frac{2}{3}$. Graphs 3300 and 3400 show examples of equilibrium in-plane lattice constants of the GaN and AlN layers in a superlattice (e.g., in the i-type region) from 3.11 Angstroms to 3.19 Angstroms.

The graphs of FIGS. 33 and 34 can be particularly useful for designing semiconductor structures having superlattices with unit cells exclusively built from GaN and AlN material combinations deposited along a c-axis and having wurtzite crystal structure.

Figure 35:
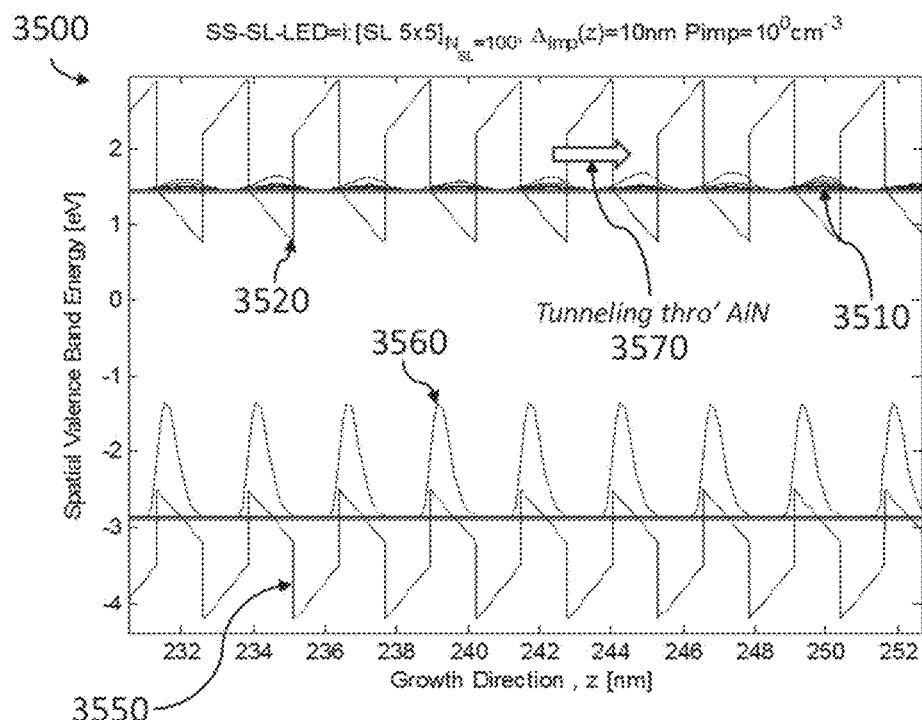
FIG. 35 is a graph of a calculated portion of the energy band structure of a superlattice having 100 unit cells that each comprise 5 monolayers of GaN and 5 monolayers of AlN.

FIG. 35 shows a graph 3500 of a calculated portion of the energy band structure of a $N_p=100$ period superlattice comprising a M:N=5:5 unit cell that is repeated along a growth direction z. The spatial variation of the conduction band edge 3520 and heavy hole valence band edge 3550 are shown along with the quantized energy and spatially confined carrier wavefunctions 3510 and 3560. GaN and AlN layers are selected from thicknesses which preserve the CLT of each of the respective layers, as shown in FIG. 30. FIG. 35 shows that the electron wavefunctions 3510 exhibit a strong tendency for quantum mechanical tunnelling 3570 through the AlN barriers, whereas the heavy hole wavefunctions 3560 are tightly localized within their respective GaN potential minima.

Figure 36:
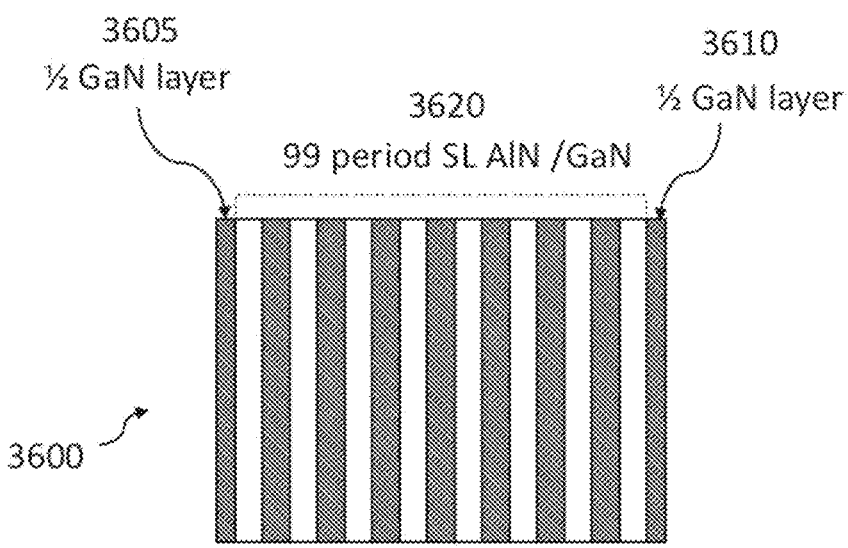
FIG. 36 shows a superlattice used to simulate a semi-infinite number of periods of a superlattice of constant unit cell length and composition.

FIG. 36 shows a superlattice 3600 used to simulate a semi-infinite number of periods of a superlattice of constant unit cell length and composition. In the superlattice, the unit cells have a constant length and composition. However, the first GaN layer 3605 is split in half and added to the end 3610 of the superlattice. Applying periodic boundary conditions for the wavefunctions thus simulates a semi-infinite number of periods, while investigating the interacting property of the base 99 unit cells 3620. Using a finite element method and full k.p theory the wavefunctions are calculated along with the quantized energies of the lowest lying superlattice states. As described earlier, the optical emission spectrum is calculated from the overlap integrals and energy separation between the lowest energy (n=1) conduction band states and the n=1 heavy hole states.

FIGS. 37, 38, 39, 40 and 41 show graphs of the transverse electric (TE) optical emission spectra of superlattices having $x_{ave}^{SL}=\frac{2}{3}$ and M:N configurations of 1:2, 2:4, 3:6, 4:8 and 5:10, respectively. Each of the graphs shows four curves corresponding to the total emission and emission due to a particular valence band type (namely, HH, LH or CH) with an allowed conduction state. As discussed previously, a desired lowest energy emission is for a transition between an allowed conduction band state and a heavy-hole state, which satisfies the criteria for vertical emission parallel to c-axis and or growth direction.

Figure 37:
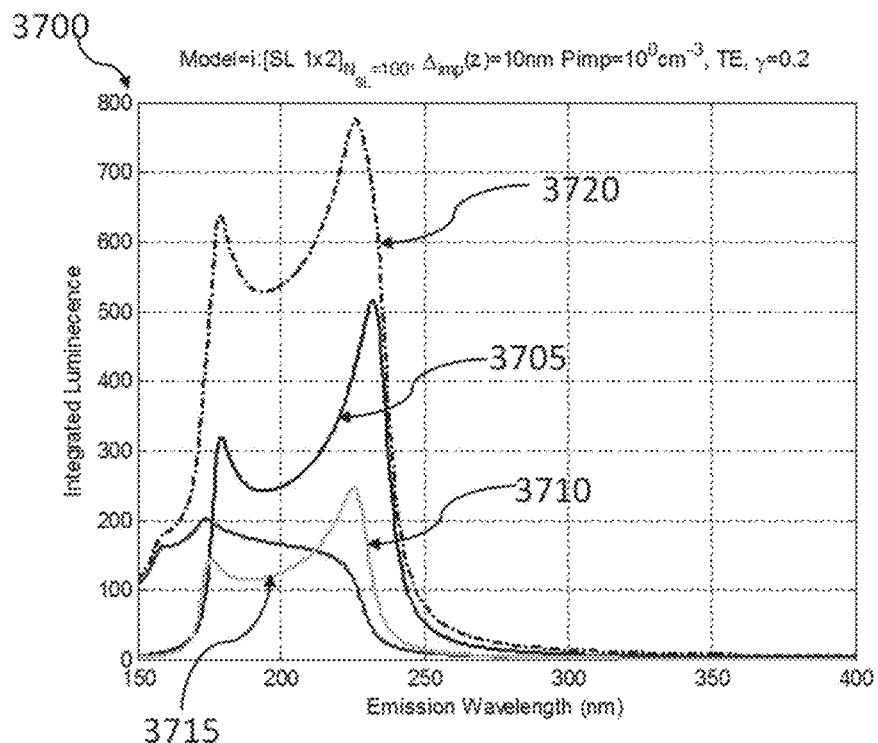
FIG. 37 is a graph of a transverse electric (TE) optical emission spectra of a superlattice having repeated unit cell that comprises 1 monolayer of GaN and 2 monolayers of AlN.

FIG. 37 shows a graph 3700 of the emission spectrum of a 1:2 superlattice for the lowest energy transition of the n=1 conduction states and the n=1 heavy hole states ($E_C^{n=1}$-$E_{HH}^{n=1}$) 3705, the lowest energy transition of the n=1 conduction states and the n=1 crystal field split states ($E_C^{n=1}$-$E_{CH}^{n=1}$) 3710, and the lowest energy transition of the n=1 conduction states and the n=1 light hole states ($E_C^{n=1}$-$E_{LH}^{n=1}$) 3715. Curve 3720 shows the total spectrum that is observable. The large energy width of the emission peaks is fundamentally due to the large coupling between nearest neighbour GaN potential minima and thus the formation of wide energy width minibands in both the conduction and respective valence bands.

Figure 38:
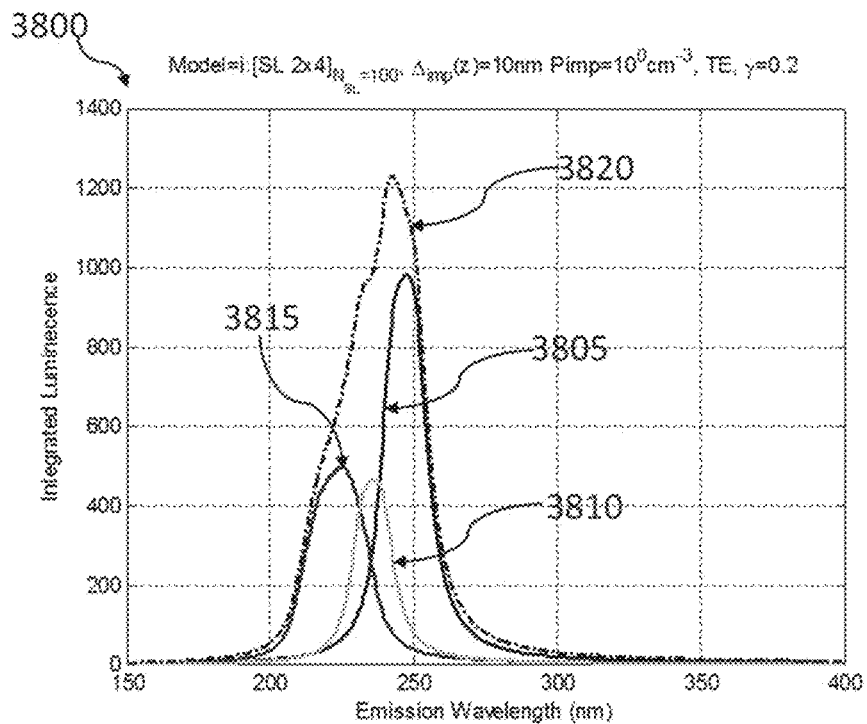
FIG. 38 is a graph of a TE optical emission spectra of a superlattice having repeated unit cell that comprises 2 monolayers of GaN and 4 monolayers of AlN.

FIG. 38 shows a graph 3800 of the emission spectrum of a 2:4 superlattice for the lowest energy transition of the n=1 conduction states and the n=1 heavy hole states ($E_C^{n=1}$-$E_{HH}^{n=1}$) 3805, the lowest energy transition of the n=1 conduction states and the n=1 crystal field split states ($E_C^{n=1}$-$E_{CH}^{n=1}$) 3810, and the lowest energy transition of the n=1 conduction states and the n=1 light hole states ($E_C^{n=1}$-$E_{LH}^{n=1}$) 3815. Curve 3820 shows the total spectrum that is observable. The smaller energy width of the emission peaks compared to FIG. 37 is due to the smaller coupling between nearest neighbour GaN potential minima and thus the formation of narrower energy width minibands in both the conduction and respective valence bands.

Figure 39:
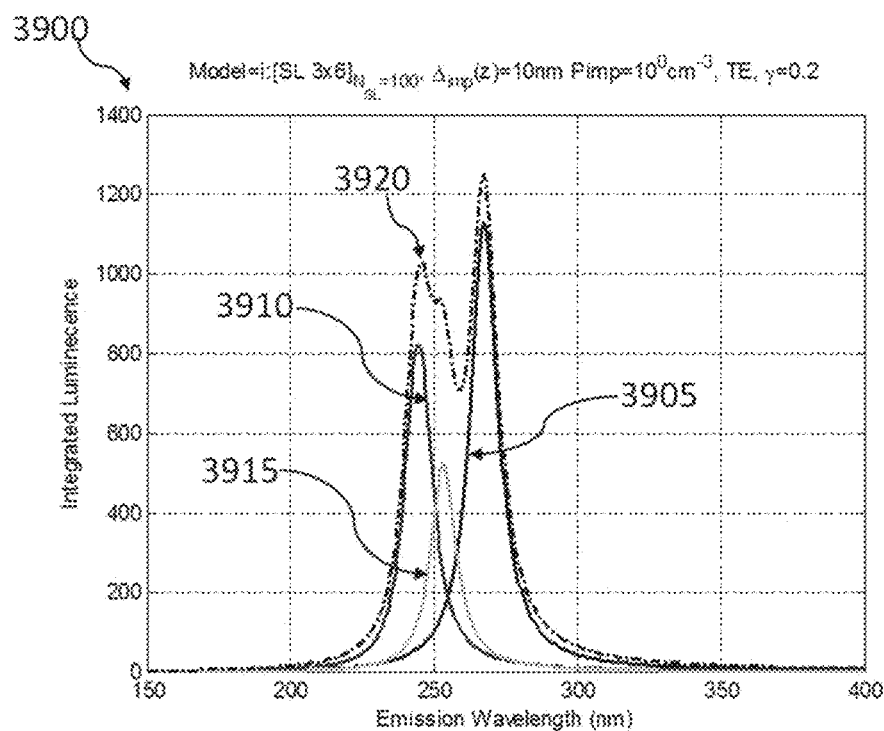
FIG. 39 is a graph of a TE optical emission spectra of a superlattice having repeated unit cell that comprises 3 monolayers of GaN and 6 monolayers of AlN.

FIG. 39 shows a graph 3900 of the emission spectrum of a 3:6 superlattice for the lowest energy transition of the n=1 conduction states and the n=1 heavy hole states ($E_C^{n=1}$-$E_{HH}^{n=1}$) 3905, the lowest energy transition of the n=1 conduction states and the n=1 crystal field split states ($E_C^{n=1}$-$E_{CH}^{n=1}$) 3910, and the lowest energy transition of the n=1 conduction states and the n=1 light hole states ($E_C^{n=1}$-$E_{LH}^{n=1}$) 3915. Curve 3920 shows the total spectrum that is observable.

Figure 40:
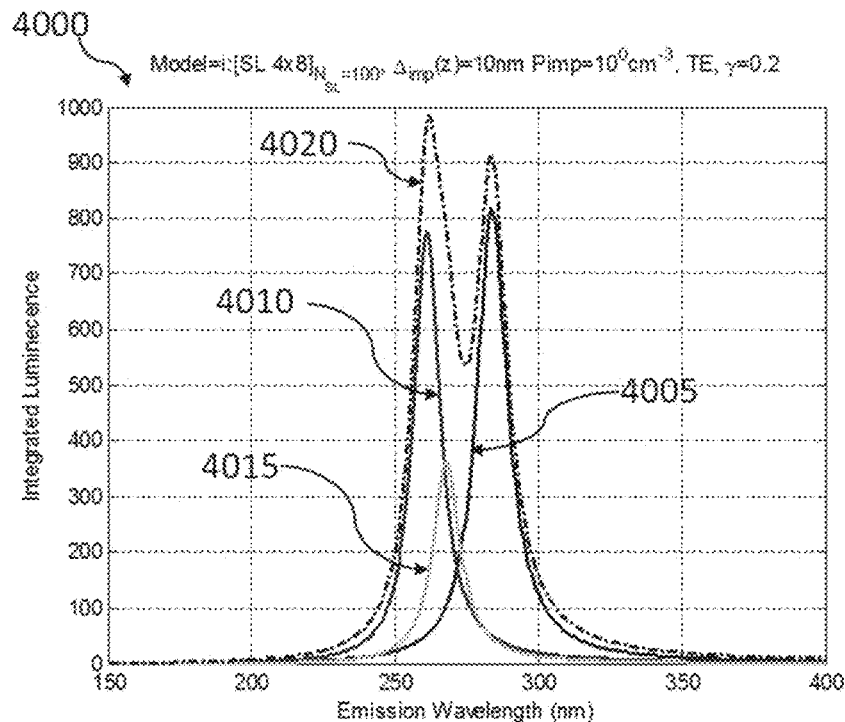
FIG. 40 is a graph of a TE optical emission spectra of a superlattice having repeated unit cell that comprises 4 monolayers of GaN and 8 monolayers of AlN.

FIG. 40 shows a graph 4000 of the emission spectrum of a 4:8 superlattice for the lowest energy transition of the n=1 conduction states and the n=1 heavy hole states ($E_C^{n=1}$-$E_{HH}^{n=1}$) 4005, the lowest energy transition of the n=1 conduction states and the n=1 crystal field split states ($E_C^{n=1}$-$E_{CH}^{n=1}$) 4010, and the lowest energy transition of the n=1 conduction states and the n=1 light hole states ($E_C^{n=1}$-$E_{LH}^{n=1}$) 4015. Curve 4020 shows the total spectrum that is observable.

Figure 41:
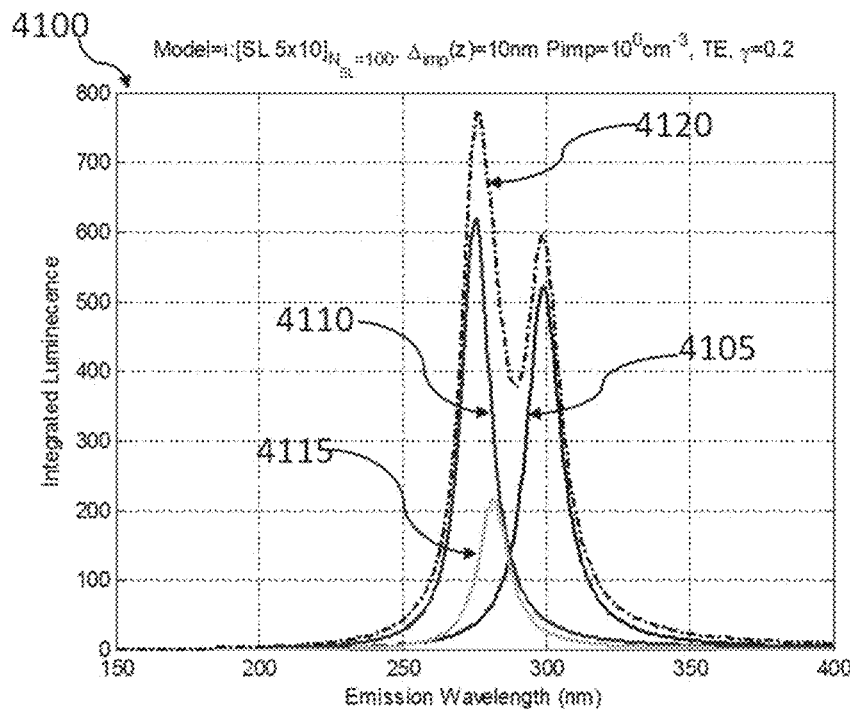
FIG. 41 is a graph of a TE optical emission spectra of a superlattice having repeated unit cell that comprises 5 monolayers of GaN and 10 monolayers of AlN.

FIG. 41 shows a graph 4100 of the emission spectrum of a 5:10 superlattice for the lowest energy transition of the n=1 conduction states and the n=1 heavy hole states ($E_C^{n=1}$-$E_{HH}^{n=1}$) 4105, the lowest energy transition of the n=1 conduction states and the n=1 crystal field split states ($E_C^{n=1}$-$E_{CH}^{n=1}$) 4110, and the lowest energy transition of the n=1 conduction states and the n=1 light hole states ($E_C^{n=1}$-$E_{LH}^{n=1}$) 4115. Curve 4120 shows the total spectrum that is observable.

Of particular importance is the achievement of ($E_C^{n=1}$-$E_{HH}^{n=1}$) optical transitions that are always the lowest energy emission and thus enable efficient vertically emissive devices of the form shown in FIG. 7.

Figure 42:
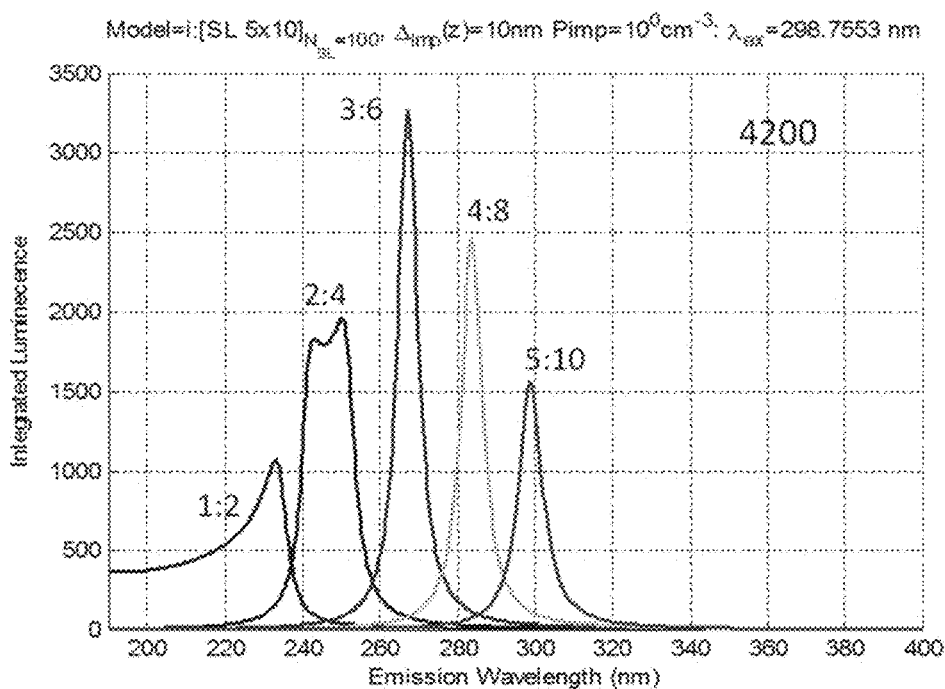
FIG. 42 is a graph comparing the optical emission spectra shown in each of FIGS. 37 to 41 for a heavy hole transition.

FIG. 42 shows a graph 4200 of the optical emission spectra for the heavy hole transition for each M:N pair plotted in FIGS. 37 to 41. In general larger GaN layer thicknesses result in quantized energy levels that are closer to the GaN band edges and thus result in longer emission wavelengths. Conversely, thinner GaN layers improve the overlap of the lowest energy quantized conduction and valence band states and thus improve the oscillator strength and emission intensity. It is found that for GaN epilayers in excess of 8 to 10 monolayers the overlap integral is severely degraded and poor optical emission results. For application to ultraviolet and deep ultraviolet devices, the M:N configurations of FIG. 42 are found to be optimal and or desired. Shorter emission wavelengths are possible using superlattice unit cells comprising AlN and $Al_xGa_{1-x}N$ compositions. To preserve the TE character of the emission it is found that $Al_xGa_{1-x}N$ where x is less than or equal to about 0.5 is preferred.

The above can be used to design semiconductor structures, such as the semiconductor structure of FIGS. 1 to 8. For example, the M:N configuration of the unit cells of the i-type active region, the n-type active region and the p-type active region can be selected to produce an emission wavelength from the i-type active region that is longer than the absorption edge of the n-type active region and the p-type active region. Further, embodiments of the invention can be designed with a constant average alloy fraction throughout the semiconductor structure which further improves the crystal quality of the resulting structure.

Figure 43:
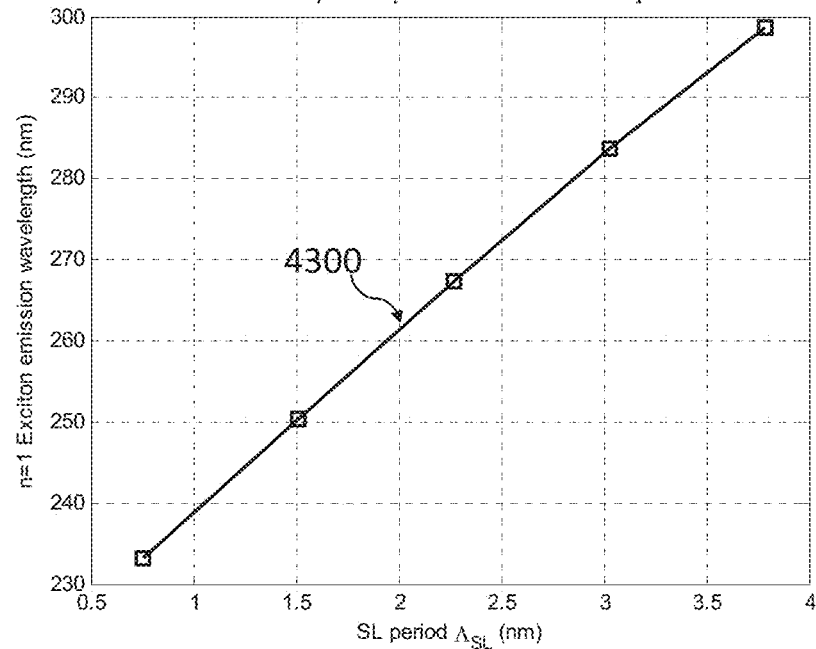
FIG. 43 is a graph of the calculated optical emission wavelength of the lowest energy transition between the allowed superlattice conduction band states and the heavy hole states for a selection of superlattices having M monolayers of GaN and N monolayers of AlN in each unit cell, where N=2M.
Figure 44:
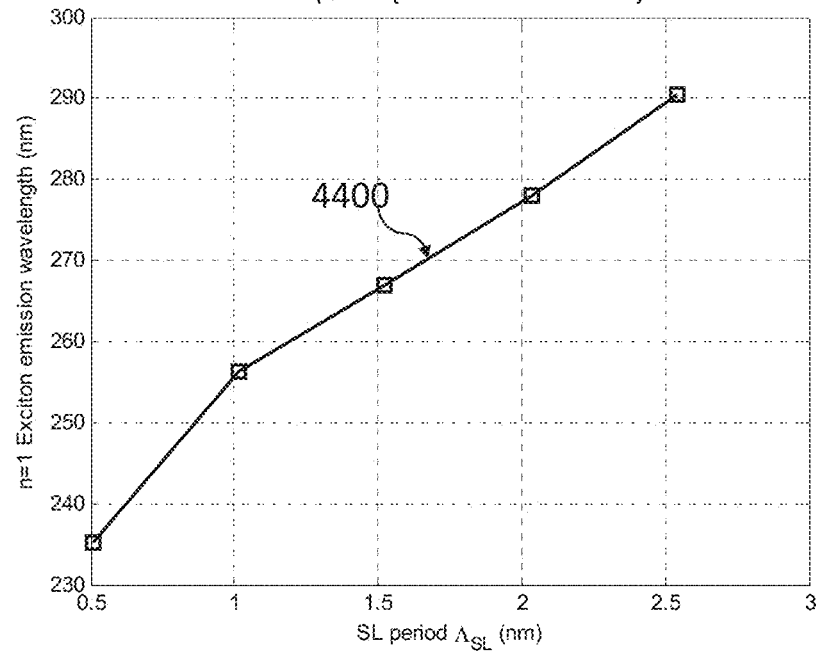
FIG. 44 is a graph of the calculated optical emission wavelength of the lowest energy transition between the allowed superlattice conduction band states and the heavy hole states for a selection of superlattices having M monolayers of GaN and N monolayers of AlN in each unit cell, where M=N.

FIGS. 43 and 44 show graphs of the calculated optical emission wavelength of the lowest energy transition between the allowed superlattice conduction band states and the heavy hole states for unit cells comprising exclusively AlN and GaN epilayers. FIG. 43 discloses the emission wavelength for N=2M superlattices having $x_{ave}^{SL}=2/3=0.667$, whereas FIG. 44 discloses the emission wavelength for N=M superlattice and $x_{ave}^{SL}=1/2=0.50$. The curves 4300 and 4400 show the variation in the lowest energy optical emission wavelength as a function of the unit cell period $A_{SL}$ which has a corresponding M:N configuration. From the graphs it can be seen that the optical emission can be tuned over a wide and desirable optical range spanning from about 230 nm to less than 300 nm.

In one example, a semiconductor structure is formed of distinct superlattice regions. The unit cells of each superlattice have an Al fraction $x_{ave}^{SL}=2/3$ and are formed exclusively of a GaN and an AlN layer. The desired design wavelength for a light emitting device comprising the semiconductor structure is, for example, $\lambda_e=265$ nm. Thus, referring to FIG. 43, an M:N=3:6 unit cell is selected of the i-type active region. The device comprises an n-type active region formed atop a transparent substrate using a superlattice unit cell that is substantially transparent to the desired design wavelength $\lambda_e$. Similarly, the device comprises a p-type active region that substantially transparent to the desired design wavelength $\lambda_e$. The superlattice in the n-type active region can therefore be selected to have M:N=1:2 unit cells and the superlative in the p-type active region can be selected to have M:N=2:4 unit cells. This will improve the activated heavy hole concentration and provide an improved hole wavefunction injection into a portion of the M:N=3:6 unit cells of the superlattice in the i-type active region.

The i-type active region can be partitioned into two distinct superlattices, being a first superlattice with M:N=2:4 unit cells and a second superlattice with M:N=3:6 unit cells. The first superlattice is positioned between the n-type active region and the second superlattice. The second superlattice is positioned between the first superlattice and the p-type active region. The first superlattice acts as an electron energy filter for injecting preferred electrons into the electron-hole recombination region (EHR) defined by the second superlattice. This configuration therefore provides improved carrier transport of electrons and holes throughout the semiconductor structure. The EHR of the second superlattice is positioned close to the hole reservoir due to the inherently low hole mobility in the group III metal nitrides. Therefore, a light emitting device can be produced having a semiconductor structure having [n-type 1:2/i-type 2:4/i-type 3:6/p-type 2:4] superlattice regions. The total thickness of the i-type active region can also be optimized.

Figure 45:
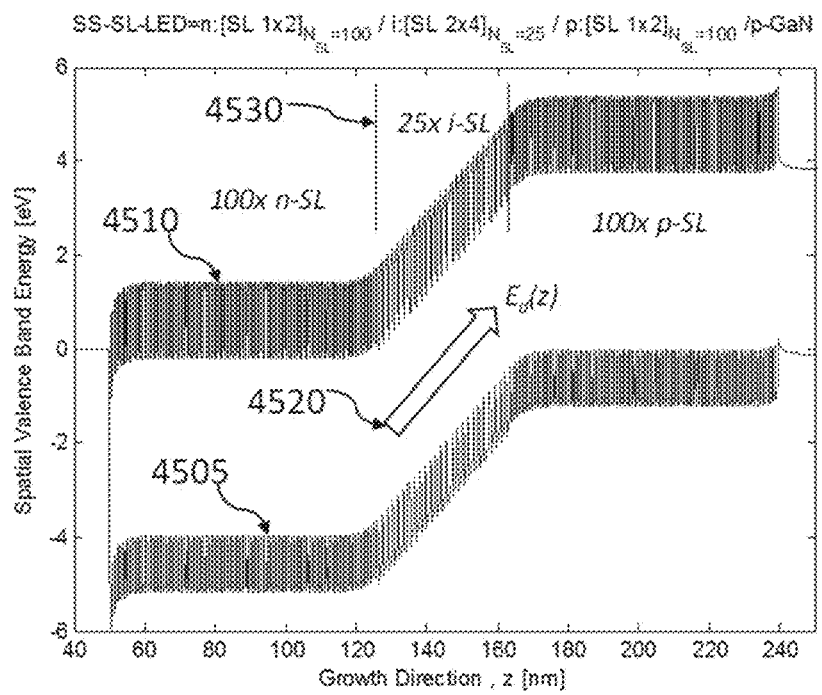
FIG. 45 is a graph of a conduction band energy and a heavy hole valence band energy for a semiconductor structure that has 25 unit cells comprising 2 monolayers of GaN and 4 monolayers of AlN in the i-type active region.
Figure 46:
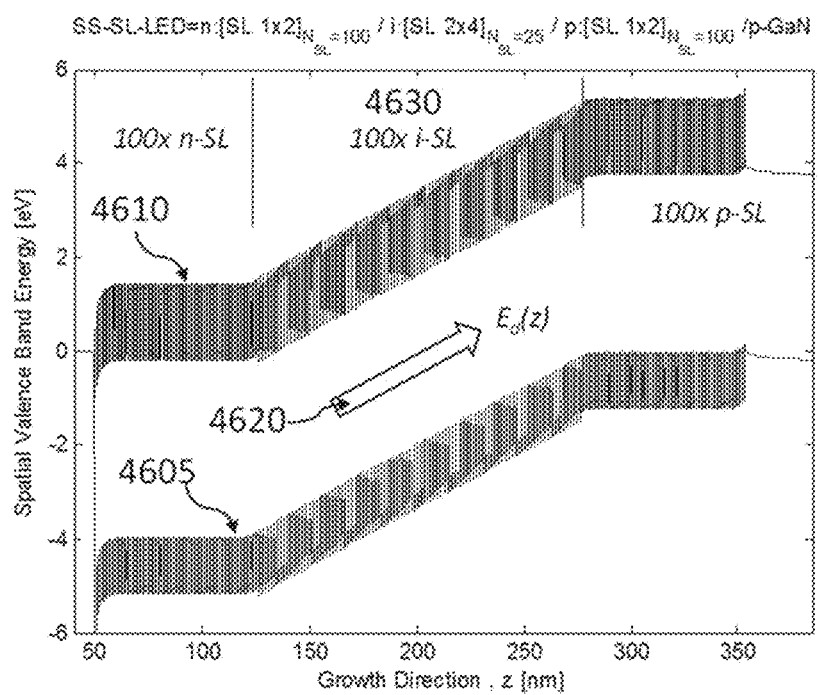
FIG. 46 is a graph of a conduction band energy and a heavy hole valence band energy for a semiconductor structure that has 100 unit cells comprising 2 monolayers of GaN and 4 monolayers of AlN in the i-type active region.

FIGS. 45 and 46 show graphs of a conduction band edge 4510 and 4610 and a heavy hole valence band edge 4505 and 4605 in electron volts (eV) along the growth direction z for semiconductor structures comprising 100 periods of n-type M:N=1:2 unit cells in the n-type active region and 100 periods of p-type M:N=1:2 unit cells in the p-type active region. The unit cells are exclusively constructed from c-plane oriented GaN and AlN monolayered films with a constant Al fraction of $x_{ave}^{SL}=\text{⅔}$. The i-type active region similarly has a constant Al fraction of $x_{ave}^{SL}=\text{⅔}$ but has a large period in order to tune the emission wavelength to a longer wavelength. FIG. 45 shows a graph for a semiconductor structure that has 25 periods of 2:4 unit cells in the i-type active region 4530, whereas FIG. 46 shows a graph for a semiconductor structure that has 100 periods of 2:4 unit cells in the i-type active region 4630. The built-in depletion region electric field $E_d(z)$ 4520, due to the p-type and n-type active regions, in FIG. 45 is larger than the built-in depletion region electric field $E_d(z)$ 4620 in FIG. 46. The built-in depletion region electric field $E_d(z)$ is affected by the total thickness of the i-type active region superlattice and places yet another Stark shifting potential across the superlattice confined states. It is found that this quantum confined superlattice Stark effect (QC-SL-SE) can be used to further tune the optical properties of the device.

Figure 47:
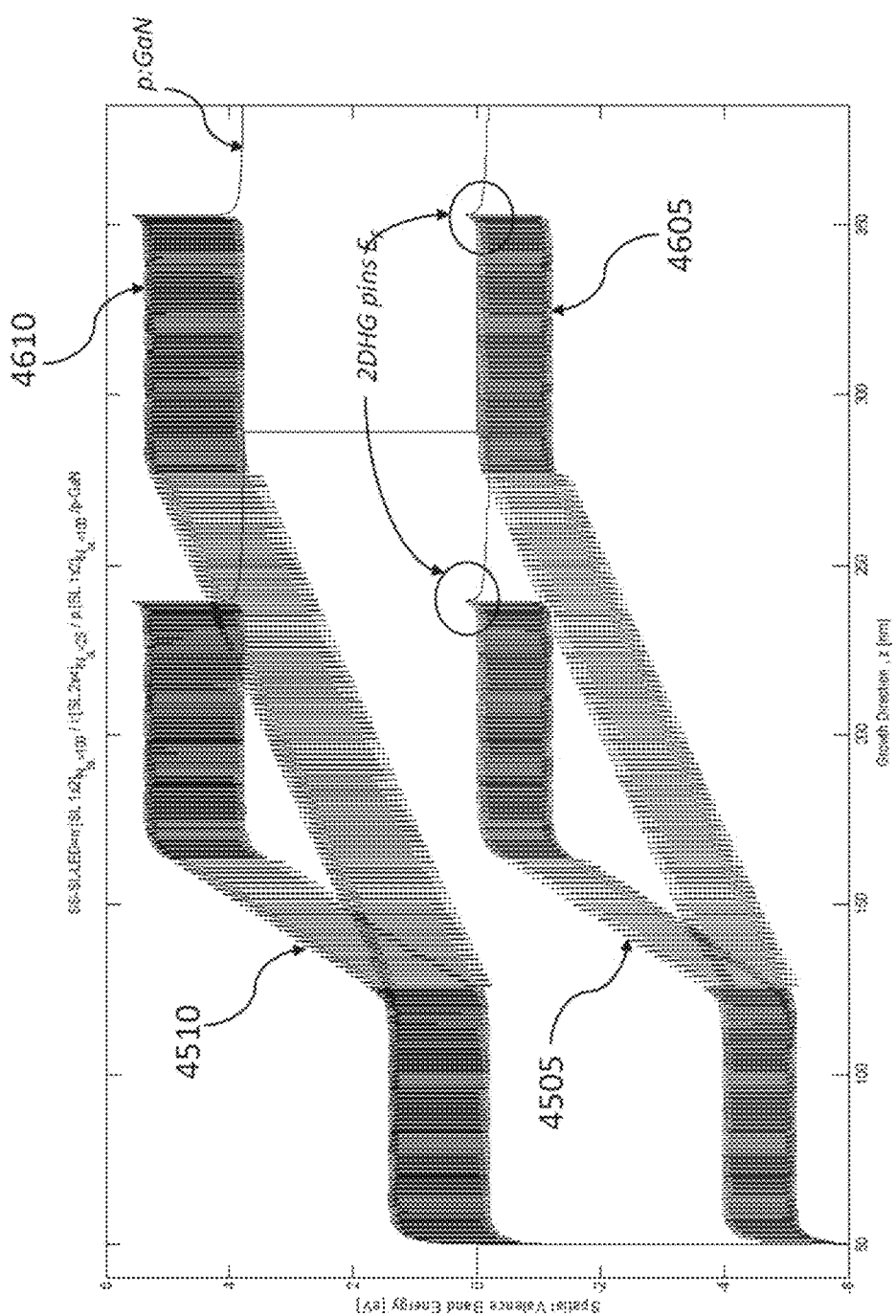
FIG. 47 is a graph showing the graphs of FIGS. 45 and 46 on a single graph for comparison.

FIG. 47 shows the graphs of FIGS. 45 and 46 on a single graph for comparison. An optional p-GaN contact layer that is inserted above the p-type active region pins the Fermi level via an induced two-dimensional hole gas (2 DHG). The devices have a metal polar growth orientation along the growth direction z.

Figure 48:
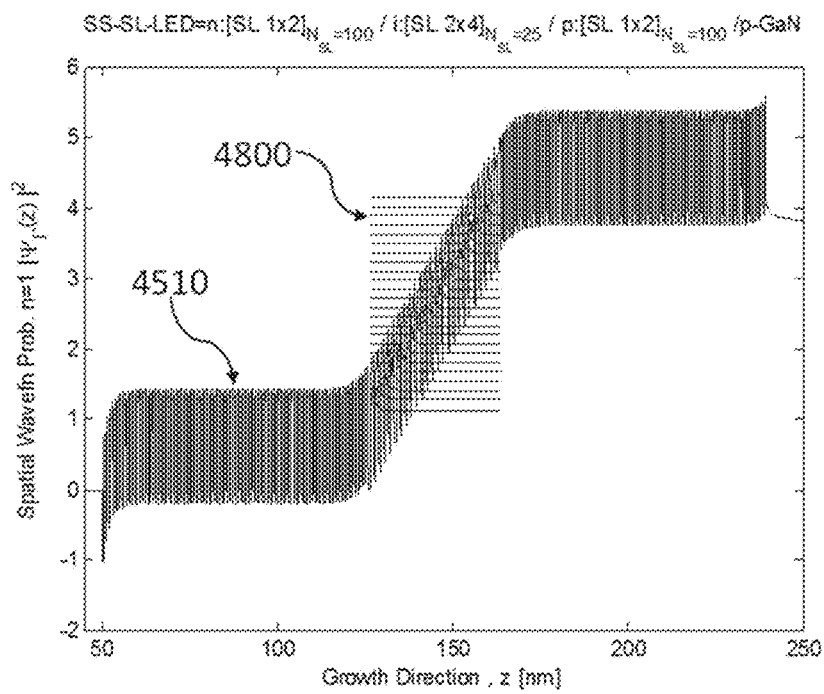
FIG. 48 is a graph of the quantized lowest energy electron wavefunctions within the i-type active region of the semiconductor structure referred to in FIG. 45 under the influence of the built-in depletion electric field.

FIG. 48 shows a graph of the calculated lowest energy quantized electron wavefunctions 4800 within the i-type active region of the semiconductor structure referred to in FIG. 45 under the influence of the built-in depletion electric field. Compared to the semiconductor structure with no depletion electric field, the wavefunctions are observed to be blue shifted and there is a reduction of the resonant tunnelling between nearest neighbours. The conduction band edge 4510 is plotted as a reference.

Figure 49:
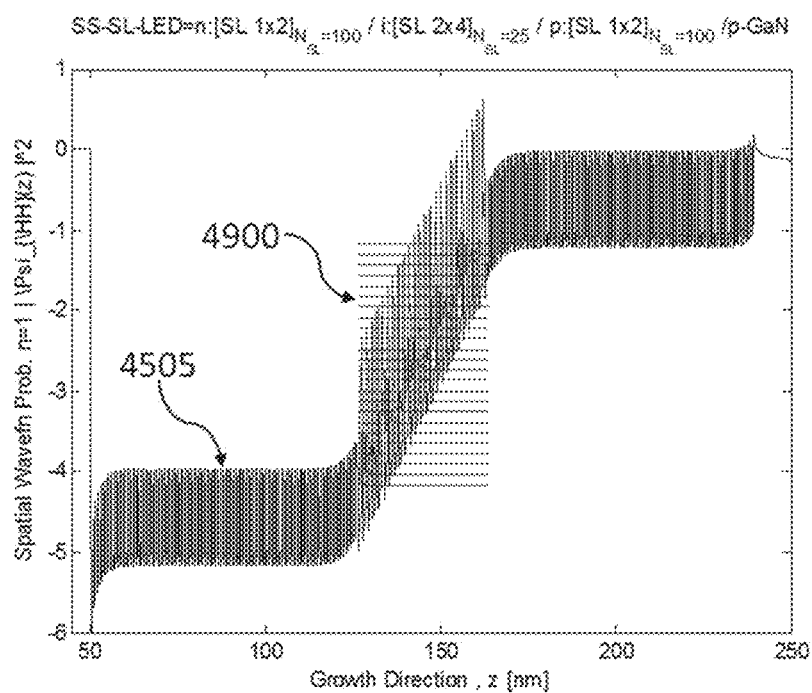
FIG. 49 is a graph of the quantized lowest energy heavy hole wavefunctions within the i-type active region of the semiconductor structure referred to in FIG. 46 under the influence of the built-in depletion electric field.

FIG. 49 shows a graph of the calculated quantized lowest energy heavy hole wavefunctions 4900 within the i-type active region of the semiconductor structure referred to in FIG. 46 under the influence of the built-in depletion electric field. The heavy hole band edge 4605 is plotted as a reference.

Figure 50A:
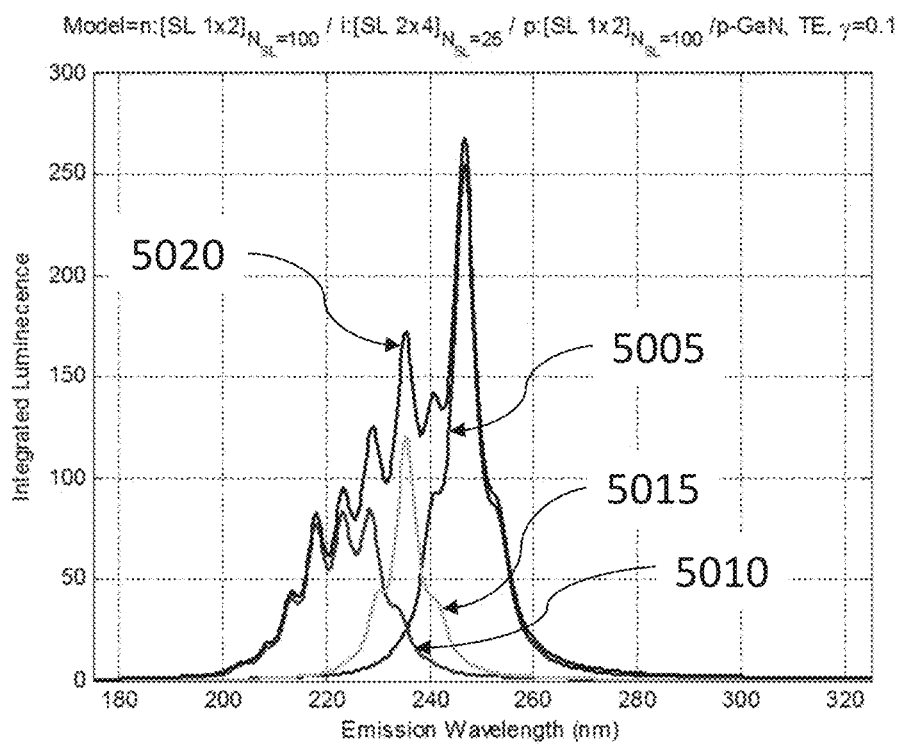
FIG. 50A is a graph of the emission spectra from the i-type active region of the devices referred to in FIG. 45.
Figure 50B:
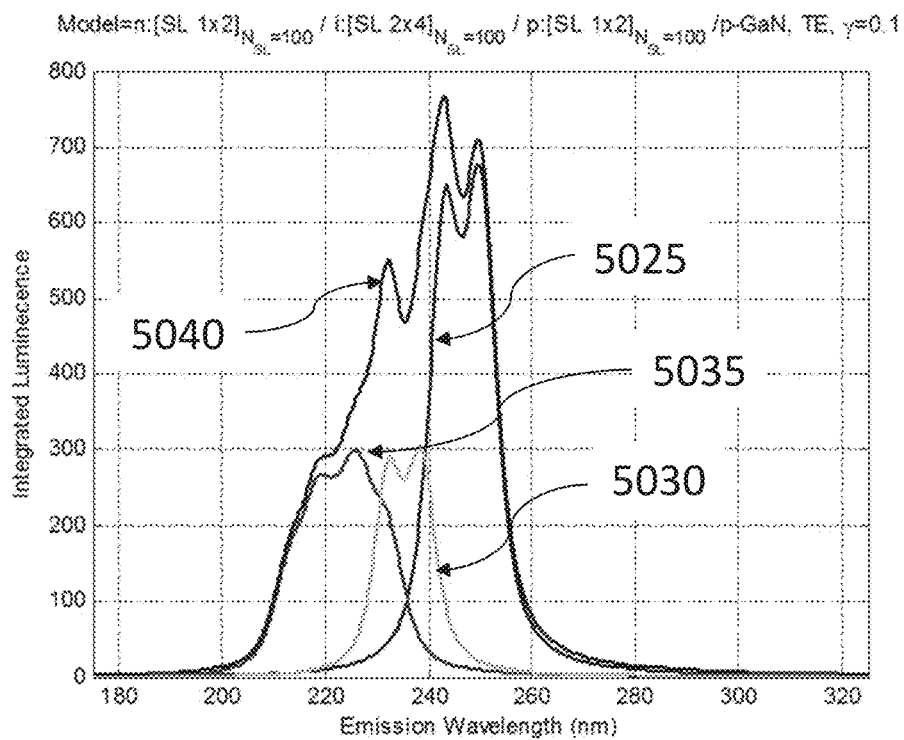
FIG. 50B is a graph of the emission spectra from the i-type active region of the devices referred to in FIG. 46.

FIGS. 50A and 50B show graphs of the emission spectra from the i-type active regions of the devices referred to in FIGS. 45 and 46, respectively. FIG. 50A shows the emission spectra for the optical transitions between the lowest energy n=1 conduction band states and their respective HH 5005, LH 5010 and CH 5015 valence bands and the total TE emission spectrum 5020 in the device of FIG. 45. FIG. 50B shows the emission spectra for the optical transitions between the lowest energy n=1 conduction band states and their respective HH 5025, LH 5035 and CH 5030 valence bands and the total TE emission spectrum 5040 in the device of FIG. 46.

The device of FIG. 45 has a larger built-in electric field than the device of FIG. 46 due to the thinner i-type active region. This larger built-in electric field breaks the coupling between adjacent unit cells in the i-type active region, produces a small blue shift in the emission energy and reduces the emission spectral line width. Comparing FIG. 50A to FIG. 50B, it can be seen that there is a reduction in the full width at half maximum (FWHM) of the low energy side of the peak emission and a blue shift of the low energy emission edge due to the larger built-in electric field. FIG. 50B shows a larger integrated luminescence than FIG. 50A due to the large number of periods in i-type active region of the device of FIG. 46.

Figure 51:
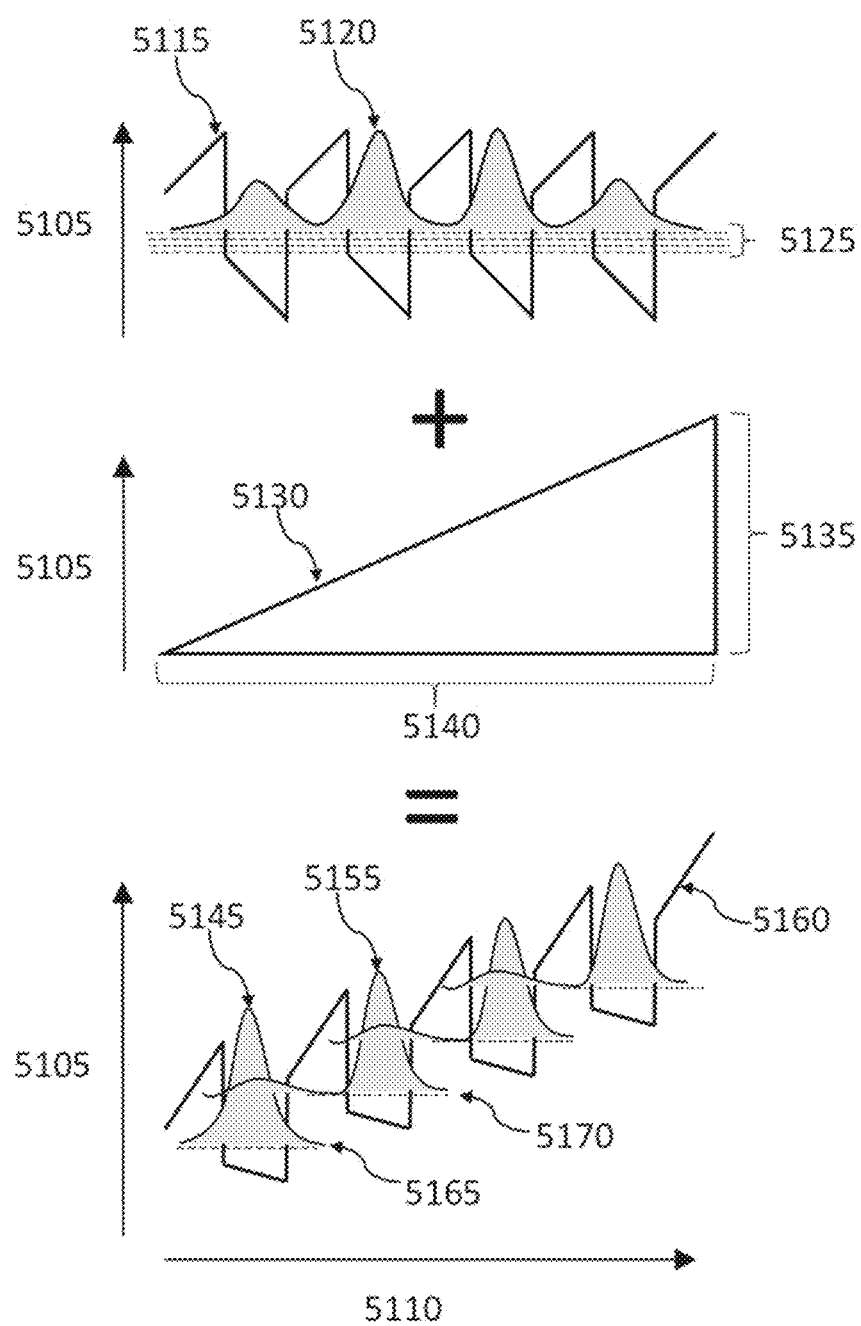
FIG. 51 is a schematic showing the influence of the built-in depletion field on the conduction band edge, the delocalized electron wavefunction and the energy miniband.

FIG. 51 schematically describes the influence of the built-in depletion field 5130 having potential energy 5135 along a distance 5140 that is parallel to a growth direction 5110. The superlattice band diagram without a built-in depletion field is shown as the spatial conduction band edge 5115 and the vertical axis 5105 represents energy. The delocalized electron wavefunction 5120 is coupled between adjacent GaN regions by virtue of quantum mechanical tunnelling through the high potential energy AlN barriers. The internal pyroelectric and piezoelectric fields are also shown and representative of a metal polar oriented growth. The tunnelling of the wavefunctions 5120 results in an energy miniband 5125 for the allowed quantized conduction states. Application of a linearly increasing potential 5130 such as occurs with the built-in depletion field, results in spatial band structure 5160. The resulting wavefunctions of the superlattice with application of the depletion field 5130 generates the wavefunctions 5145 and 5155 which are no longer resonantly coupled to their nearest neighbour GaN potential minima. The quantized allowed energy states of the band structure 5160 now has discrete energy states 5165 and 5170 that are higher in energy compared to the miniband energy states 5125.

This effect can be modified by application of a depletion electric field across a nitrogen-polar oriented growth, with a resulting lowering of the energy of Stark split states. This is particularly useful for example, for a nitrogen polar p-i-n superlattice device composed of only one unit cell type, such as an M:N=3:6 unit cell having a GaN layer and an AlN layer. The built-in depletion field across the superlattice having M:N=3:6 unit cells cause an emission energy to be stark shifted to longer wavelengths (i.e., red-shifted) and will not be substantially absorbed in surrounding p-type and n-type active regions having M:N=3:6 unit cells.

In general, a metal polar oriented growth produces blue shift in the emission spectrum of the i-type active region or i-type active region of a n-i-p device due to a p-up epilayer stack. That is, for a depletion electric field as shown for a device formed in the order: substrate, n-type active region, i-type active region, p-type active region [SUB/n-i-p]. Conversely, a redshift is observed in the emission spectrum of the i-type active region for a p-i-n device formed as a p-down epilayer stack, that is, [SUB/p-i-n].

Conversely, a nitrogen polar oriented growth produces a blue shift in the emission spectrum of the i-type active region of a n-i-p device due to the depletion electric field, and a redshift in the emission spectrum of the i-type active region of a p-i-n device due to the depletion electric field.

The present invention provides many benefits over the prior art, including improved light emission, especially at UV and Deep UV (DUV) wavelengths. For example, the use of ultrathin layered superlattices enables photons to be emitted vertically, i.e. perpendicular to the layers of the device, as well as horizontally, i.e. parallel with the layers. Furthermore, the present invention provides spatial overlap between the electron and hole wavefunctions enabling improved recombination of electrons and holes.

In particular, for the application of ultra-violet devices, GaN proves extremely beneficial for the narrower band gap material and AlN for the wider bandgap material. GaN is inherently a vertically emissive material when deposited on c-plane surfaces, whereas AlN emits substantially with TM optical polarizations, i.e. in the plane of the sub-layers.

The thickness of the first layer and second layer of the unit cells can be used to select the quantisation energy of electrons and holes and the coupling of electrons in the conduction band. For example, the thickness of layers of GaN can be used to select the quantization energy of electrons and holes and the thickness of layers of AlN can control the coupling of electrons in conduction band. The ratio of thickness of the layers of GaN to the layers of AlN can be used to select the average in-plane lattice constant of the superlattice. Hence, the optical transition energy of a given superlattice can be altered by choice of both the average unit cell composition and the thickness of the each layer of each unit cell.

Further advantages of the present invention include: simpler manufacturing and deposition processes; customisable electronic and optical properties (such as the wavelength of the emitted light) suitable for high efficiency light emission; optimised optical emission polarisation for vertically emissive devices when deposited on c-plane oriented surfaces; improved impurity dopant activation for n-type and p-type conductivity regions; and strain managed monolayers enabling optically thick superlattices to be formed without excessive strain accumulation. For example, aperiodic superlattices can be used to prevent strain propagation and enhance optical extraction.

Furthermore, spreading out the electron and or hole carrier spatial wavefunctions within the electron-hole recombination regions improves both the carrier capture probability by virtue of increase volume of material, and also improves the electron and hole spatial wavefunction overlap and thus improves the recombination efficiency of the device over prior art.

In this specification, the term "superlattice" refers to a layered structure comprising a plurality of repeating unit cells including two or more layers, where the thickness of the layers in the unit cells is small enough that there is significant wavefunction penetration between corresponding layers of adjacent unit cells such that quantum tunnelling of electrons and/or holes can readily occur.

In this patent specification, adjectives such as first and second, left and right, front and back, top and bottom, etc., are used solely to define one element from another element without necessarily requiring a specific relative position or sequence that is described by the adjectives. Words such as "comprises" or "includes" are not used to define an exclusive set of elements or method steps. Rather, such words merely define a minimum set of elements or method steps included in a particular embodiment of the present invention. It will be appreciated that the invention may be implemented in a variety of ways, and that this description is given by way of example only.

The above description of various embodiments of the present invention is provided for purposes of description to one of ordinary skill in the related art. It is not intended to be exhaustive or to limit the invention to a single disclosed embodiment. As mentioned above, numerous alternatives and variations to the present invention will be apparent to those skilled in the art of the above teaching. Accordingly, while some alternative embodiments have been discussed specifically, other embodiments will be apparent or relatively easily developed by those of ordinary skill in the art. Accordingly, this patent specification is intended to embrace all alternatives, modifications and variations of the present invention that have been discussed herein, and other embodiments that fall within the spirit and scope of the above described invention.

The reference to any prior art in this specification is not, and should not be taken as, an acknowledgement or any form of suggestion that the prior art forms part of the common general knowledge in Australia or elsewhere.

What is claimed is:

1. A semiconductor structure, comprising:
   a p-type active region comprising a p-type superlattice;
   an n-type active region comprising an n-type superlattice; and
   an i-type active region between the n-type active region and the p-type active region comprising an i-type superlattice;
wherein:
   the semiconductor structure comprises epitaxially grown semiconductor layers comprised solely of superlattices grown along a growth direction;
   the p-type superlattice is comprised of a plurality of p-type unit cells;
   the n-type superlattice is comprised of a plurality of n-type unit cells;
   the i-type superlattice is comprised of a plurality of i-type unit cells;
   an average alloy content of the plurality of p-type, n-type and i-type unit cells is constant along the growth direction;
   the p-type unit cells comprise a first layer of GaN and a first layer of AlN;
   the n-type unit cells comprise a second layer of GaN and a second layer of AlN;
   the i-type unit cells comprise a third layer of GaN and a third layer of AlN;
   a combined thickness of the third layer of GaN and the third layer of AlN is thicker than a combined thickness of the first layer of GaN and the first layer of AlN;
   the combined thickness of the third layer of GaN and the third layer of AlN is thicker than a combined thickness of the second layer of GaN and the second layer of AlN; and
   the first, second and third layers of GaN and the first, second and third layers of AlN have thicknesses that are less than or equal to a critical layer thickness required to maintain elastic strain.

2. The semiconductor structure of claim 1, wherein the first, second and third layers of GaN each has a thickness from 1 monolayer to 10 monolayers, and the first, second and third layers of AlN each has a thickness from 1 monolayer to 20 monolayers.

3. The semiconductor structure of claim 1, wherein the third layer of GaN has a thickness from 1 monolayer to 5 monolayers, and the first layer of AlN has a thickness from 2 monolayers to 10 monolayers.

4. The semiconductor structure of claim 1, wherein:
   the first and second layers of GaN are each 1 monolayer thick;
   the first and second layers of AlN are each 2 monolayers thick;
   the third layer of GaN is 2 monolayers thick; and
   the third layer of AlN is 4 monolayers thick.

5. The semiconductor structure of claim 1, wherein the combined thickness of the third layer of GaN and the third layer of AlN is from 2.5 Angstroms to 35.6 Angstroms.

6. The semiconductor structure of claim 1, wherein an equilibrium in-plane lattice constant of the third layer of GaN is from 3.11 Angstroms to 3.19 Angstroms.

7. The semiconductor structure of claim 1, wherein the i-type superlattice comprises from 25 to 400 i-type unit cells.

8. The semiconductor structure of claim 1, further comprising:
a mesa comprising the p-type active region and the i-type active region, wherein the mesa comprises side walls; and
a passivation layer that covers at least a portion of the side walls.

9. The semiconductor structure of claim 8, further comprising:
a reflector layer;
wherein:
the passivation layer further covers a top of the semiconductor structure; and
the reflector layer is positioned on top of the passivation layer.

10. The semiconductor structure of claim 1, wherein the i-type active region has a thickness of greater than or equal to 1 nm and less than or equal to 100 nm.

11. The semiconductor structure of claim 1, wherein:
the first, second and third GaN layers and the first, second and third AlN layers have a wurtzite crystal symmetry and a crystal polarity in the growth direction that is either a metal-polar polarity or a nitrogen-polar polarity;
and the crystal polarity of the first, second and third GaN layers and the first, second and third AlN layers is spatially varied along the growth direction.

12. The semiconductor structure of claim 11, wherein the crystal polarity of the layers comprising the n-type, p-type and i-type active regions is alternately flipped between the nitrogen-polar polarity and the metal-polar polarity.

13. The semiconductor structure of claim 1, further comprising:
a crystalline substrate and a buffer layer;
wherein:
the buffer layer is positioned on the crystalline substrate;
the n-type, p-type and i-type active regions are positioned on the buffer layer; and
the buffer layer acts as a strain control mechanism providing an in-plane lattice constant.

14. The semiconductor structure of claim 13, wherein the buffer layer includes one or more buffer layer superlattices.

15. The semiconductor structure of claim 1, wherein one or more of the first, second or third GaN layers and the first, second and third AlN layers is not intentionally doped with an impurity species.

16. The semiconductor structure of claim 1, wherein one or more of the first, second or third GaN layers or the first, second and third AN layers is intentionally doped with one or more impurity species or formed with one or more impurity species.

17. The semiconductor structure of claim 16, wherein the one or more impurity species in the n-type active region are selected from the group consisting of:
silicon (Si);
germanium (Ge);
silicon-germanium ($Si_xGe_{1-x}$), where $0<x<1$;
crystalline silicon-nitride ($Si_xN_y$), where $0<x<3$ and $0<y<4$;
crystalline germanium-nitride ($Ge_xN_y$), where $0<x<3$ and $0<y<4$;
crystalline silicon-aluminium-gallium-nitride ($Si_u[Al_xGa_{1-y}]_zN_v$) where $u>0$, $x>0$, $0<y<1$, $z>0$ and $v>0$; and
crystalline germanium-aluminium-gallium-nitride ($Ge_u[Al_xGa_{1-y}]_zN_v$) where $u>0$, $x>0$, $0<y<1$, $z>0$ and $v>0$.

18. The semiconductor structure of claim 16, wherein the one or more impurity species in the p-type active region are selected from the group consisting of:
magnesium (Mg);
zinc (Zn);
magnesium-zinc ($Mg_xZn_{1-x}$), where $0\leq x\leq 1$
crystalline magnesium-nitride ($Mg_xN_y$), where $0<x\leq 3$ and $0<y\leq 2$; and
magnesium-aluminium-gallium-nitride ($Mg_u[Al_xGa_{1-y}]_zN_v$), where $u>0$, $x>0$, $0<y<1$, $z>0$ and $v>0$.

19. The semiconductor structure of claim 16, wherein the one or more impurity species in the n-type active region or the p-type active region are selected from the group consisting of:
hydrogen (H);
oxygen (O);
carbon (C); and
fluorine (F).

20. The semiconductor structure of claim 16, wherein the one or more impurity species are incorporated post growth via ion-implantation.

21. The semiconductor structure of claim 16, wherein at least a portion of the at least one of the one or more of the p-type, n-type and i-type superlattices includes uniaxial strain or a biaxial strain to enhance the activation energy of an intentionally doped region to improve an electron or hole carrier concentration.

22. The semiconductor structure of claim 1, further comprising:
a first contact layer formed on a surface of the n-type active region; and
a first lateral contact;
wherein the first lateral contact extends partially into the n-type active region from the first contact layer.

23. The semiconductor structure of claim 22, further comprising:
a second contact layer formed on a surface of the p-type active region; and
a second lateral contact;
wherein the second lateral contact extends partially into the p-type active region from the second contact layer.

24. The semiconductor structure of claim 23, wherein the second lateral contact is surrounded by an enhancement layer, and the enhancement layer is between the second lateral contact and the p-type active region.

25. The semiconductor structure of claim 24, wherein the enhancement layer comprises p-type GaN.

26. The semiconductor structure of claim 24, wherein the second contact layer is a metal contact layer and a p-type contact layer is formed between the p-type active region and the metal contact layer.

27. The semiconductor structure of claim 1, wherein the p-type unit cells, the n-type unit cells, and the i-type unit cells each consist of one layer of GaN and one layer of AlN.

28. An optoelectronic device comprising the semiconductor structure of claim 1, wherein the optoelectronic device is configured as a light emitting device and light is generated by recombination of electrically active holes and electrons supplied by the p-type active region and the n-type active region respectively, the recombination occurring in the i-type active region.

29. The optoelectronic device of claim 28, wherein light emitted by the optoelectronic device is ultra violet light in the wavelength range of 150 nm to 280 nm.

30. The optoelectronic device of claim 28, wherein:
the optoelectronic device emits light having a substantially transverse electric optical polarization with respect to the growth direction; and
the optoelectronic device operates as a vertically emitting cavity device with light spatially generated and confined along a direction substantially perpendicular to a plane of the one or more layers of the unit cells of the one or more superlattices of the semiconductor structure.

31. The optoelectronic device of claim 30, wherein:
the vertically emitting cavity device has a vertical cavity disposed substantially along the growth direction and formed using reflectors spatially disposed along one or more portions of the semiconductor structure;
the vertical cavity is defined by an optical length between the reflectors being less than or equal to a wavelength of the light emitted by the device; and
the wavelength is determined by optical emission energy of the one or more superlattices comprising the semiconductor structure and optical cavity modes determined by the vertical cavity.

32. The optoelectronic device of claim 31, wherein the reflectors comprise layers selected from the group consisting of: aluminium layers, metallic layers, layers with refractive index discontinuities, and metal-dielectric superlattice layers.

* * * * *